(12) United States Patent
Hu et al.

(10) Patent No.: US 11,848,117 B2
(45) Date of Patent: *Dec. 19, 2023

(54) THIN AND UNIFORM SILVER NANOWIRES, METHOD OF SYNTHESIS AND TRANSPARENT CONDUCTIVE FILMS FORMED FROM THE NANOWIRES

(71) Applicant: C3 Nano, Inc., Hayward, CA (US)

(72) Inventors: Yongxing Hu, Fremont, CA (US); Ying-Syi Li, Fremont, CA (US); Xiqiang Yang, Hayward, CA (US); Jing Shun Ang, Singapore (SG); Ajay Virkar, San Mateo, CA (US)

(73) Assignee: C3 Nano, Inc., Hayward, CA (US)

( * ) Notice: Subject to any disclaimer, the term of this patent is extended or adjusted under 35 U.S.C. 154(b) by 18 days.

This patent is subject to a terminal disclaimer.

(21) Appl. No.: 17/316,876

(22) Filed: May 11, 2021

(65) Prior Publication Data
US 2021/0265073 A1 Aug. 26, 2021

Related U.S. Application Data

(60) Continuation of application No. 16/549,204, filed on Aug. 23, 2019, now Pat. No. 11,037,694, which is a
(Continued)

(51) Int. Cl.
H01B 1/02 (2006.01)
H01B 5/00 (2006.01)
(Continued)

(52) U.S. Cl.
CPC ............... H01B 1/02 (2013.01); H01B 5/00 (2013.01); H01B 13/0006 (2013.01);
(Continued)

(58) Field of Classification Search
CPC ......... B82Y 30/00; B82Y 35/00; B82Y 40/00; H01B 1/02; H01B 1/22; H01B 5/00;
(Continued)

(56) References Cited

U.S. PATENT DOCUMENTS 7,585,349 B2   9/2009  Xia et al.
8,049,333 B2   11/2011 Alden et al.
(Continued)

FOREIGN PATENT DOCUMENTS

CN   103153844 A   6/2013
CN   105537608 A   5/2016
(Continued)

OTHER PUBLICATIONS

Heterocyclic Chemistry_pp. 1-20_Dec. 2017.*
(Continued)

Primary Examiner — Timothy J Thompson
Assistant Examiner — Guillermo J Egoavil
(74) Attorney, Agent, or Firm — Christensen, Fonder, Dardi; Elizabeth A. Gallo; Peter S. Dardi

(57) ABSTRACT

Highly uniform and thin silver nanowires are described having average diameters below 20 nm and a small standard deviation of the diameters. The silver nanowires have a high aspect ratio. The silver nanowires can be characterized by a small number of nanowires having a diameter greater than 18 nm as well as with a blue shifted narrow absorption spectrum in a dilute solution. Methods are described to allow for the synthesis of the narrow uniform silver nanowires. Transparent conductive films formed from the thin, uniform silver nanowires can have very low levels of haze and low values of $\Delta L^*$, the diffusive luminosity, such that the transparent conductive films can provide little alteration of the appearance of a black background.

11 Claims, 21 Drawing Sheets

Related U.S. Application Data continuation of application No. 16/249,249, filed on Jan. 16, 2019, now Pat. No. 10,438,714, which is a division of application No. 15/951,758, filed on Apr. 12, 2018, now Pat. No. 10,714,230.

(51) Int. Cl.

| | | |
|---|---|---|
| *H01B 13/00* | (2006.01) | |
| *B82Y 40/00* | (2011.01) | |
| *B82Y 35/00* | (2011.01) | |

(52) U.S. Cl.
CPC .......... *H01B 13/0016* (2013.01); *B82Y 35/00* (2013.01); *B82Y 40/00* (2013.01); *H05K 2201/026* (2013.01)

(58) Field of Classification Search
CPC .......... H01B 13/0006; H01B 13/0016; H01B 13/00; H05K 2201/026; B22F 1/0547; B22F 2301/255; B22F 2999/00; B22F 9/24; C30B 29/02; C30B 29/62; C30B 7/00; C30B 7/14
USPC .............................. 174/258; 420/501; 75/343
See application file for complete search history.

(56) References Cited

U.S. PATENT DOCUMENTS

| | | | |
|---|---|---|---|
| 8,728,351 B2 | 5/2014 | Masahiro et al. | |
| 8,741,025 B2 | 6/2014 | Whitcomb | |
| 8,748,749 B2 | 6/2014 | Srinivas et al. | |
| 9,150,746 B1 | 10/2015 | Li et al. | |
| 9,183,968 B1 | 11/2015 | Li et al. | |
| 9,440,291 B2 | 9/2016 | Allemand | |
| 9,530,534 B2 | 12/2016 | Hu et al. | |
| 9,536,633 B2 | 1/2017 | Higashimura et al. | |
| 10,026,518 B2 | 7/2018 | Sepa et al. | |
| 2006/0286684 A1 | 12/2006 | Bemnan et al. | |
| 2007/0231587 A1 | 10/2007 | Naito et al. | |
| 2007/0289409 A1 | 12/2007 | Xia et al. | |
| 2008/0003130 A1 | 1/2008 | Xia et al. | |
| 2009/0196788 A1* | 8/2009 | Wang .................. | C22C 5/06 977/840 |
| 2009/0270608 A1* | 10/2009 | Zhang .................. | C13K 1/02 549/489 |
| 2010/0078197 A1 | 4/2010 | Miyagishima et al. | |
| 2011/0027623 A1 | 2/2011 | Coey | |
| 2011/0160254 A1* | 6/2011 | Fraisse .................. | A61P 33/06 514/365 |
| 2011/0174190 A1 | 7/2011 | Sepa et al. | |
| 2012/0138913 A1 | 6/2012 | Alsayed et al. | |
| 2012/0267234 A1 | 10/2012 | Reece et al. | |
| 2013/0272919 A1* | 10/2013 | Kim .................. | B82Y 40/00 75/343 |
| 2013/0341074 A1 | 12/2013 | Virkar et al. | |
| 2013/0342221 A1 | 12/2013 | Virkar et al. | |
| 2014/0178247 A1 | 6/2014 | Alsayed et al. | |
| 2014/0202742 A1 | 7/2014 | Jones et al. | |
| 2014/0216207 A1 | 8/2014 | Allemand | |
| 2014/0238833 A1 | 8/2014 | Virkar et al. | |
| 2014/0251086 A1 | 9/2014 | Peng et al. | |
| 2014/0251087 A1 | 9/2014 | Peng et al. | |
| 2015/0086721 A1* | 3/2015 | Texter .................. | H01B 1/20 252/500 |
| 2015/0116255 A1 | 4/2015 | Zhong et al. | |
| 2015/0140549 A1 | 5/2015 | Mehrpouyan et al. | |
| 2015/0290715 A1 | 10/2015 | Moody et al. | |
| 2016/0032127 A1 | 2/2016 | Li et al. | |
| 2016/0096967 A1 | 4/2016 | Virkar et al. | |
| 2016/0108256 A1 | 4/2016 | Yang et al. | |
| 2016/0114395 A1 | 4/2016 | Kim et al. | |
| 2016/0122562 A1 | 5/2016 | Yang et al. | |
| 2016/0162063 A1 | 6/2016 | Lovenich et al. | |
| 2016/0293288 A1 | 10/2016 | Hu et al. | |
| 2016/0346839 A1 | 12/2016 | Ishii et al. | |
| 2016/0368049 A1 | 12/2016 | Saito et al. | |
| 2017/0169911 A1 | 6/2017 | Hu et al. | |
| 2018/0043436 A1 | 2/2018 | Chen et al. | |
| 2018/0105704 A1 | 4/2018 | Yang et al. | |
| 2018/0311741 A1 | 11/2018 | Xia et al. | |

FOREIGN PATENT DOCUMENTS

| | | | | |
|---|---|---|---|---|
| CN | 106563812 A | | 4/2017 | |
| CN | 106573299 A | | 4/2017 | |
| JP | 2009084193 A | * | 4/2009 | .......... C07C 311/48 |
| JP | 2013-159825 A | | 8/2013 | |
| JP | 2013-201007 A | | 10/2013 | |
| JP | 2017-066512 A | | 4/2017 | |
| JP | 2017-134884 A | | 8/2017 | |
| KR | 10-1532578 B1 | | 7/2015 | |
| KR | 2015-0107091 A | | 9/2015 | |
| KR | 2016-0027564 A | | 3/2016 | |
| KR | 2016-0076897 A | | 7/2016 | |
| TW | 2012-23877 A1 | | 6/2012 | |
| TW | 2016-42280 A | | 12/2016 | |

OTHER PUBLICATIONS

Quaternary ammonium cation—Wikipedia_pp. 1-9_Jul. 2017.*
Simple aromatic ring—Wikipedia_pp. 1-4_Dec. 2016.*
Uniform Ag Nanowires Synthesis_Sun et al._pp. 4736-4745_Oct. 2002.*
Chen et al., "Single-Crystal Nanowires of Platinum Can Be Synthesized by Controlling the Reaction Rate of a Polyol Process", J. Am. Chem. Soc. (2004), vol. 126, p. 10854-10855.
DaSilva et al., "Facile Synthesis of Sub-20 nm Silver Nanowires Through Bromide-Mediated Polyol Method," ACSNano (2016) vol. 10, pp. 7892-7900.
Ducamp-Sanguesa et al. "Synthesis and Characterization of Fine and Monodisperse Silver Particles of Uniform Shape", Journal of Solid State Chemistry, vol. 100 pp. 272-280 (1992). (Abstract Only).
Ecking et al., "Group Separation of Alkyl-Subsitituted Aromatic Hydrocarbons by High-Performance Liquid Chromatography Using Perfluorocarbon Modified Silica Gel", Short Communications, Chromatographia, vol. 16, p. 178-182, Dec. 1982.
Eisele et al., "Photoinitiated Growth of Sub-7 nm silver nanowires within a chemically active organic nanotabular template", Journal of the American Chemical Society, Jan. 27, 2010, vol. 132 No. 7, p. 2105, figure 3.
Hu et al., "Scalable Coating and Properties of Transparent, Flexible, Silver Nanowire Electrodes", ACSNano, vol. 4(5), (Apr. 2010), 2955-2963.
Im et al., "Large-Scale Synthesis of Silver Nanocubes: The Role of HCl in Promoting Cube Perfection and Mionodispersity", Angew. Chem. Int. Ed., (2005), vol. 44, p. 2154-2157.
Jang et al., "Research Update: Synthesis of sub-15-nm Diameter Silver Nanowires through a water-based Hydrothermal Method: Fabrication of low-haze 2D Conductive Films", APL Materials 5, 080701 (2017), Aug. 8, 2017.
Jha, "Colour Measurments and Modeling", Nondestructive Evaluation of Food Quality, (2010), Ch 2. p. 1-25.
Jia et al., "Synthesis of very thin Ag nanowires with fewer particles by suppressing secondary seeding", CrystEngComm (2017), vol. 19., pp. 148-153.
Jo et al., "Synthesis of small diameter silver nanowires via a magnetic-ionic-liquid-assisted polyol process," RSC Advances (2016) vol. 6, pp. 104273-104279.
Lee et al., "Syntheses and Optoelectronic Characteristics of 20 nm Diameter Silver Nanowires for Highly Transparent Electrode Fields", RSC Advances, 6, 11702, Jan. 13, 2016.
Li et al., "Synthesis and Purification of Silver Nanowires to make conducting films with a transmittance of 99%", Nano Letters, Sep. 21, 2015, vol. 15 No. 10, p. 6723.
Menamparambath et al., "Reduced Hazed of Transparent Conductive Films by Smaller Diameter Silver Nanowires", Nanotechnology 27, 485706, p. 1-7, (2016).

(56) References Cited

OTHER PUBLICATIONS

Pradel et al., "Cross-Flow Purification of Nanowires", Angew. Chem. Int. Ed., (2011), vol. 50, p. 3412-3416.
Sigma-Aldrich, "Dimethyl Sulfoxide", DMSO Absorbance Property, Jun. 2017, p. 1.
Snavely, "Computer Vision-Lecture 20—Light, Reflectance and Photometric Stero", CS6670, (2011), p. 1-40.
Sun et al., "Ambient-stable tetragonal phase in silver nanostructures", Nature Communications, Jul. 2012, pp. 1-6.
Wang et al., "A Simple Hydrothermal Route to Large-Scale Synthesis of Uniform Silver Nanowires", Chemistry a European Journal, vol. 11, p. 160-163, (2005).
Wiley et al., "Polyol Synthesis of Silver Nanoparticles: Use of Chloride and Oxygen to Promote the Formation of Single-Crystal, Truncated Cubes and Tetrahdrons", American Chemical Society-Nano Letters, vol. 4, No. 9, p. 1733-1739, Jul. 22, 2004.
Wiley et al., "Polyol Synthesis of Silver Nanostructures: Control of Product Morphology with Fe(II) or Fe(III) Species", American Chemical Society; Langmuir, vol. 21; 18, Aug. 30, 2005, p. 8077-8080.
Wiley et al., "Synthesis of Silver Nanostructures with Controlled Shapes and Properties," Acc. Chem. Res. (2007) vol. 40 pp. 1067-1076.
Xia et al., "Shape Controlled Synthesis of Metal Nanocrystals: Simple Chemistry Meets Complex Physics?", Angew. Chem. Int. Ed., 48, 60 (2009). (Absrtact Only).
Zhang et al., "Facile Synthesis of [Cu(SCH3)]∞ Nanowires with High Charge Mobility," ChemPlusChem 2014, 79, p. 559-563.
Google Search—Lambert's Law and diffuse reflection and L, Sep. 5, 1999.
International Search Report and Written Opinion from the corresponding PCT International Application No. PCT/US2018/63995 dated Apr. 2, 2019.
Third Party Submission in related U.S. Appl. No. 16/249,241, filed Jul. 9, 2019.
Office Action from corresponding Taiwan Patent Application No. 107143804 dated Jul. 9, 2019.
Office Action from corresponding Taiwan Patent Application No. 108136063 dated May 19, 2020.
Office Action from corresponding Japanese Patent Application No. 2020-531147 dated Dec. 14, 2021.
Office Action from corresponding Chinese Patent Application No. 201880086347.9 dated Apr. 21, 2021.
Search Report from corresponding European Patent Application No. 18886188.4 dated Aug. 19, 2021.
Office Action from corresponding Japanese Patent Application No. 2020-531147 dated Jun. 7, 2022.
Office Action from corresponding Chinese Patent Application No. 202210312480 dated Apr. 27, 2023.

* cited by examiner

THIN AND UNIFORM SILVER NANOWIRES, METHOD OF SYNTHESIS AND TRANSPARENT CONDUCTIVE FILMS FORMED FROM THE NANOWIRES

CROSS REFERENCE TO RELATED APPLICATIONS

This application is a continuation of copending U.S. patent application Ser. No. 16/549,204 to Hu et al., filed Aug. 23, 2019, entitled "Thin and Uniform Silver Nanowires, Methods of Synthesis and Transparent Conductive Films Formed from the Nanowires," which is a continuation of U.S. patent application Ser. No. 16/249,249 to Hu et al., filed Jan. 16, 2019, entitled "Thin and Uniform Silver Nanowires, Methods of Synthesis and Transparent Conductive Films Formed from the Nanowires," which is a divisional of U.S. patent application Ser. No. 15/951,758 to Hu et al., filed Apr. 12, 2018, entitled "Thin and Uniform Silver Nanowires, Methods of Synthesis and Transparent Conductive Films Formed from the Nanowires," which claims priority to U.S. Provisional Patent Application No. 62/595,281 to Hu et al., filed Dec. 6, 2017, entitled "Thin and Uniform Silver Nanowires, Methods of Synthesis and Transparent Conductive Films Formed from the Nanowires," all of which are incorporated herein by reference in their entirety.

FIELD OF THE INVENTION

The invention relates to silver nanowires with very small diameters and large aspect ratios that can be assembled in useful quantities with very uniform diameters. The invention further relates to method of synthesizing the nanowires, including but not limited to methods based on particularly desirable catalysts for the synthesis. Also, the invention relates to transparent conductive films with very low haze while achieving high transparency and low electrical resistance.

BACKGROUND OF THE INVENTION

Silver nanowires represent a promising technology for transparent electrical conductors and other conductor applications as a more versatile alternative to traditional conductive oxides, such as indium tin oxide, and other conductive materials. While market penetration of silver nanowires for various applications have been limited to date, it is expected that silver nanowires will provide a growing supply of materials for high performance applications. Silver nanowires are generally synthesized and subsequently delivered to a structure for incorporating into a product. Thus, the first step of the commercialization effort involves the synthesis of the silver nanowires.

SUMMARY OF THE INVENTION

In a first aspect, the invention pertains to a collection of nanowires comprising silver and having an average diameter of no more than about 20 nm and a standard deviation of the diameter of no more than about 2.5 nm. For thin uniform nanowires, the collection of nanowires can be characterized by an absorption at 410 nm relative to the maximum absorption of no more than about 0.225 along with a narrow absorption peak when measured in a dilute solution with dimethyl sulfoxide solvent. In some embodiments, no more than about 10% of the nanowires have a diameter greater than 18 nm.

In a further aspect, the invention pertains to a method for synthesizing silver nanowires, the method comprising forming a reaction solution substantially free of paramagnetic ions comprising a blend of polyol solvent, polyvinyl pyrrolidone, a chloride salt, and a bromide salt. The reaction solution comprises a five-membered aromatic heterocyclic cation having at least one but no more than three nitrogen atoms and at least one carbon atom. Suitable five-membered heretocyclic ions include, for example, imidazolium, pyrazolium, derivatives thereof and mixtures thereof. The reaction solution can be heated to reach a selected peak temperature, following which the heating may or may not be terminated. A soluble silver salt is added to the reaction solution. In some embodiments, the soluble silver salt can be added near or after reaching the peak temperature, e.g. within about 5 degrees C.

In another aspect, the invention pertains to a method for synthesizing silver nanowires, the method comprising the steps of forming a reaction solution comprising a blend of polyol solvent, polyvinyl pyrrolidone, a salt comprising chloride and/or bromide, and a neutral organic compound with a five-membered aromatic heterocycle comprising at least one but no more than three nitrogen atoms and at least one carbon atom, heating the reaction solution to a peak temperature, and adding a soluble silver salt. In some embodiments, the soluble silver salt can be added near or after reaching the peak temperature, e.g. within about 5 degrees C. The neutral organic compound can be imidazole, pyrazole, derivatives thereof, or mixtures thereof.

In other aspects, the invention pertains to a transparent electrically conductive structure comprising a transparent substrate and a sparse metal conductive layer over a surface of the transparent substrate. In embodiments based in the improved silver nanowires described herein, the transparent electrically conductive structure can have a sheet resistance of no more than about 100 ohms/sq, a total transmittance of visible light of at least about 90% and a haze of no more than about 0.60%. In some embodiments, the value of $\Delta L^*$ obtained in a reflection configuration on a substrate with a black surface is no more than a value of 2.0, $\Delta L^* = L^*$ of the electrically conductive structure minus $L^*$ of the structure without the sparse metal conductive film.

In additional aspect, the invention pertains to a transparent electrically conductive structure comprising a transparent substrate, a first sparse metal conductive layer over a first surface of the transparent substrate, and a second sparse metal conductive layer over a second surface of the substrate opposite the first surface. In some embodiments, each surface of the transparent electrically conductive structure has a sheet resistance of no more than about 100 ohms/sq and wherein the transparent electrically conductive structure has a total transmittance of visible light of at least about 90% and a haze of no more than about 0.90%

DETAILED DESCRIPTION OF THE INVENTION

Figure 1:
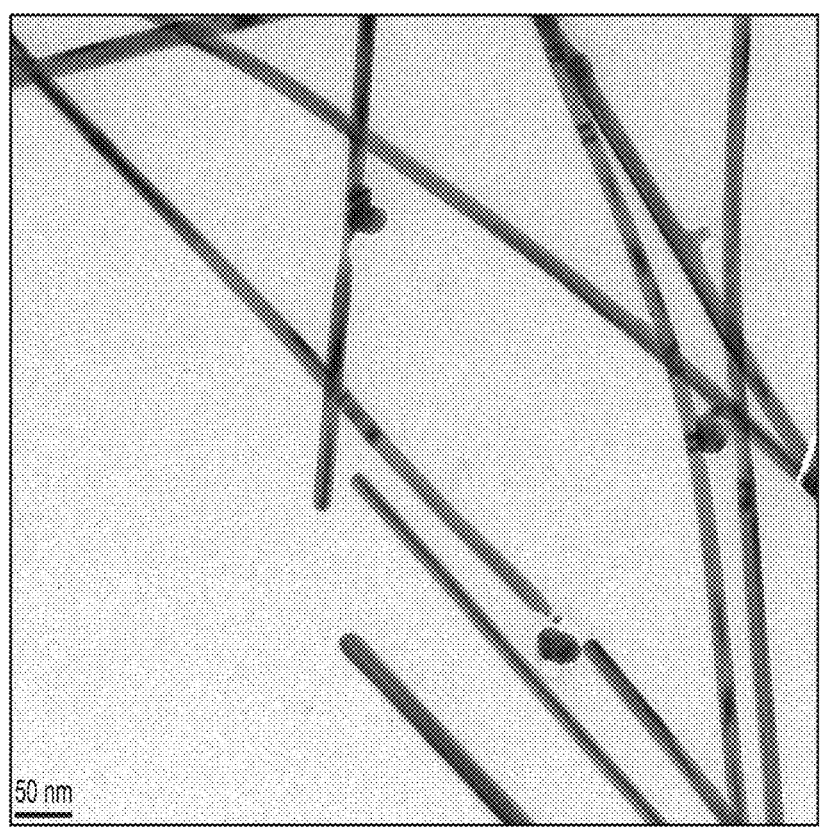
FIG. 1 is a transmission electron micrograph (TEM) of silver nanowires formed using a first set of reactants.

Synthesis techniques provide for the production of highly uniform silver nanowires having a very small diameter that can be used for the production of transparent conductive films with improved performance. In some embodiments, the uniform nanowires can have an average diameter no more than about 20 nm and a uniformity as expressed by a standard deviation in diameter of no more than about 2.5 nm. The nanowires can be further characterized by spectroscopic properties of dilute solutions of the nanowires, and spectroscopic characterization provide an alternative approach to characterize the properties of a collection of the nanowires. The synthesis techniques can be based on the use of both a chloride based catalyst and a bromide based catalyst, and in some embodiments at least one of the catalysts may have a catalyst based on five-membered aromatic heterocyclic cations, such as imidazolium. In additional or alternative embodiments, non-ionic five-membered organic heterocyclic compounds, such as imidazole, pyrazole, other isomers thereof, or a derivative thereof, can be also added as a catalyst. The reaction can be controlled to achieve a small average wire diameter with a high degree of uniformity of the purified silver nanowires. Purified silver nanowires can exhibit the higher degree of uniformity with very small average diameters, and can be formulated into dispersions/inks for the formation of transparent conductive films of highly desirable properties. In particular, the product transparent conductive films can achieve very low haze and desirably dark reflectivity properties, which are properties of interest for display applications.

Dispersions of silver nanowires can be deposited on a surface and processed into a conductive film. The resulting conductive film can be desirable due to its mechanical properties, transparency to visible light, combinations of these features, or other aspects of the conductive film. In particular, the use of the nanowires to form transparent conductive films can have significant application in devices with displays. While processing of the silver nanowires into the films can influence the resulting properties significantly, the use of high quality nanowires can also be a significant factor in the quality of the resulting transparent conducting film. The quality of the nanowires can be influenced by several factors, but relevant factors include purity of the nanowires, thinness of the nanowires, aspect ratio, and as described herein uniformity of the nanowire size. The thin and uniform silver nanowires described herein can be effective in producing transparent conductive films with very low haze and very low color intensity or luminosity expressed as reflective L* in the CIELAB scale discussed further below.

The synthesis approaches described herein have been successful for the synthesis of particularly thin nanowires with a high degree of uniformity. In addition, the synthesis approaches have achieved high yields in a format that is amenable to appropriate purification techniques to provide for ready commercialization of the resulting silver nanowires. Due to the highly thin and uniform character of the silver nanowires, it has been possible to process the nanowires into transparent conductive films with improved low levels of haze and reflectivity at desired values of electrical conductivity (low sheet resistance) and high transmittance.

While some alternative approaches have been reported for the synthesis of silver nanowires, commercially viable approaches for silver nanowire synthesis have generally been based on what is generally referred to as the polyol process, which involves a polyvinylpyrrolidone capping agent and a glycol solvent reducing agent. The first report of the polyol process for silver nanowire synthesis based on a polyvinylpyrrolidone capping agent is generally attributed to Ducamp-Sanguesa et al., Journal of Solid State Chemistry, 100, 272-280 (1992) entitled "Synthesis and Characterization of Fine and Monodisperse Silver Particles of Uniform Shape," incorporated herein by reference. This technique was extended by the laboratory of Professor Xia, see U.S. Pat. No. 7,585,349 to Xia et al., entitled "Methods of Nanostructure Formation and Shape Selection," and Wiley et al., "Synthesis of Silver Nanostructures with Controlled Shapes and Properties," Acc. Chem. Res. 2007, 40, 1067-1076, both of which are incorporated herein by reference. Similar synthesis was carried out with $Fe^{+2}$ or $Cu^{+2}$ halide salts by Xia et al., "Shape Controlled Synthesis of Metal Nanocrystals: Simple Chemistry Meets Complex Physics?" Angew. Chem. Int. Ed., 48, 60 (2009). Use of various other metal halide salts have been used in metal nanowire synthesis. The use of quaternary phosphonium salts as a substitute for metal halides is described in U.S. Pat. No. 8,741,025 to Whitcomb, entitled "Nanowire Preparation Methods, Compositions, and Articles," incorporated herein by reference.

Imidazolium halides with a paramagnetic anion have been used as catalysts for the formation of silver nanowires as discussed in Jo et al., "Synthesis of small diameter silver nanowires via a magnetic-ionic-liquid-assisted polyol process," RSC Advances 2016, 6, 104273-104279. The work of Jo et al., involved a $FeCl_4^-$ anion. Some of their work involved the use of 1-butyl-3-methylimidazolium tetrachloroferrate (bmim ($FeCl_4$)) along with bmimBr. The present work with imidazolium salt catalysts avoids the use of the paramagnetic component ($FeCl_4$) and in some embodiments uses an alternative secondary salt with a simpler cation in combination with an imidazolium cation. The presence of the iron cation in the reaction solution alters the synthesis conditions in significant ways that are avoided in the present work. The present work also differs from the Jo et al. methods in the aspects of the synthesis conditions. The current work involves the formation of highly uniform nanowires as well as thinner nanowires relative to the results of Jo et al.

In general, the reactions are carried out in a liquid polyol solvent, such as ethylene glycol, propylene glycol, combinations thereof, or the like. A polyvinylpyrrolidone capping agent is used, and various molecular weight PVP polymers are exemplified. The use of higher molecular weight polyvinylpyrrolidone to synthesize thinner nanowires is described in da Silva et al., "Facile Synthesis of Sub-20 nm Silver Nanowires Through Bromide-Mediated Polyol Method," ACSNano 2016, 10, 7892-7900, incorporated herein by reference.

The uniform, thin silver nanowires described herein have been synthesized with cations having a five-membered aromatic heterocycle moiety, and these are described in the context of some specific embodiments. The organic heterocyclic cations can be conveniently provided as halides, but other salts with these cations can be effectively used also, such as nitrates. Whether or not the organic heterocyclic cations are provided as halides, halide anions can be provided additionally or alternatively with reasonable cations that are suitable for the reaction conditions, such as $Na^+$, $K^+$, $NH_4^+$, mixtures thereof, or the like. Some particularly desirable cationic heterocycles are discussed first, and a more general discussion of these cationic catalysts are presented in a later section.

In some embodiments, imidazolium salt compounds, e.g., chloride and/or bromide salts, (1,3-substituted diazacyclopenta-2,4-diene halide) can be represented by the formula:

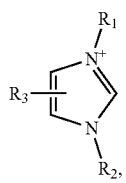

where $R_1$ and $R_2$ are independently hydrogen, a linear, branched, or cyclic alkyl group, such as methyl, propyl, isopropyl, butyl, cyclohexyl, an unsaturated group such as vinyl, an arylalkyl group such as benzyl, naphthylmethyl, or other groups with up to at least 30 carbon atoms, with the proviso that both $R_1$ and $R_2$ are not both hydrogens, and where $R_3$ is a halogen or any substituent described for $R_1$ and $R_2$, and can be independently located in the 2-, 4-, or 5-positions of the five-membered ring, and $X^-$ is an anion, such as $BF_4^-$, $PF_6^-$, $Cl^-$ or $Br^-$. Some imidazolium-based compounds have a 1-methyl group and a longer chain at the 3 position, although note that the 1 and 3 positions are equivalent due to symmetry. Additional substituents at other ring positions can also be contemplated. In the reaction solutions herein, the solution lacks a complexing metal cation, which can be expected to alter the equilibrium conditions of the ions in solution. Also, the present reaction solutions lack a paramagnetic component. Free chloride ions generally precipitate silver chloride, which can form as small particle seeds, due to the very low solubility of silver chloride. Silver bromide also has very low solubility in glycols. Of course in equilibrium, small quantities of both silver chloride and silver bromide dissolve in the glycols according to the respective equilibrium constants.

Additionally, pyrazolium salts, e.g., halides, are isomeric forms of imidazolium salts and can be useful catalyst compounds. Collectively, the imidazolium and pyrazolium ions can be referred to as diazolium ions based on the five-membered aromatic rings with two nitrogen atoms on the ring. A general structure of pyrazolium salt is represented by the formula:

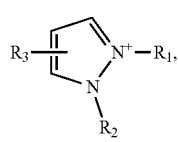

where $R_1$, $R_2$, and $R_3$ are as described above for the imidazolium salts, respectively and can be the same for the pyrazolium salts, and $X^-$ is an anion.

Further five-membered aromatic hetrocyclic ions are represented by selected five-membered aromatic heterocycles such as thiazolium salts:

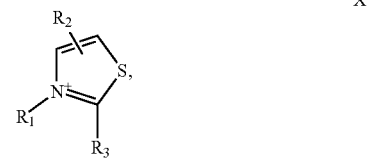

where $R_1$ and $R_2$ are respectively as described for the imidazolium salts and $R_3$ is hydrogen, a linear, branched, or cyclic alkyl group, such as methyl, propyl, isopropyl, butyl, cyclohexyl, an unsaturated group such as vinyl, an arylalkyl group such as benzyl, naphthylmethyl, or other groups with up to at least 30 carbon atoms, and $X^-$ is an anion, such as $Cl^-$ or $Br^-$.

The use of a combination of chloride catalysts and bromide catalysts are described in an article to Hu et al. (hereinafter Hu), entitled "Scalable Coating and Properties of Transparent, Flexible, Silver Nanowire Electrodes, ACSNano, Vol. 4(5), (April 2010), 2955-2963, incorporated herein by reference. In some embodiments described herein, imidazolium ions in the catalysts are combined with improved process controls to synthesize improved silver nanowires with very small and uniform sizes. Generally, both a chloride salt and bromide salt can be used. Also, for the first time known to Applicant, a non-polymer organic molecule, imidazole and derivatives thereof, has been found to improve the geometry of the nanowires.

In combination with ionic catalysts, Applicant has discovered the use of neutral organic catalysts for further facilitating the synthesis of thinner highly uniform nanowires. Some examples are presented with soluble small organic catalyst molecules. For example, imidazole compound and pyrazole compound (or more generally five-membered aromatic heterocyclic rings with carbon and nitrogen) are shown in the Examples to contribute to formation of thinner nanowires with selected ionic catalysts while producing even more uniform nanowires in high yield. The use of a non-ionic organic catalyst additive provides as new class of agents to facilitate the synthesis. The neutral organic catalysts were used in combination with suitable halide salt catalysts. It is shown to be possible to form collections of nanowires with a significant fraction of nanowires with diameters below 15 nm.

The Examples below are based on ethylene glycol solvents, although propylene glycol is known in the art to also work for silver nanowire synthesis as a substitute for or mixed with ethylene glycol. With respect to the capping agent, polyvinylpyrrolidone (PVP) and PVP copolymers have been successfully used. One could imagine other polar polymers could be substituted for the (PVP) but to date no reports of comparable results with other polymer capping agent has been reported in a polyol driven synthesis. PVP copolymers have been used to synthesize relatively thick silver nanowires as described in published U.S. patent 2014/0178247 A1 to Alsayed et al., entitled "Process for Making Silver Nanostructures and Copolymer Useful in Such Process," incorporated herein by reference. An aqueous synthesis approach without the use of a polymer capping agent is discussed in published U.S. patent application 2010/0078197 A1 to Miyagishima et al., entitled "Metal Nanowires, Methods for Producing the Same and Transparent Conductor," incorporated herein by reference. Results in the Examples are reported using PVP K30, which has a molecular weight from about 40,000 g/mole to 50,000 g/mol, PVP K85N, which is a purer form of PVP having a molecular weight of roughly 1,000,000, or PVP K90 having a molecular weight from about 900,000-1,600,000 (PVP K90, BASF). The K values of the PVPs relate to certain viscosity measurements, but these values can generally be converted to molecular weight ranges. Polymers are generally characterized by ranges of molecular weights that are estimated based on accepted analytical techniques. The distributions of molecular weights can depend on proprietary synthesis techniques and may vary for particular products. BASF is believed to be the largest PVP supplier in the world, but other suppliers are known, such as Ashland Chemical Company and Nippon Shokubai. The results with higher molecular weight PVP tended to have smaller diameters, i.e., thinner nanowires, but with somewhat of a drop in yield.

The catalyst selection along with a higher peak temperature provides for a shorter reaction time while also providing high nanowire yields. Generally, the reactions herein provide improved yields relative to known comparable synthesis techniques. The high yields and shorter reaction times are desirable features for commercial nanowire synthesis. High reaction temperatures and short reaction times were also used by Hu, cited above. But Hu used solid silver chloride catalyst, and experience of Applicant with these reactants suggests lower reaction temperatures and longer reaction time to obtain somewhat thinner wires. Using the reactant systems described herein, very thin and uniform silver nanowires are obtained even with the higher peak reaction temperature and with shorter reaction times. Based on experience in the art, average silver nanowire diameters have been limited at about 22 nm for larger scale production yields. Some efforts to produce thinner wires have succeeded in small reductions in silver nanowire average diameters, but generally at the expense of uniformity and/or yield. The respects herein have succeeded in unprecedented thin nanowires while improving the diameter uniformity and while obtaining a yield comparable to yields achieved at 22 nm average diameters.

In some embodiments, the improved silver nanowires can have an average diameter of no more than about 20 nanometers (nm) and generally no more than about 19 nm. Correspondingly, the nanowires simultaneously have a high degree of uniformity as determined both by measurement of diameters in micrographs and spectroscopic measurements, as explained below. The nanowire diameters can be determined through examination of images from electron microscopy. The average is generally evaluated through the measurement of about 100 representative nanowires. The uniformity in diameters can be conveniently expressed as a standard deviation, although other aspects of the diameter distribution, such as numbers of wires below specified cutoff values (in particular 18 nm or less) can also provide useful characterization of the distributions. In some embodiments, the standard deviation is no more than about 3.5 nm. Also, in some embodiments, at least about 75% of the silver nanowires have a diameter less than 18 nm. The average nanowire length can be from about 10 microns to about 30 microns. Historically, the nanowire length has been considered a significant parameter, but it has been found that once a length greater than roughly 10 microns is reached, further length increases do not significantly improve the properties of a transparent conductive layer formed from the nanowires. The UV Visible absorption spectrum in a suitable dispersant can also be used to characterize the nanowires. A suitable liquid can be dimethyl sulfoxide (DMSO) with a silver nanowire concentration of 0.005 wt %, although at low concentrations the normalized spectrum generally is not significantly sensitive to the concentration. As used herein a normalized absorption spectrum sets the highest value to 1 and the lowest value to 0 within the wavelength range of 300 nm to 800 nm. As the average nanowire diameter gets smaller, the absorption maximum tends to shift to lower wavelengths (blue-shift). As the silver nanowires become more uniform, the absorption peak tends to narrow. Due to changes in peak shape that are not yet fully understood, there may be additional contributions to the narrowing of the absorption peak. Nevertheless, for uniform thin silver nanowires, the absorption peak is narrow and blue shifted, which can be measured through the absorption at 410 nm that decreases or alternatively through the absorption peak width.

Transparent electrically conductive elements, e.g., films, of particular interest herein comprise a sparse metal conductive layer. The conductive layers are generally sparse to provide desired amount of optical transparency, so the coverage of the metal has very significant gaps over and between the layer of the conductive element. For example, transparent electrically conductive films can comprise metal nanowires deposited along a layer where sufficient contact can be provided for electron percolation to provide suitable conduction pathways. The thin and uniform silver nanowires can be effectively used for a range of structures providing transparent conducting films involving sparse metal conductive layers. In other embodiments, the transparent electrically conductive film can comprise a fused metal nanostructured network, which has been found to exhibit desirable electrical and optical properties.

In general, various sparse metal conductive layers can be formed from metal nanowires. Films formed with metal nanowires that are processed to flatten the nanowires at junctions to improve conductivity is described in U.S. Pat. No. 8,049,333 to Alden et al., entitled "Transparent Conductors Comprising Metal Nanowires," incorporated herein by references. Structures comprising surface embedded metal nanowires to increase metal conductivity are described in U.S. Pat. No. 8,748,749 to Srinivas et al., entitled "Patterned Transparent Conductors and Related Manufacturing Methods," incorporated herein by reference. However, improved properties have been found for fused metal nanostructured networks with respect to high electrical conductivity and desirable optical properties with respect to transparency and low haze. Fusing of adjacent metal nanowires can be performed based on chemical processes under commercially appropriate processing conditions.

In particular, a significant advance with respect to achieving electrically conductive films based on metal nanowires has been the discovery of well controllable processes to form a fused metal network where adjacent sections of the metal nanowires fuse. In particular, it was discovered that halide ions can drive the fusing of metal nanowires to form fused metal nanostructures. Fusing agents comprising halide anions were introduced in various ways to successfully achieve the fusing with a corresponding significant drop in the electrical resistance. It should be noted that halide ions in this processing context should not be confused with halide ions used in the nanowire synthesis reactions. Specifically, the fusing of metal nanowires with halide anions has been accomplished with vapors and/or solutions of acid halides as well as with solutions of halide salts. Fusing of metal nanowires with halide sources is described further in published U.S. patent application 2013/0341074 to Virkar et al., entitled "Metal Nanowire Networks and Transparent Conductive Material," now U.S. Pat. No. 10,029,916 B2, and U.S. Pat. No. 9,920,207 to Virkar et al. (the '207 patent), entitled "Metal Nanostructured Networks and Transparent Conductive Material," both of which are incorporated herein by reference.

An extension of the process for forming fused metal nanowire networks was based on reduction/oxidation (redox) reactions that can be provided to result in fused nanowires without destroying the optical properties of the resulting film. Metal for deposition at the junctions can be effectively added as a dissolved metal salt or can be dissolved from the metal nanowires themselves. The effective use of redox chemistry for fusing metal nanowires into a nanostructured network is described further in published U.S. patent application 2014/0238833A1 to Virkar et al. (the '833 application), entitled "Fused Metal Nanostructured Networks, Fusing Solutions with Reducing Agents and Methods for Forming Metal Networks," now U.S. Pat. No. 10,020,807 B2, incorporated herein by reference. The '833 application also described a single solution approach for the formation of fused metal nanostructured networks. Single solution approaches for the formation of fused metal nanostructured layers are described further in U.S. Pat. No. 9,183,968 B1 to Li et al, (hereinafter the '968 patent) entitled "Metal Nanowire Inks for the Formation of Transparent Conductive Films with Fused Networks," incorporated herein by reference, and single solution or ink processing to form fused metal nanostructured networks is used in the Examples below.

The desirable inks to achieve effective single deposition inks that cure into fused nanostructured metal networks comprise a desired amount of metal nanowires to achieve appropriate loading of metal in the resulting film. In appropriate solutions, the inks are stable prior to deposition of the ink and drying. The inks can comprise a reasonable amount of polymer binder that contributes to the formation of a stable conducting film for further processing. To obtain good fusing results with one ink systems, hydrophilic polymers have been found to be effective, such as cellulose or chitosan based polymers. Metal ions, as a source of metal for the fusing process, can be supplied as a soluble metal salt.

A single ink formulation provides for depositing a desired loading of metal as a film on the substrate surface and simultaneously providing constituents in the ink that induce the fusing process as the ink is dried under appropriate conditions. These inks can be referred to conveniently as fusing metal nanowire inks with the understanding that the fusing generally does not take place until drying. The inks generally comprise an aqueous solvent, which can further comprise an alcohol and/or other organic solvent in some embodiments. The inks can further comprise dissolved metal salts as a metal source for the fusing process. Without wanting to be limited by theory, it is believed that components of the ink, e.g., alcohol, or other organic compositions, reduce the metal ions from solution to drive the fusing process. Previous experience with the fusing process in these systems suggests that the metal preferentially deposits at the junctions between adjacent metal nanowires. A polymer binder can be provided to stabilize the film and to influence ink properties. The particular formulation of the ink can be adjusted to select ink properties suitable for a particular deposition approach and with specific coating properties on a substrate surface. As described further below, drying conditions can be selected to effectively perform the fusing process. Two solution fusing systems have also been established and can take advantage of the improved silver nanowires described herein.

The fused metal nanostructured networks have been found to provide for low sheet resistances while correspondingly providing high transmittance and low haze. Reducing the nanowire thickness can further improve the optical properties. The results herein also demonstrate that the uniformity of nanowires also contributes to further improvement of the optical properties. In particular, it is found that a reduced number of nanowires with a diameter of 18 nm or greater provides a very low haze value and a very low value of diffuse reflective L*. The synthesis techniques described herein can be selected to produce silver nanowires with a uniformity that corresponds with over 75% of the nanowires having a diameter of no more than 18 nm. In some embodiments, the value of L* in a reflective configuration attributable to the transparent conductive film can be no more than about 2.0, where this parameter is described below as ΔL* in which the L* of the other structural features is subtracted from the overall value of L*. Values of haze in a transmission configuration can be no more than about 0.6% for fused metal nanostructured networks at values of sheet resistance of no more than about 100 ohms/sq formed with the thinner, uniform silver nanowires.

Silver Nanowire Synthesis and Purification

Improved silver nanowires synthesis has achieved highly uniform silver nanowires with small average diameters. The synthesis is suitable for large scale synthesis at relatively high yield. Improve catalysts and combinations of catalysts with desired short reaction times can provide the highly uniform nanowires. In particular, desirable results are described with dialkyl imidazolium halides in salt blends with a chloride salt and a bromide salt, which may comprise an inorganic cation also. Further surprisingly improved results are obtained with small molecule organic catalysts, such as imidazole, and may be expected similarly from isomers thereof. The selection of the PVP capping polymer can also favorably influence the silver nanowire thinness. Generally, a purification step is necessary to isolate the nanowires from the reaction mixture comprising significant amount of other nanostructures such as nanoparticles. Concentrations referred to in this section are based on amounts added to the reaction solution and the volume, and the actual concentrations in solution evolve based on the interactions and the reactions of the species in solution.

In the polyol processes, the solvent is a diol, generally ethylene glycol, propylene glycol or a blend thereof. The diols can function as a reducing agent with controllable properties, such as through the application of heat. While being the solvent, the amount of glycol generally is set based on the scale of the reaction, and the other reactants are adjusted accordingly. The standard silver salt source for providing the silver ions to be formed into the nanowires is silver nitrate, which is soluble in the glycols, although other soluble silver salts could be used in principle. The soluble silver salt is added to drive the nanowire synthesis. Since the silver is substantially all consumed, the concentration of silver can change significantly over the course of the reaction. Generally, the silver nitrate may be added as a solid or dissolved in glycol solvent, and furthermore the silver nitrate can be added substantially all at once or gradually. In the Examples herein, a silver nitrate solution in ethylene glycol is added substantially all at once, which for practical purposes is over the course of no more than about 10 minutes.

Polyvinylpyrrolidone has been used in the polyol process as a capping agent. While not wanting to be limited by theory, it is believed that polyvinylpyrrolidone (PVP) preferentially associates with certain crystal lattices of crystalline silver such that silver deposits then along the other facets of the crystal to form the nanowires. The work of Xia's research group has examined the synthesis of various silver nanostructures. The molecular weight of the PVP can influence the synthesis reaction. PVP K30, having a molecular weight from about 40,000-60,000 g/mol, can be successfully used to form the thin nanowires. PVP K-90 (or K-85) with molecular weights of 900,000 to 1,600,000 or blends with PVP K30 have also been successfully used to obtain similar results as presented herein. With other parameters being equal, the higher molecular weight PVP capping agents tend to form somewhat thinner nanowires but as presently found at a significant reduction of yield. The reaction mixture generally comprises from about 0.1 weight percent to about 10 wt %, in further embodiments from about 0.2 wt % to about 9 wt %, and in other embodiments from about 0.25 wt % to about 8 wt % PVP in the reaction mixture. A person of ordinary skill in the art will recognize that additional ranges of PVP concentrations within the explicit ranges above are contemplated and are within the present disclosure.

A soluble silver salt is added to provide silver ions for chemical reduction to silver that is assembled into the nanowires. As a practical matter, silver nitrate ($AgNO_3$) has been the only readily available silver salt that is suitably soluble in the glycol solvents. To the extent that other more esoteric silver salts could be identified with appropriate solubility, it is expected that they would be cost prohibitive relative to silver nitrate. With respect to silver nitrate, the reaction mixture generally comprises from about 0.0025M to about 0.25M, in further embodiments from about 0.005 to about 0.20M, and in other embodiments from about 0.01M to about 0.15M silver nitrate in the reaction mixture, and other soluble silver salts could be added to achieve comparable molar concentrations. A person of ordinary skill in the art will recognize that additional ranges of soluble silver concentrations within the explicit ranges above are contemplated and are within the present disclosure. As silver nitrate is converted over the course of the reaction, an indication of the reaction mixture "comprising" a certain amount of silver nitrate refers to the relative amount of silver nitrate added over the course of reaction rather than necessarily the amount of silver in solution at a particular time, which is in flux and not readily measurable.

The use of specific blends of catalysts salts has resulted in the improved nanowire syntheses described herein. Generally, the reaction solution comprises a chloride salt and a bromide salt, so that at least two salts are mixed into the glycol solvent. To obtain the desirable silver nanowire properties, the reaction solution is substantially free of paramagnetic ions, such as iron ions. In the context of this application, substantially free refers to no added ions and generally no more than $1 \times 10^{-6}$M paramagnetic ions. In some embodiments, the desirable ionic catalysts comprise a molar ratio of bromide concentration divided by chloride concentration of the catalysts as added from about 0.5 to about 15, in further embodiments from about 0.75 to about 10, in additional embodiments from about 0.9 to about 7 and in other embodiments from about 0.95 to about 6. A person of ordinary skill in the art will recognize that additional ranges of ion ratios within the explicit ranges above are contemplated and are within the present disclosure.

With respect to the cations, the salts generally comprise an organic cation, such as imidazolium, and in some embodiments a blend of cations can be effectively used. If two distinct cations are used, one of the cations can be an inorganic cation, such as alkali metal cations, such as $Na^+$ or $K^+$, ammonium cation $NH_4^+$, substituted ammonium cations, such as tetramethyl ammonium, or hexyl trimethyl ammonium, or mixtures thereof. Some successful results are obtained in the examples with a blend of an imidazolium chloride salt and imidazolium bromide salt, and a further optional non-ionic catalyst can be included and/or a blend of organic cations as described herein. Organic cations can be delivered with alternative anions, such as nitrate, as long as desired chloride and/or bromide anions are provided. In general, organic cations of particular interest for thin nanowire synthesis comprise a five-membered aromatic heterocycle with from one to three nitrogen atoms on the aromatic ring and one or more carbons along with an optional additional heteroatom, such as oxygen or sulfur. Generally, the catalyst salts can individually be at concentrations from about 0.00001M to about 0.01M, in further embodiments from about 0.00002M to about 0.005M, and in other embodiments from about 0.00005M to about 0.0025M. A person of ordinary skill in the art will recognize that additional ranges of concentration within these explicit ranges are contemplated and are within the present disclosure.

The organic cations with a five-membered aromatic heterocycle include moieties based on imidazolium, pyrazolium, thiazolium, oxazolium, triazolium and the like. Suitable imidazolium cations include, for example, 1-butyl-3-methylimidazolium, 1-ethyl-3-methylimidazolium, 1-hexyl-3-methyl imidazolium, 1-octyl-3-methylimidazolium, 1,3-di-isopropylimidazolium, 1,3-dicyclohexylimidazolium, or the like, or mixtures thereof. Similar derivatives can be used for the other heterocycles. Examples presented below are performed with 1-octyl-3-methylimidazolium chloride, but some preliminary experiments with these other enumerated cations have yielded reasonably comparable results under the conditions of those experiments.

In some embodiments, a non-ionic organic catalyst can also be added. Examples are presented with imidazole or pyrazole were added along with chloride and bromide salt catalyst additives to provide desirably thin and uniform nanowires. However, the non-ionic catalysts can be useful with only a single halide salt catalyst, such as either a chloride or a bromide as well as with reaction solutions having both a chloride salt and a bromide salt. For embodiments in which a single halide salt is used along with the non-ionic catalysts, the range of halide salt concentrations would still be within the values presented above and the general reaction conditions for the synthesis with the non-ionic catalysts overlap with the reaction conditions for the synthesis reactions with just the ionic salt catalysts.

It is found that aromatic heterocycles such as imidazole promote formation of thinner nanowires at comparable or better uniformity and high yield. In particular, five-membered aromatic heterocyclic rings with carbon and nitrogen can be used as non-ionic catalysts. The five-membered aromatic heterocycles can have from 1 to 3 nitrogen atoms and at least one carbon atom, and can include other atoms, such as thiazole or oxazole. In addition to imidazole, substituted imidazoles can also be used as catalysts, such as 2-methylimidazole, 4(5)-(hydroxymethyl)imidazole, 4-isopropylimidazole, 4(5)-bromo-5(4)-methyl-imidazole, 2-bromo-1H-imidazole, 1-vinylimidazole and oligomers thereof, or the like or mixtures thereof. Pyrazole and substituted pyrazoles such as 3-cyclopropyl-1H-pyrazole, 5-methyl-1H-pyrazole, 3-(trifluoromethyl) pyrazole, and 1,4,5,6-tetrahydrocyclopenta[c]pyrazole may also be useful catalysts. Unsubstituted or substituted oxazoles such as oxazole-5-methanol, pyrrole and substituted pyrrole, and thiazole and substituted thiazoles such as 2-methyl-1,3-thiazole may also be useful catalysts as isomers of imidazole and pyrazole. The vinyl derivatives can be polymerized to form dimers and larger oligomers or polymers, which would be expected to maintain their catalytic ability. Other derivatives include, for example, bicyclic derivatives, such as purine, which has an aromatic imidazole ring adjoined with a pyrimidine heterocyclic ring. In the reaction mixture, the organic non-ionic catalysts can have a concentration range from about 0.0001M to about 0.1M, in further ranges from 0.00025M to about 0.025M and in other embodiments from about 0.0005M to about 0.02M. A person of ordinary skill in the art will recognize that additional ranges of concentration within the explicit ranges above are contemplated and are within the present disclosure.

To control the as-synthesized nanowire diameters at smaller values, it has been found that addition of a small amount of water to the reaction can reduce the nanowire diameter somewhat without broadening or slightly improving the diameter distribution. The water can be added prior to the addition of the silver nitrate. Generally, deionized water can be used although various available grades of purified water can be suitable. In some embodiments, the reaction solution can comprise from about 0.01 to about 5 wt % water, in further embodiments from about 0.025 to about 4 wt %, and in additional embodiments from about 0.05 to about 2 wt % water at the start of reaction. The reaction can be carrier forward in the same way as if there was no water. A person of ordinary skill in the art will recognize that additional ranges of water amounts within the explicit ranges above are contemplated and are within the present disclosure.

The synthesis procedure starts with a stirred reactor of an appropriate size. Generally, the reaction can be successful with a closed system or an open system, but a closed system can be desirable to achieve better reproducibility. For the syntheses described herein, the closed systems are not purged, and the system is open to ambient air through a condenser. A significant portion of the solvent is generally added at the start of the reaction along with the PVP, and heat is introduced to increase the solvent temperature. Heating can be performed, for example, with a heating mantle. Stirring can be initiated using either a mechanical stirrer or a magnetic stirrer. Heating is continued to reach the target temperature. When the reaction vessel reaches the target peak temperature, the heat may or may not be discontinued and the cooling rate can be adjusted in part based on the desired reaction time. The target peak temperature can be at least about 130° C., in further embodiments at least about 135° C., in other embodiments at least about 140° C., and in additional embodiments from about 145° C. to one degree below the solvent boiling point for any of these ranges. A person of ordinary skill in the art will recognize that additional ranges of temperature within the explicit ranges above are contemplated and are within the present disclosure.

Prior to addition of silver nitrate to start the synthesis reaction, the catalysts can be added sequentially or together. In general, the catalysts, salt catalysts and/or neutral catalysts, can be added as solids, liquid salts, solutions, or combinations thereof. The plurality of catalysts can be added sequentially or simultaneously or a combination thereof. Following stirring of the catalysts and at or near the peak target temperature, the soluble silver salt, generally silver nitrate, is added. The silver salt can be added as a solid or glycol solution. Especially if the catalysts and silver salt are added as solids but even in other embodiments, additional glycol, that can be referred to as top off solvent, can be added to reach the total desired volume for the reaction mixture. In some embodiments, from about 2 percent to about 40 percent of the total solvent can be added as top off solvent, which can be added at the same time as, following, or a portion of which at the same time and a portion of which following addition of the catalysts, which can complete the formation of the reaction mixture, although in additional embodiments the full amount of solvent can be added with the dissolved silver salt. Stirring is continued until the reaction is completed. From the start of heating the reactor charged with solvent until completing the reaction can be from about 1 hour (hr) to about 10 hrs, in further embodiments from about 1.75 hrs to about 8 hrs, and in other embodiments from about 1.9 hrs to about 3.5 hrs. A person of ordinary skill in the art will recognize that additional ranges of time within the explicit ranges are contemplated and are within the present disclosure.

Following completion of the reaction, the completed reaction mixture is ready for purification following cooling. Any large structures in the reactor following the synthesis can be removed through filtrations, centrifugation or other appropriate processes. Following any basic purification steps to remove large particles, silver nanowires have generally been further purified through destabilization of the dispersion and collecting the settled nanowires, such as after centrifugation. Destabilization directed to silver nanowire purification can be effectuated through the addition of acetone or similar organic solvent miscible with the glycol but in which the nanowires are less stably dispersible. Following destabilization of the dispersion, centrifugation can be performed to collect the nanowires, while small silver particles may remain dispersed. The process can be repeated to further improve the purification.

Following purification, the yield of the reaction can be evaluated. To determine the yield, the weight of the purified and harvested nanowires is divided by the weight of the silver provided with the soluble silver salt. In the reactions described herein, the yield can be at least about 10%, in further embodiments, at least about 12%, and in other embodiments from about 15% to about 35%. A person of ordinary skill in the art will recognize that additional ranges within the explicit ranges above are contemplated and are within the present disclosure.

It has been found that a noble metal, such as gold or platinum, can be coated over the silver nanowires to improve the stability and chemical inertness of the structures. Effective processes have been developed for performing the coatings to form thin uniform coatings that do not significant alter the optical properties of structures formed with the coated nanowires. The coating of the nanowires is described further in U.S. Pat. No. 9,530,534 to Hu et al., entitled "Transparent Conductive Film," incorporated herein by reference. The nanowires can have a noble metal coating from about 0.05 wt % to about 15 wt % noble metal relative to the entire nanowire weight. A person of ordinary skill in the art will recognize that additional ranges of deposition amounts within the explicit ranges above are contemplated and are within the present disclosure.

In one method of applying the noble metal coating, a method for forming noble metal coated silver nanowires by direct metal deposition comprises gradually adding a coating solution comprising dissolved noble metal ions and a metal ion complexing ligand into a reaction solution comprising silver nanowires and a reducing agent to form the noble metal coating on the silver nanowires. The reaction solution can further comprise a capping polymer, such as PVP (polyvinylpyrrolidone). In an alternative method for applying the noble metal coating, a method for forming noble metal coated silver nanowires by galvanic exchange comprises gradually adding a coating solution comprising a mixture of noble metal ions and complexing ligands to a heated reaction solution comprising a dispersed blend of silver nanowires and a polymer capping agent to gradually replace silver with noble metal to form an intact silver core with a noble metal coating.

Silver Nanowire Characterization

The purified nanowires can be characterized using electron microscopy and the absorption spectrum of a dispersion of the nanowires. Transmission electron micrographs can be used to measure the nanowire diameters. The lengths of the nanowires can be measured using scanning electron micrographs or by using a good quality optical microscope. Based on the magnification, an electron microscope image has an associated scale. Using the scale, the image can be directly used to make measurements of the diameters and lengths.

A randomly selected set of roughly 100 nanowires or more can generally be used, although reasonably accurate results can be obtained with fewer nanowires. For the uniform nanowires described herein, the reported numbers based on 100 or more nanowires are believed accurate roughly to 0.1 nm for diameters based on the measurements. The average diameters for the uniform silver nanowires can be no more than about 20 nm, in other embodiments no more than about 19 nm, in some embodiments no more than about 18 nm, in further embodiments no more than about 17.5 nm, in additional embodiments no more than about 17.0 nm, and in other embodiments from about 12 to about 19.0 nm. With respect to lengths, the silver nanowires can have average lengths from about 5 microns to about 30 microns. An aspect ratio can be specified as the ratio of the average length divided by the average diameter. In some embodiments, the nanowires can have an average aspect ratio of at least about 400 and in further embodiments from about 500 to about 10,000. A person of ordinary skill in the art will recognize that additional ranges of silver nanowire dimensions within the explicit ranges above are contemplated and are within the present disclosure.

With respect to characterizing the nanowire diameter distribution, several methods seem useful. For example, the percent of nanowires with diameters below 18 nm or below 15 nm can be provided. For some applications, it can be desirable to not have too large of a percentage of larger nanowires and this provided further information on the diameter distribution. In some embodiments, the silver nanowires can have at least about 60% with a diameter no more than 18 nm, in further embodiments, at least about 65%, in other embodiments at least about 75% and in additional embodiments at least about 85% of the silver nanowires with a diameter of no more than 18 nm. As noted below, an elimination of most of the nanowires with a diameter above 18 nm can provide for the formation of transparent conductive films with particularly low values of haze and diffusive luminosity (L*). Furthermore, the silver nanowires can have at least about 2% with a diameter of no more than 15 nm, in further embodiments at least about 15%, and in other embodiments at least about 40% of the nanowires have a diameter no more than 15 nm. As noted above, the standard deviation provides significant information regarding the uniformity of the nanowire diameters. The standard deviation (SD) in diameter is calculate as, $SD = (\Sigma (d_n - \underline{d})^2)^{1/2}/(N-1)$, where N is the number of measured diameters, n=1 to N which is summed over as indicated by $\Sigma$, and $\underline{d}$ is the average diameter. In some embodiments, the standard deviation is no more than about 3.5 nm, in further embodiments no more than 3.0 nm, in other embodiments no more than about 2.5 nm and in additional embodiments no more than about 2.0 nm. A person of ordinary skill in the art will recognize that additional ranges of uniformity measures within the explicit ranges above are contemplated and are within the present disclosure.

The nanowires can be dispersed in a suitable solvent for obtaining the absorption spectra, which can be an independent approach to characterize the silver nanowire size and uniformity. Dimethyl sulfoxide (DMSO) is a desirable solvent for measuring the spectrum of the nanowires since silver nanowires are dispersible in the DMSO and since DMSO has low absorption within the region of interested (300 to 500 nm) and DMSO has a relatively high refractive index. DMSO is a commonly used solvent for UV-visible absorption studies, and references to the silver nanowire spectrum will be referenced to spectrum taken in dilute DMSO dispersions. In general, the normalized absorption spectrum should be independent of concentrations for dilute dispersions. Other polar solvents like alcohols and water can also be used, but these solvents have lower refractive indices compared to DMSO. In general, the corresponding spectrum of the silver nanowires in water would be expected to be sharper and slightly blue shifted relative to the spectra in DMSO.

As a general rule, it has been found that thinner silver nanowires exhibit a peak absorption spectrum between 350 nm and 400 nm that shifts to lower wavelengths as the silver nanowires become thinner and more uniform. For spectrum taken in dilute DMSO dispersions, the absorption spectrum can have a peak below 376 nm and in some embodiments below 374 nm. Normalized absorptions can be readily used for evaluating the absorption spectrum to eliminate significant scaling complexities involved with the measurements. As used herein, the spectrum between 300 nm and 800 nm is normalized to have absorbance values between 0 and 1. Similarly, more uniform silver nanowire diameters can exhibit a narrower absorption peak, and this narrower peak can be characterized by the normalized absorption at 410 nm, which is along the higher wavelength decreasing edge of the absorption peak. So a smaller normalized absorption at 410 nm is generally associated with a narrower absorption peak and a correspondingly more uniform silver nanowire diameters. In some embodiments, the normalized absorption at 410 nm can be no more than 0.20 and in further embodiments no more than about 0.185. A person of ordinary skill in the art will recognize that additional ranges of normalized absorption values within the explicit ranges above are contemplated and are within the present disclosure. The results presented herein are generally consistent with this qualitative understanding, but the absorption spectra are not yet fully understood in terms of the silver nanowire distributions.

Sparse Metal Conductive Layers

Sparse metal conductive layers are generally formed from metal nanowires. With sufficient loading and selected nanowire properties, reasonable electrical conductivity can be achieved with the nanowires with corresponding appropriate optical properties. It is expected that transparent conductive film structures formed with the thin, uniform silver nanowires described herein can yield desirable performance for films with various sparse metal conductive structures. However, particularly desirable properties have been achieved with fused metal nanostructured networks. Alternative embodiments can be provided in which fusing components are not included in the process solutions, and satisfactory results can be achieved generally with the unfused films with the thin, uniform silver nanowires contributing to relative improvements in properties. The discussion herein focuses on embodiments involving fused metal nanostructured networks that have been found to provide improved performance properties as transparent conductive films.

Several practical approaches have been developed to accomplish the metal nanowire fusing. The metal loading can be balanced to achieve desirable levels of electrical conductivity with good optical properties. The optical properties for the conductive films can be improved at a particular level of electrical conductivity through the use of the thin, uniform silver nanowires described herein. In general, the metal nanowire processing can be accomplished through deposition of two inks with the first ink comprising the metal nanowires and the second ink comprising a fusing composition, or through the deposition of an ink that combines the fusing elements into the metal nanowire dispersion. The inks may or may not further comprise additional processing aids, binders or the like. Suitable patterning approaches can be selected to be suitable for the particular ink system.

In general, one or more solutions or inks for the formation of the metal nanostructured network can collectively comprise well dispersed metal nanowires, a fusing agent, and optional additional components, for example, a polymer binder, a crosslinking agent, a wetting agent, e.g., a surfactant, a thickener, a dispersant, other optional additives or combinations thereof. The solvent for the metal nanowire ink and/or the fusing solution if distinct from the nanowire ink can comprise an aqueous solvent, an organic solvent or mixtures thereof. In particular, suitable solvents include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, tertiary butyl alcohol, methyl ethyl ketone, glycol ethers, methyl isobutyl ketone, toluene, hexane, ethyl acetate, butyl acetate, ethyl lactate, PGMEA (2-methoxy-1-methylethylacetate), dimethyl carbonate, or mixtures thereof. While the solvent should be selected based on the ability to form a good dispersion of metal nanowires, the solvents should also be compatible with the other selected additives so that the additives are soluble in the solvent. For embodiments in which the fusing agent is included in a single solution with the metal nanowires, the solvent or a component thereof may or may not be a significant component of the fusing solution, such as alcohols and can be selected accordingly if desired.

The metal nanowire ink, in either a one ink or two ink configuration, can include from about 0.01 to about 1 weight percent metal nanowires, in further embodiments from about 0.02 to about 0.75 weight percent metal nanowires and in additional embodiments from about 0.04 to about 0.5 weight percent metal nanowires. A person of ordinary skill in the art will recognize that additional ranges of metal nanowire concentrations within the explicit ranges above are contemplated and are within the present disclosure. The concentration of metal nanowires influences the loading of metal on the substrate surface as well as the physical properties of the ink.

Silver provides excellent electrical conductivity, and commercial silver nanowires are available. However, thin and uniform silver nanowires synthesized using the processes herein provide improved transparent conductive films. The properties of these nanowires are summarized in detail above and in the Examples below.

Polymer binders and the solvents are generally selected consistently such that the polymer binder is soluble or dispersible in the solvent. In appropriate embodiments, the metal nanowire ink generally comprises from about 0.02 to about 5 weight percent binder, in further embodiments from about 0.05 to about 4 weight percent binder and in additional embodiments from about 0.1 to about 2.5 weight percent polymer binder. In some embodiments, the polymer binder comprises a crosslinkable organic polymer, such as a radiation crosslinkable organic polymer and/or a heat curable organic binder. To facilitate the crosslinking of the binder, the metal nanowire ink can comprise in some embodiments from about 0.0005 wt % to about 1 wt % of a crosslinking agent, in further embodiments from about 0.002 wt % to about 0.5 wt % and in additional embodiments from about 0.005 wt % to about 0.25 wt %. The nanowire ink can optionally comprise a rheology modifying agent or combinations thereof. In some embodiments, the ink can comprise a wetting agent or surfactant to lower the surface tension, and a wetting agent can be useful to improve coating properties. The wetting agent generally is soluble in the solvent. In some embodiments, the nanowire ink can comprise from about 0.001 weight percent to about 1 weight percent wetting agent, in further embodiments from about 0.002 to about 0.75 weight percent and in other embodiments from about 0.003 to about 0.6 weight percent wetting agent. A thickener can be used optionally as a rheology modifying agent to stabilize the dispersion and reduce or eliminate settling. In some embodiments, the nanowire ink can comprise optionally from about 0.05 to about 5 weight percent thickener, in further embodiments from about 0.075 to about 4 weight percent and in other embodiments from about 0.1 to about 3 weight percent thickener. A person of ordinary skill in the art will recognize that additional ranges of binder, wetting agent and thickening agent concentrations within the explicit ranges above are contemplated and are within the present disclosure.

A range of polymer binders can be suitable for dissolving/dispersing in a solvent for the metal nanowires, and suitable binders include polymers that have been developed for coating applications. Hard coat polymers, e.g., radiation curable coatings, are commercially available, for example, as hard coat materials for a range of applications, that can be selected for dissolving in aqueous or non-aqueous solvents. Suitable classes of radiation curable polymers and/or heat curable polymers include, for example, polyurethanes, acrylic resins, acrylic copolymers, cellulose ethers and esters, other water insoluble structural polysaccharides, polyethers, polyesters, epoxy containing polymers, and mixtures thereof. Examples of commercial polymer binders include, for example, NEOCRYL® brand acrylic resin (DMS NeoResins), JONCRYL® brand acrylic copolymers (BASF Resins), ELVACITE® brand acrylic resin (Lucite International), SANCURE® brand urethanes (Lubrizol Advanced Materials), cellulose acetate butyrate polymers (CAB brands from Eastman™ Chemical), BAYHYDROL™ brand polyurethane dispersions (Bayer Material Science), UCECOAT® brand polyurethane dispersions (Cytec Industries, Inc.), MOWITOL® brand polyvinyl butyral (Kuraray America, Inc.), cellulose ethers, e.g., ethyl cellulose or hydroxypropyl methyl cellulose, other polysaccharide based polymers such as chitosan and pectin, synthetic polymers like polyvinyl acetate, and the like. In particular, polysaccharide based polymers has been found to be desirable as binders in sparse metal conductive layers. The polymer binders can be self-crosslinking upon exposure to radiation, and/or they can be crosslinked with a photoinitiator or other crosslinking agent. In some embodiments, photocrosslinkers may form radicals upon exposure to radiation, and the radicals then induce crosslinking reactions based on radical polymerization mechanisms. Suitable photoinitiators include, for example, commercially available products, such as IRGACURE® brand (BASF), GENOCURE™ brand (Rahn USA Corp.), and DOUBLECURE® brand (Double Bond Chemical Ind., Co, Ltd.), combinations thereof or the like.

Wetting agents can be used to improve the coatability of the metal nanowire inks as well as the quality of the metal nanowire dispersion. In particular, the wetting agents can lower the surface energy of the ink so that the ink spreads well onto a surface following coating. Wetting agents can be surfactants and/or dispersants. Surfactants are a class of materials that function to lower surface energy, and surfactants can improve solubility of materials. Surfactants generally have a hydrophilic portion of the molecule and a hydrophobic portion of the molecule that contributes to its properties. A wide range of surfactants, such as nonionic surfactants, cationic surfactant, anionic surfactants, zwitterionic surfactants, are commercially available. In some embodiments, if properties associated with surfactants are not an issue, non-surfactant wetting agents, e.g., dispersants, are also known in the art and can be effective to improve the wetting ability of the inks. Suitable commercial wetting agents include, for example, COATOSIL™ brand epoxy functionalized silane oligomers (Momentum Performance Materials), SILWET™ brand organosilicone surfactant (Momentum Performance Materials), THETAWET™ brand short chain non-ionic fluorosurfactants (ICT Industries, Inc.), ZETASPERSE® brand polymeric dispersants (Air Products Inc.), SOLSPERSE® brand polymeric dispersants (Lubrizol), XOANONS WE-D545 surfactant (Anhui Xoanons Chemical Co., Ltd), EFKA™ PU 4009 polymeric dispersant (BASF), MASURF FP-815 CP, MASURF FS-910 (Mason Chemicals), NOVEC™ FC-4430 fluorinated surfactant (3M), mixtures thereof, and the like.

Thickeners can be used to improve the stability of the dispersion by reducing or eliminating settling of the solids from the metal nanowire inks. Thickeners may or may not significantly change the viscosity or other fluid properties of the ink. Suitable thickeners are commercially available and include, for example, CRAYVALLAC™ brand of modified urea such as LA-100 (Cray Valley Acrylics, USA), polyacrylamide, THIXOL™ 53L brand acrylic thickener, COAPUR™ 2025, COAPUR™ 830W, COAPUR™ 6050, COAPUR™ XS71 (Coatex, Inc.), BYK® brand of modified urea (BYK Additives), Acrysol DR 73, Acrysol RM-995, Acrysol RM-8W (Dow Coating Materials), Aquaflow NHS-300, Aquaflow XLS-530 hydrophobically modified polyether thickeners (Ashland Inc.), Borchi Gel L 75 N, Borchi Gel PW25 (OMG Borchers), and the like.

Additional additives can be added to the metal nanowire ink, generally each in an amount of no more than about 5 weight percent, in further embodiments no more than about 2 weight percent and in further embodiments no more than about 1 weight percent. Other additives can include, for example, anti-oxidants, UV stabilizers, defoamers or anti-foaming agents, anti-settling agents, viscosity modifying agents, or the like.

In some embodiments, a process is used in which a sparse nanowire film is initially deposited, and further processing may or may not involve the fusing of the silver nanowires. As noted above, the fusing into a unitary fused metal nanostructured network can provide improved properties of the transparent conductive film. For the deposition of the metal nanowire ink, any reasonable deposition approach can be used, such as dip coating, spray coating, knife edge coating, bar coating, Meyer-rod coating, slot-die coating, gravure printing, spin coating or the like. The ink can have properties, such as viscosity, adjusted appropriately with additives for the desired deposition approach. Similarly, the deposition approach directs the amount of liquid deposited, and the concentration of the ink can be adjusted to provide the desired loading of metal nanowires on the surface. After forming the coating with the dispersion, the sparse metal conductive layer can be dried to remove the liquid.

Fusing of the metal nanowires can be accomplished through various agents. Without wanting to be limited by theory, the fusing agents are believed to mobilize metal ions, and the free energy seems to be lowered in the fusing process. Excessive metal migration or growth may lead in some embodiments to a degeneration of the optical properties, so desirable results can be achieved through a shift in equilibrium in a reasonably controlled way, generally for a short period of time, to generate sufficient fusing to obtain desired electrical conductivity while maintaining desired optical properties. In general, the fusing process can be performed with controlled exposure to a fusing vapor and/or through the use of a fusing agent in solution. Under appropriate conditions, the fused metal conductive network is a unitary structure.

In some embodiments, initiation of the fusing process can be controlled through a partial drying of the solutions to increase concentrations of the components, and quenching of the fusing process can be accomplished, for example, through rinsing or more completing drying of the metal layer. In some embodiments, subsequent processing with the deposition of another ink provides for the fusing of the metal nanowires into a metal nanostructured network, which is electrically conducting. The fusing agent can be incorporated into a single ink along with the metal nanowires. The one ink solution can provide appropriate control of the fusing process. A one ink formulation for forming a unitary fused metal conductive network with the thin, uniform metal nanowires is described in the Examples below.

Sparse metal conductive layers are generally formed on a selected substrate surface. In some embodiments, the substrate is a transparent polymer film. Processing can be adapted for patterning of the film. Suitable polymers for a substrate include, for example, polyethylene terephthalate (PET), polyethylene naphthalate (PEN), polyacrylate, poly (methyl methacrylate), polyolefin, polyvinyl chloride, fluoropolymers, polyamide, polyimide, polysulfone, polysiloxane, polyetheretherketone, polynorbornene, polyester, polystyrene, polyurethane, polyvinyl alcohol, polyvinyl acetate, acrylonitrile-butadiene-styrene copolymer, cyclic olefin polymer, cyclic olefin copolymer (COC), cyclic olefin polymers (COP), polycarbonate, copolymers thereof or blend thereof or the like. Fluoropolymers include, for example, polyvinylfluoride, polyvinylidenefluoride, polytetrafluoroethylene, hexafluoropropylene, perfluoropropylvinylether, perfluoromethylvinylether, polychlorotrifluoroethylene, and the like. Polymer films for some embodiments can have a thickness from about 5 microns to about 5 mm, in further embodiments, from about 10 microns to about 2 mm and in additional embodiment from about 15 microns to about 1 mm. A person of ordinary skill in the art will recognize that additional ranges of thicknesses within the explicit ranges above are contemplated and are within the present disclosure. Substrates can comprise a plurality of layers distinguished by composition and/or other properties. More specific ranges of materials suitable for substrates for transparent conductive films are presented below, and the general substrate ranges would include these specific materials and properties.

The films can be dried, for example, with a heat gun, an oven, a thermal lamp or the like, although the films that can be air dried can be desired in some embodiments. In some embodiments, the films can be heated to temperatures from about 50° C. to about 150° C. during drying. After drying, the films can be washed one or more times, for example, with an alcohol or other solvent or solvent blend, such as ethanol or isopropyl alcohol, to remove excess solids to lower haze. Patterning can be achieved in several convenient ways. For example, printing of the metal nanowires can directly result in patterning. Additionally or alternatively, lithographic techniques and/or ablation methods can be used to remove or appropriately damage portions of the metal nanowires, prior to or after fusing, to form a pattern. One or more overcoat layers can be applied over the sparse metal conductive layer, as described above.

For use of the transparent conductive films formed by the sparse metal conductive layers on the substrate, the films are generally integrated into additional structures. For handling of the transparent conductive films, a protective polymer overcoat is generally placed over the conductive layer. Also, with respect to processing, the polymer overcoats can be applied using solution coating techniques, or other processing approaches such as extrusion, lamination, calendering, melt coating techniques or the like. If there is a plurality of polymer overcoats, they may or may not be applied using similar approaches. For solution processed overcoats, the various coating approaches described above, can be equally applied to these layers. However, the solution processing of a polymer overcoat can be directed to solvents that are not necessarily compatible with forming good dispersions of metal nanowires.

In general, the polymer overcoats can have average thicknesses from about 10 nanometers (nm) to about 12 microns, in further embodiments, from about 15 nm to about 10 microns and in additional embodiments from about 20 nm to about 8 microns. In some embodiments, it may be possible to select an overcoat by choice of the refractive index and thickness such that after application of the overcoat such that the haze is significantly reduced without significantly degrading other properties. Also, the thickness and compositions of the overcoat can be selected such that the sheet resistance measurement through the overcoat is not significantly altered relative to the measurement without the overcoat. A person of ordinary skill in the art will recognize that additional ranges of overcoat thicknesses within the explicit ranges above are contemplated and are within the present disclosure.

Suitable commercial coating compositions for overcoats include, for example, coating solutions from Dexerials Corporation (Japan), POSS® Coatings from Hybrid Plastics, Inc. (Mississippi, USA), silica filled siloxane coatings from California Hardcoating Company (California, USA), CrystalCoat UV-curable coatings from SDC Technologies, Inc. (California, USA). The polymer concentrations and correspondingly the concentrations of other non-volatile agents can be selected to achieve desired rheology of the coating solution, such as an appropriate viscosity for the selected coating process. Solvent can be added or removed to adjust total solid concentrations. Relative amounts of solids can be selected to adjust the composition of the finished coating composition, and the total amounts of solids can be adjusted to achieve a desired thickness of the dried coating. Generally, the coating solution can have a polymer concentration from about 0.025 wt % to about 50 wt %, in further embodiments from about 0.05 wt % to about 25 wt % and in additional embodiments from about 0.075 wt % to about 20 wt %. A person of ordinary skill in the art will recognize that additional ranges of polymer concentrations within the specific ranges above are contemplated and are within the present disclosure. Polymers or composites thereof with different refractive indices can be selected as overcoat materials for desired optical transparency or other properties such as anti-reflection and anti-glare.

The transparent coatings can further comprise optional property modifiers, such as crosslinking agents, wetting agents, viscosity modifiers, property modifying nanoparticles, and/or stabilizers, such as antioxidants and/or UV stabilizers, for transparent conductive films. The inclusion of property modifying nanoparticles, such as nanodiamonds, is described in published U.S. patent application 2016/0096967 to Virkar et al., entitled "Property Enhancing Fillers for Transparent Coatings and Transparent Conductive Films," incorporated herein by reference. The incorporation of stabilizers into overcoats is described in copending U.S. patent application Ser. No. 15/730,053 to Yang et al., entitled "Stabilized Sparse Metal Conductive Films and Solutions for Delivery of Stabilizing Compounds," incorporated herein by reference.

For the deposition of the coating precursor solutions, any reasonable deposition approach can be used, such as dip coating, spray coating, knife edge coating, bar coating, Meyer-rod coating, slot-die coating, gravure printing, spin coating or the like. The deposition approach directs the amount of liquid deposited, and the concentration of the solution can be adjusted to provide the desired thickness of product coating on the surface. After forming the coating with the dispersion, the coating can be dried to remove the liquid and crosslinked appropriately.

For the formation of products, optically clear adhesive layers and thicker protective films covering the sparse metal conductive layer, optionally with an overcoat as described above, can be formed with holes or the like in appropriate locations to provide for electrical connections to the conductive layer. In general, various polymer film processing techniques and equipment can be used to the processing of these polymer sheets, and such equipment and techniques are well developed in the art, and future developed processing techniques and equipment can be correspondingly adapted for the materials herein. The forming of these structures with optically clear adhesive layers and the like are described further in published U.S. patent application 2016/0122562A to Yang et al., entitled "Stabilized Transparent Conductive Elements Based on Sparse Metal Conductive Layers," incorporated herein by reference.

Transparent Conductive Films—CEI Color Properties

In the context of sparse metal conductive layers, the films can be characterized by their color properties in addition to electrical conduction, transmittance and haze, which are discussed in the following section. Color parameters have been defined to correspond to color perception. Measurements can be made to evaluate the color changes attributed to the transparent conductive film. In particular for silver based sparse metal conductive layers, some yellowing can be observed, which generally is targeted to be kept at a low value, and diffuse reflectance intensity ($L^*$) is also desirable to be kept at a low value for low perceptional visibility. The thin, uniform nanowires described herein can achieve excellent low color contributions that further contribute to their desirable nature for transparent conductive films.

Color spaces can be defined to relate spectral wavelengths to human perception of color. CIELAB is a color space determined by the International Commission on Illumination (CIE). The CIELAB color space uses a three-dimensional set of coordinates, L*, a* and b*, where L* relates to the lightness of the color, a* relates to the position of the color between red and green, and b* relates to the position of the color between yellow and blue. The "*" values represent normalized values relative to a standard white point. The a* and b* CIELAB parameters can be determined using commercial software from measurements made in a spectrophotometer based on transmission through a transparent conductive film. While the LAB parameters can be evaluated in either a transmission or reflection configuration, herein a* and b* are evaluated in a transmission configuration, associated with the transparent conductive film, and L* is evaluated in a reflection configuration with a color meter/spectrophotometer, measured using a stacked structure as further described below. The L* measurements reported herein are diffuse reflective values, which exclude the speculative reflections. The spectrophotometer used to make the measurement has an integration sphere that can perform the measurement over the integration sphere excluding the specular reflection.

Films incorporating a sparse metal conductive network can be found to have a yellowish tint, and the lowering of b* can result in a more neutral appearance of the film. The thin, uniform silver nanowires described herein have been found to form highly transparent films with low sheet resistance with relatively low values of b*. Also, it has been found that nanoscale colorants can be introduced into the structures to lower the overall b* values of the structures. The use of nanoscale colorants is described in published U.S. patent application 2016/0108256 to Yang et al., entitled "Transparent Films with Control of Light Hue Using Nanoscale Colorants," incorporated herein by reference.

For some applications, the value of reflective L* is also significant. To measure L*, it is often desirable to make the measurement against a black background in a reflection orientation. L* relates to the lightness of the color, and a value of L* near zero, corresponding to black, can be desirable based on a reflection measurement on a stacked structure with black background. While the color may be close to black, the transmission through the conductive layer is high, so the transparent conductive film just contributes a dark hue to the extent that the color is changed. For certain applications, it can be desirable for the transparent conductive film to contribute little to the reflection of light relative to the black background. As reported in the Examples, values of ΔL* are reported, which are equal to L*(TCF)−L*(base), where the L*(TCF) are values for structures with a transparent conductive film mounted on the substrate with a black background, and L*(base) is that for the corresponding structure without the transparent conductive layer. The measurements are performed in diffusive reflection (or SCE, Specular Contribution Excluded) mode using a Konica-Minolta Spectrophotometer CM-3700A, which is capable of transmission or reflection measurements and has a built in integration sphere, equipped with SpectraMagic NX software, that can provide CIELAB values.

In some embodiments, the transparent conductive films of no more than about 100 ohms/sq in sheet resistance can result in a value of ΔL* of no more than about 2.0, in further embodiments no more than about 1.75, and in additional embodiments no more than about 1.5 when measured in a reflection configuration against a black background. Also, it can be desirable for the absolute value of transmission b* for the transparent conductive film to be no more than 1.0, in further embodiments no more than 0.9 and in additional embodiments no more than a value of 0.75. A person of ordinary skill in the art will recognize that additional ranges of optical parameters and corresponding sheet resistances within the explicit ranges above are contemplated and are within the present disclosure. Values of b* and a* can be evaluated using the equations in the standard CIELAB94 and/or CIE DE2000, Center International Commission on Illumination (Commission Internationale de L'Eclairage), see Colorimetry, 3rd Edition, CIE, 2004, incorporated herein by reference. These calculations can be performed using commercial spectrophotometers and software, such as Konica Minolta Spectrophotometer CM-3700A with SpectraMagic™ NX software.

Transparent Conductive Films—Electrical and Optical Properties

Transparent conductive films incorporating sparse metal conductive layers, e.g., fused metal nanostructured networks, can provide low electrical resistance while providing good optical properties. Thus, the films can be useful as transparent conductive electrodes or the like. The transparent conductive electrodes can be suitable for a range of applications such as electrodes along light receiving surfaces of solar cells. For displays and in particular for touch screens, the films can be patterned to provide electrically conductive patterns formed by the film. The substrate with the transparent conductive film, generally has good optical properties at the respective portions of the pattern.

Electrical resistance of thin films can be expressed as a sheet resistance, which is reported in units of ohms per square (Ω/□ or ohms/sq) to distinguish the values from bulk electrical resistance values according to parameters related to the measurement process. Sheet resistance of films is generally measured using a four point probe measurement or another suitable process. In some embodiments, the fused metal nanowire networks can have a sheet resistance of no more than about 200 ohms/sq, in further embodiments no more than about 150 ohms/sq, in additional embodiments no more than about 100 ohms/sq and in other embodiments no more than about 75 ohms/sq. A person of ordinary skill in the art will recognize that additional ranges of sheet resistance within the explicit ranges above are contemplated and are within the present disclosure. In the Examples, transparent conductive films are formed with target sheet resistances of 70 ohms/sq or 50 ohms/sq. In general, sheet resistance can be reduced by increasing the loading of nanowires, but an increased loading may or may not be desirable from other perspectives.

Depending on the particular application, commercial specifications for sheet resistances for use in a device may not be necessarily directed to lower values of sheet resistance such as when additional cost may be involved, and current commercially relevant values may be for example, 270 ohms/sq, versus 150 ohms/sq, versus 100 ohms/sq, versus 50 ohms/sq, versus 40 ohms/sq, versus 30 ohms/sq or less as target values for different quality and/or size touch screens, and each of these values defines a range between the specific values as end points of the range, such as 270 ohms/sq to 150 ohms/sq, 270 ohms/sq to 100 ohms/sq, 150 ohms/sq to 100 ohms/sq and the like with 15 particular ranges being defined. Thus, lower cost films may be suitable for certain applications in exchange for modestly higher sheet resistance values.

For applications as transparent conductive films, it is desirable for the fused metal nanowire networks or other sparse metal conductive layer to maintain good optical transparency. In principle, optical transparency is inversely related to the metal loading with higher loadings leading to a reduction in transparency, although processing of the network can also significantly affect the transparency. Also, polymer binders and other additives can be selected to maintain good optical transparency. Transparency can be reported in terms of a dimensionless quantity, transmittance. Transmittance is the ratio of the transmitted light intensity (I) to the incident light intensity ($I_o$). Transmittance is reported in the Examples below for the transparent conductive layer on a transparent substrate. The optical transparency of the transparent conductive layer can be evaluated relative to the transmitted light through the substrate supporting the transparent conductive film. For example, the transparency of the conductive layer described herein can be measured by using a UV-Visible spectrophotometer and measuring the total transmission through the conductive layer and support substrate. Transmittance values are reported for the transparent conductive layers on the transparent film substrates. The transmittance through the conductive layer ($T_{layer}$) can be estimated by dividing the total transmittance (T) measured by the transmittance through the support substrate ($T_{sub}$). ($T=I/I_o$ and $T/T_{sub}=(I/I_o)/(I_{sub}/I_o)=I/I_{sub}=T_{layer}$). Thus, the reported total transmittance can be corrected to remove the transmittance through the substrate to obtain transmittance of a conductive layer, overcoat or other component alone.

While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different. In some embodiments, the film formed by the fused network has a total transmittance (TT %) of at least 80%, in further embodiments at least about 85%, in additional embodiments, at least about 90%, in other embodiments at least about 94% and in some embodiments from about 95% to about 99%. Transmittance of the films can be evaluated using the standard ASTM D1003 ("Standard Test Method for Haze and Luminous Transmittance of Transparent Plastics"), incorporated herein by reference. A person or ordinary skill in the art will recognize that additional ranges of transmittance within the explicit ranges above are contemplated and are within the present disclosure.

The fused metal networks can also have low haze along with high transmission of visible light while having desirably low sheet resistance. Haze can be measured using a haze meter based on ASTM D1003 referenced above, and the haze contribution of the substrate can be removed to provide haze values of the transparent conductive film. Haze as measured based on ASTM D1003 is a transmission based haze, and separate measurements can be made for reflection based haze. Unless explicitly indicated otherwise, haze refers to transmission based haze. In some embodiments, the transparent conductive film can have a haze value of no more than about 0.6%, in further embodiments no more than about 0.5%, in additional embodiments no more than about 0.4% and in other embodiments from about 0.35% to about 0.15%. It has been found that selected transparent overcoats can significantly reduce the haze from the structure with the transparent conductive layer, and the values of the structure with the overcoat can be considered with respect to these ranges of haze values. Polymer overcoats are discussed above. A person of ordinary skill in the art will recognize that additional ranges of haze within the explicit ranges above are contemplated and are within the present disclosure.

In the Examples below, transparent conductive films are formed with two target sheet resistance values, 70 ohms/sq or 50 ohms/sq, although the actual sheet resistance values are measured. To obtain lower values of sheet resistance, a higher metal loading on the surface can be used, which can correspondingly result in a slight reduction of transmittance along with an increase in haze and b*.

As described in the Examples, with appropriately selected silver nanowires very low values of haze and sheet resistance have been simultaneously achieved. A polymer overcoat can further reduce the haze. The loading can be adjusted to balance the sheet resistance and the haze values with very low haze values possible with still good sheet resistance values. Specifically, haze values of no more than 0.8%, and in further embodiments from about 0.15% to about 0.7%, can be achieved with values of sheet resistance of at least about 60 ohms/sq. Also, haze values of 0.3% to about 0.8%, and in some embodiments from about 0.35% to about 0.7%, can be achieved with sheet resistance values of from about 30 ohms/sq to about 60 ohms/sq. All of these films maintained good optical transparency. A person of ordinary skill in the art will recognize that additional ranges of haze within the explicit ranges above are contemplated and are within the present disclosure.

With respect to the corresponding properties of the multilayered films, the additional components are generally selected to have a small effect on the optical properties, and various coatings and substrates are commercially available for use in transparent elements. Suitable optical coatings, substrates and associated materials are summarized above. Some of the structural material can be electrically insulating, and if thicker insulating layers are used, the film can be patterned to provide locations where gaps or voids through the insulating layers can provide access and electrical contact to the otherwise embedded electrically conductive element.

For the production of sensors or the like, patterning is generally performed as outlined above to generate electrically conductive regions and electrically insulating regions, which are both transparent. Transparent conducting films made from inks comprised of the thin uniform nanowires can also be coated onto one or more sides of a substrate and can be used to fabricate touch sensors. While touch sensors can be composed of two distinct layers of transparent conductive film separated by an optically clear adhesive, it is also possible to create a sensor by depositing (coating) and then patterning the sparse metal layer onto one substrate. A single coating of the sparse metal layer on one side of the substrate can be patterned and processed to define both the sense and ground (or "X"- and "Y"-) on a single layer. Alternatively, the substrate can be coated on both sides of the same substrate, such as with sequential deposition and processing on each side. After patterning to and further processing to incorporate the transparent conductive film(s) into the structure, ultrathin sensors can be fabricated. One major advantage of the transparent conductors made from sparse metal layers compared to indium tin oxide (or other doped metal oxides) is superior flexibility. By creating the entire sensor on a single substrate, this advantage can be further exploited. The general patterning of a substrate with transparent conductors on both surfaces is described in published U.S. patent application 2015/0116255 to Zhong et al., entitled "Double Sided Touch Sensor on Transparent Substrate," incorporated herein by reference. The processing of silver nanowire based transparent conductive films on opposite sides of a substrate is described in published US patent application 2014/0202742 to Jones et al., entitled "Two-Sided Laser Patterning on Thin Film Substrates," incorporated herein by reference.

EXAMPLES

Example 1—Silver Nanowire Synthesis with Salt Catalysts Including KBr

This example described the synthesis of very thin and highly uniform silver nanowires using improved catalysts combination and processing.

A first synthesis reaction was performed in a closed two liter reactor and four batches were combined from each embodiment for analysis. Initially, about 1.67 L of ethylene glycol was placed in the reactor at room temperature, and heating was started. Before heating was started, polyvinylpyrrolidone (K30, BASF) was added to the EG under continuous stirring, and heating was continued. Once the reactor almost reached the target peak temperature, heating was stopped, and ethylene glycol solutions of the catalysts (KBr and 1-octyl-3-methylimidazolium chloride (OMMCl)) were added to the reactor under continued mixing. After appropriate mixing, a solution of silver nitrate in ethylene glycol was added. Based on the added quantities to the reactor, the concentrations in the reactor are PVP 0.1 wt % to 10 wt %, KBr 0.00002M to 0.002M, OMMCl 0.00002M to 0.002M, $AgNO_3$ 0.0025M to 0.25M. Of course, once the reactants are added and various reactions take place, such as AgCl precipitation and Ag reduction, the concentrations in solution of the various species evolve, such that reference to the quantities as added provides a useful reference point. After silver nitrate is mixed, an additional amount of ethylene glycol was added to reach the desired volume, and stirring was continued until the end of the reaction roughly an hour after the last addition to the reactor.

Following completion of the synthesis, the silver nanowires were purified using repeated acetone precipitation, centrifugation and re-dispersion in water. The purified silver nanowires were removed from dispersion and dried to evaluate yield. Yield is based on the quantity of silver in the purified silver nanowires compared to the total amount of silver added in the form of silver nitrate. For this experiment, the yield was generally about 12-15%.

Figure 2:
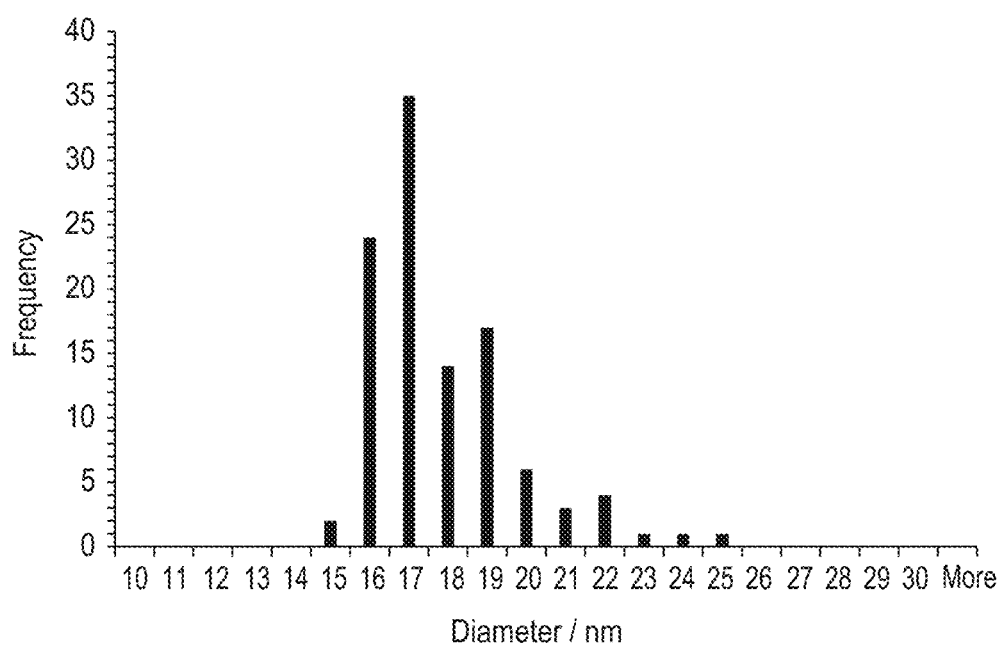
FIG. 2 is a histogram plotting nanowire diameters for the silver nanowires produced using the reaction conditions used to form the nanowires in FIG. 1.

The collected silver nanowires were characterized by transmission electron microscopy (TEM). A representative TEM micrograph is shown in FIG. 1. The wire diameters were measured and averaged for 108 wires. A histogram of the silver nanowire diameters is shown in FIG. 2. The mean diameter was 17.3 nm, with a standard deviation of 1.9 nm, 69% of the nanowires having a diameter of 18 nm or less and 1.8% of the nanowires having a diameter of 15 nm or less. The smallest measured diameter was 14.2 nm.

Figure 3:
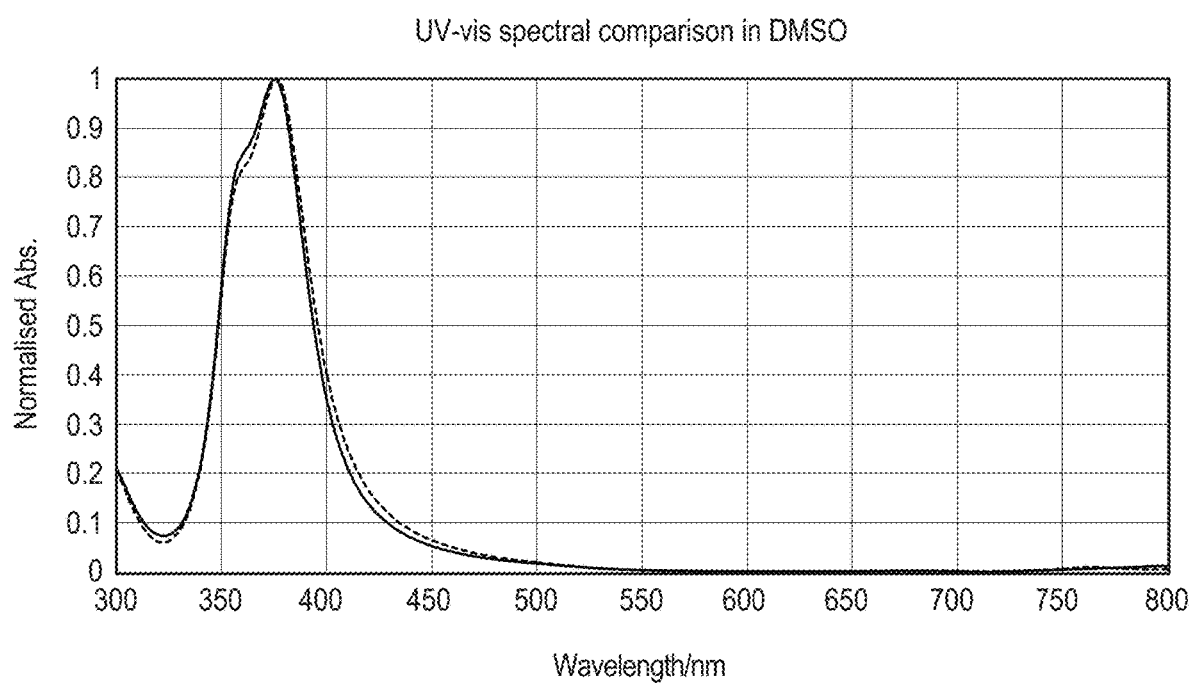
FIG. 3 is a UV-visible absorption spectrum for the nanowires shown in FIG. 1.

A dispersion of the silver nanowires was formed in DMSO, and the absorption spectrum was taken. A representative UV-visible absorption spectrum is shown in FIG. 3 along with an absorption spectrum of a representative control synthesized without the imidazolium chloride salt. The same control absorption spectrum is shown in all of the following absorption spectrum plots. The absorption maximum was at 375.5 nm compared with the control absorption maximum of 376.6 nm, and the normalized absorption at 410 nm was 0.208 compared with the control normalized absorption at 410 nm of 0.246. The reduced absorption at 410 nm is consistent with thinner and less hazy nanowires.

Figure 4:
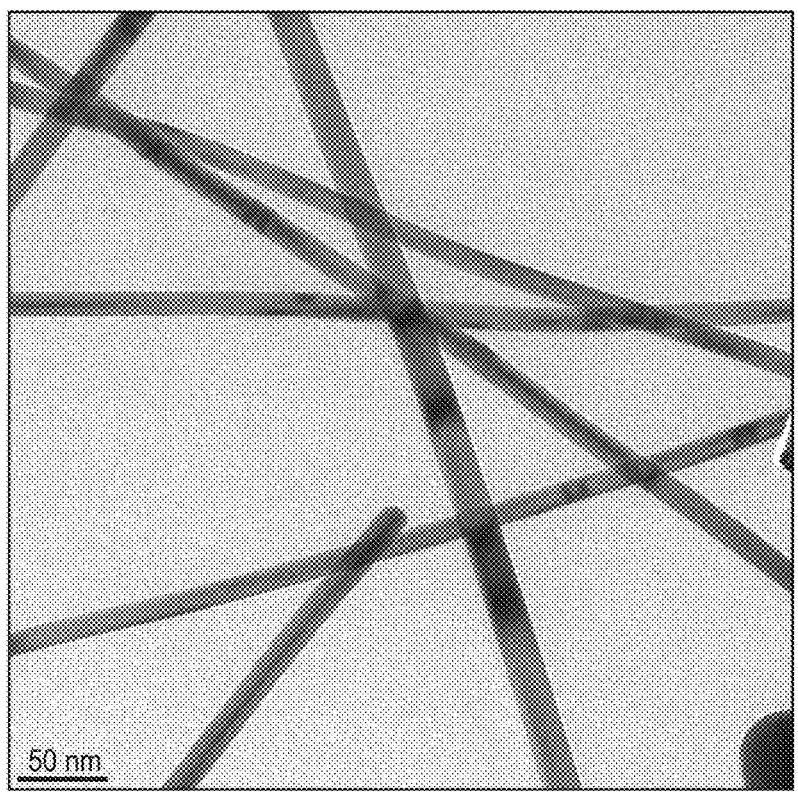
FIG. 4 is a transmission electron micrograph (TEM) of silver nanowires formed using a set of reactants comparable to the reactant used to form the silver nanowires of FIG. 1 except with PVP K90 capping polymer.
Figure 5:
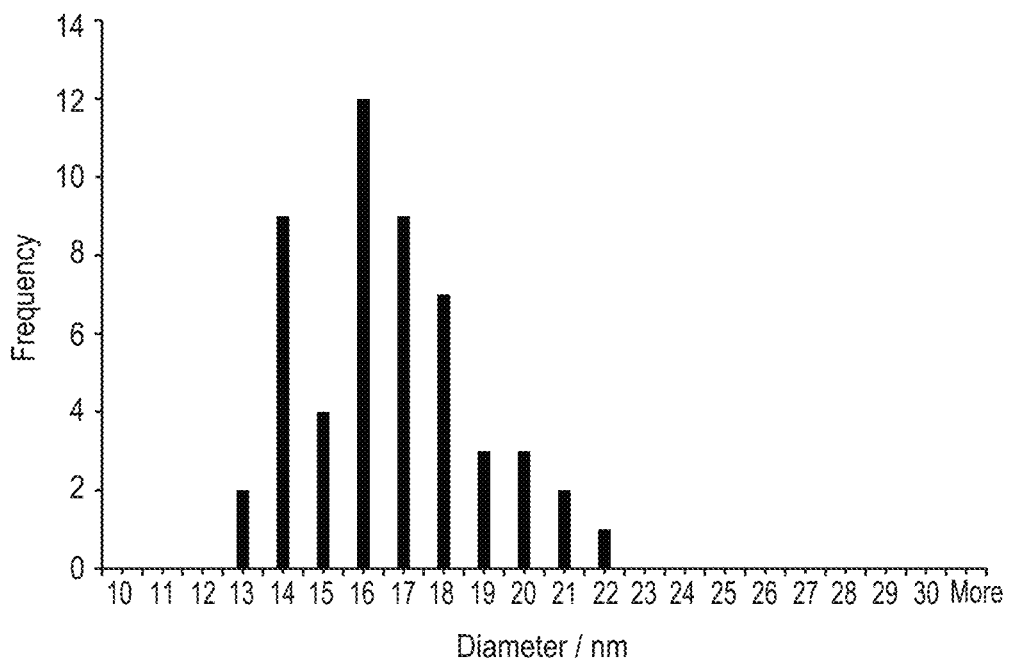
FIG. 5 is a histogram plotting nanowire diameters for the silver nanowires produced using the reaction conditions used to form the nanowires in FIG. 4.

A second synthesis reaction was performed with PVP K90 (BASF) substituted for the PVP K30. The remaining aspects of the synthesis were substantially the same as the first synthesis above. The yield for this reaction was low. A representative electron micrograph for this sample is shown in FIG. 4. The wire diameters were measured and averaged for 52 wires. A histogram of the silver nanowire diameters is shown in FIG. 5. The mean diameter was 16.2 nm, with a standard deviation of 2.1 nm, 82.7% of the nanowires having a diameter of 18 nm or less and 29% of the nanowires having a diameter of 15 nm or less. The smallest measured diameter was 12.7 nm. A third synthesis reaction was performed with PVP K85 (commercial more uniform polymer) substituted for 3% of original PVP K30. The remaining aspects of the synthesis were substantially the same as for the first synthesis above. The yield for this reaction was about 12%.

Figure 6:
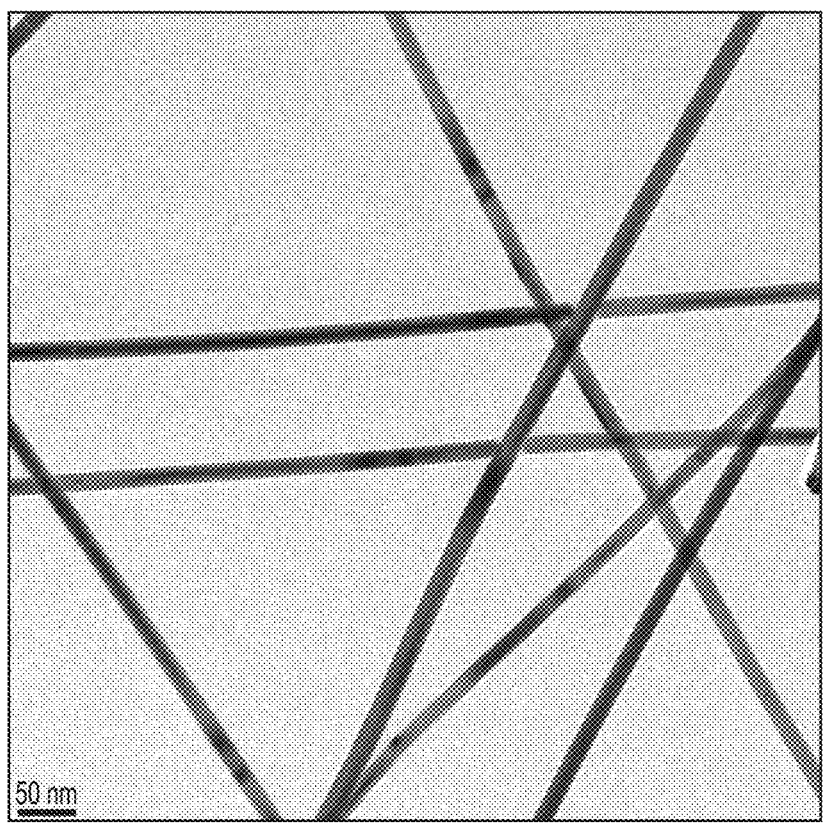
FIG. 6 is a transmission electron micrograph (TEM) of silver nanowires formed using a set of reactants comparable to the reactant used to form the silver nanowires of FIG. 1 except with PVP 85N capping polymer.
Figure 7:
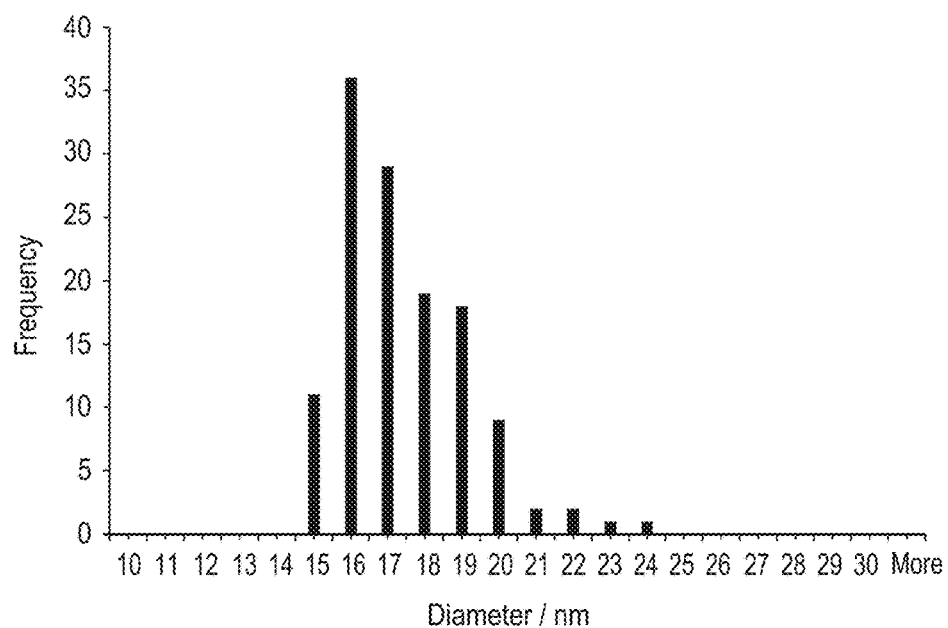
FIG. 7 is a histogram plotting nanowire diameters for the silver nanowires produced using the reaction conditions used to form the nanowires in FIG. 6.
Figure 8:
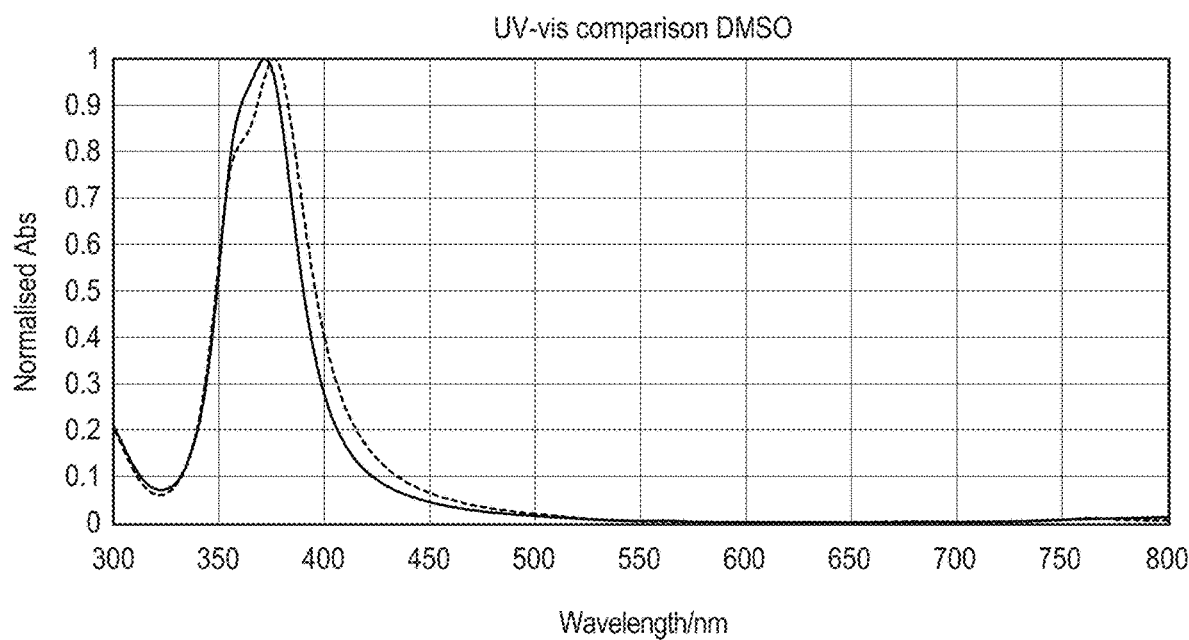
FIG. 8 is a UV-visible absorption spectrum for the nanowires shown in FIG. 6.

A representative TEM micrograph is shown in FIG. 6. The wire diameters were measured and averaged for 128 wires. A histogram of the silver nanowire diameters is shown in FIG. 7. The mean diameter was 16.9 nm, with a standard deviation of 1.7 nm, 74.3% of the nanowires having a diameter of 18 nm or less and 8.6% of the nanowires having a diameter of 15 nm or less. The smallest measured diameter was 14.2 nm. The results obtained with PVP (high molecular weight) K85 was intermediate between the silver nanowire properties from the synthesis with PVP K30 and with PVP K90, except that the standard deviation of the nanowire diameter was smaller for silver nanowires synthesized with PVP K85 (high molecular weight) than for either of the other synthesis results. A representative absorption spectrum is shown in FIG. 8. The absorption maximum was at 372.1 nm and the normalized absorption at 410 nm was 0.166. The narrow peak width and the small absorption at 410 nm is consistent with the high degree of diameter uniformity and thin nanowires.

Example 2—Silver Nanowire Synthesis with Alternative Bromide Salt Catalysts

This example is directed to silver nanowire synthesis using bromide salt catalysts with polyatomic cations.

Figure 9:
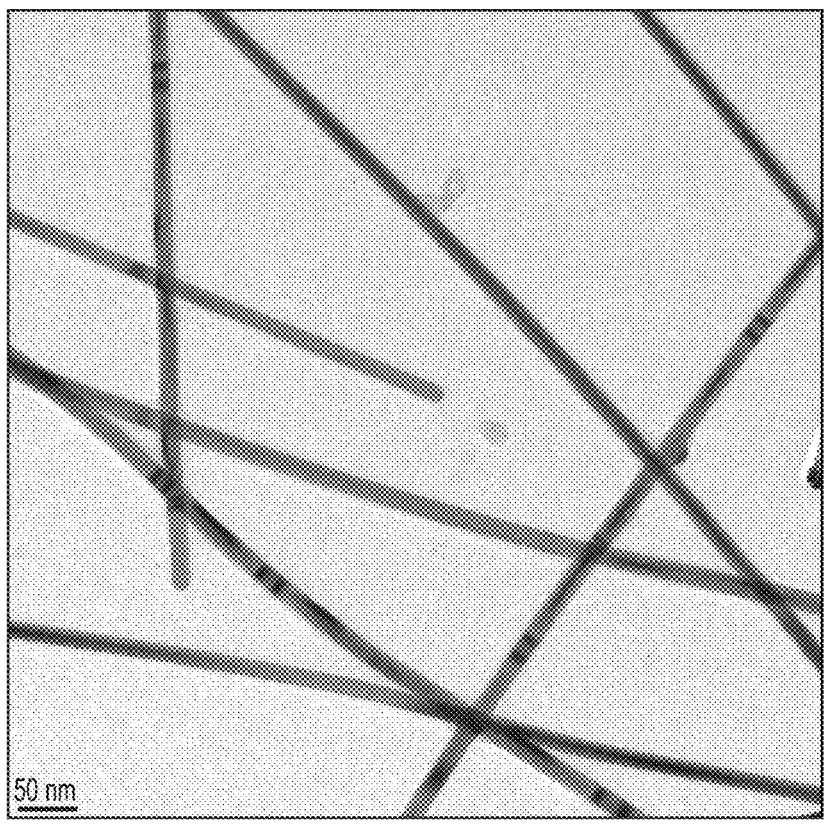
FIG. 9 is a transmission electron micrograph (TEM) of silver nanowires formed using a set of reactants comparable to the reactant used to form the silver nanowires of FIG. 1 except with a first alternative bromide salt.
Figure 10:
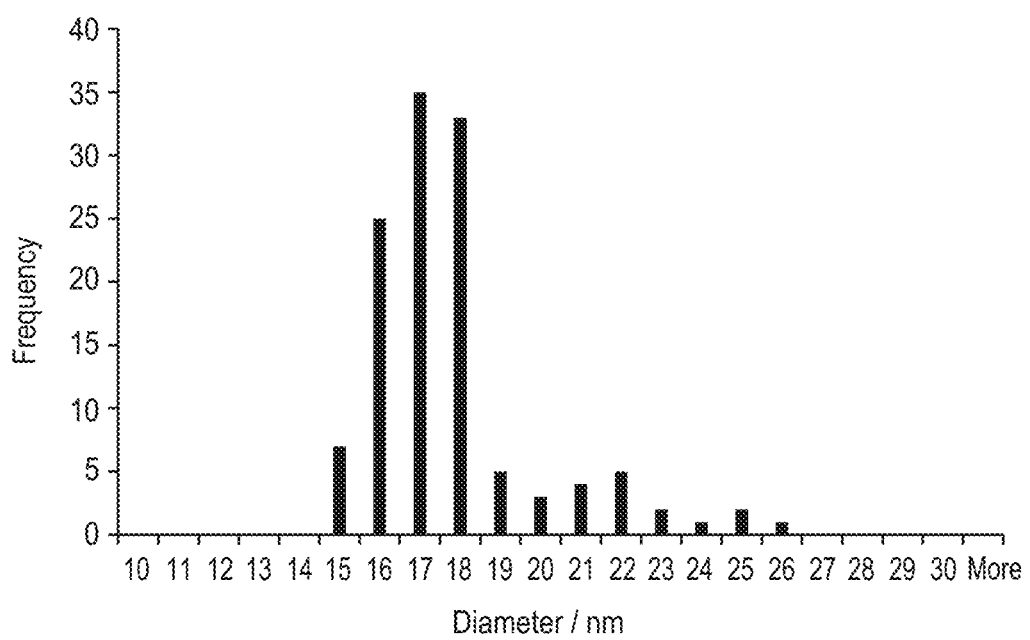
FIG. 10 is a histogram plotting nanowire diameters for the silver nanowires produced using the reaction conditions used to form the nanowires in FIG. 9.
Figure 11:
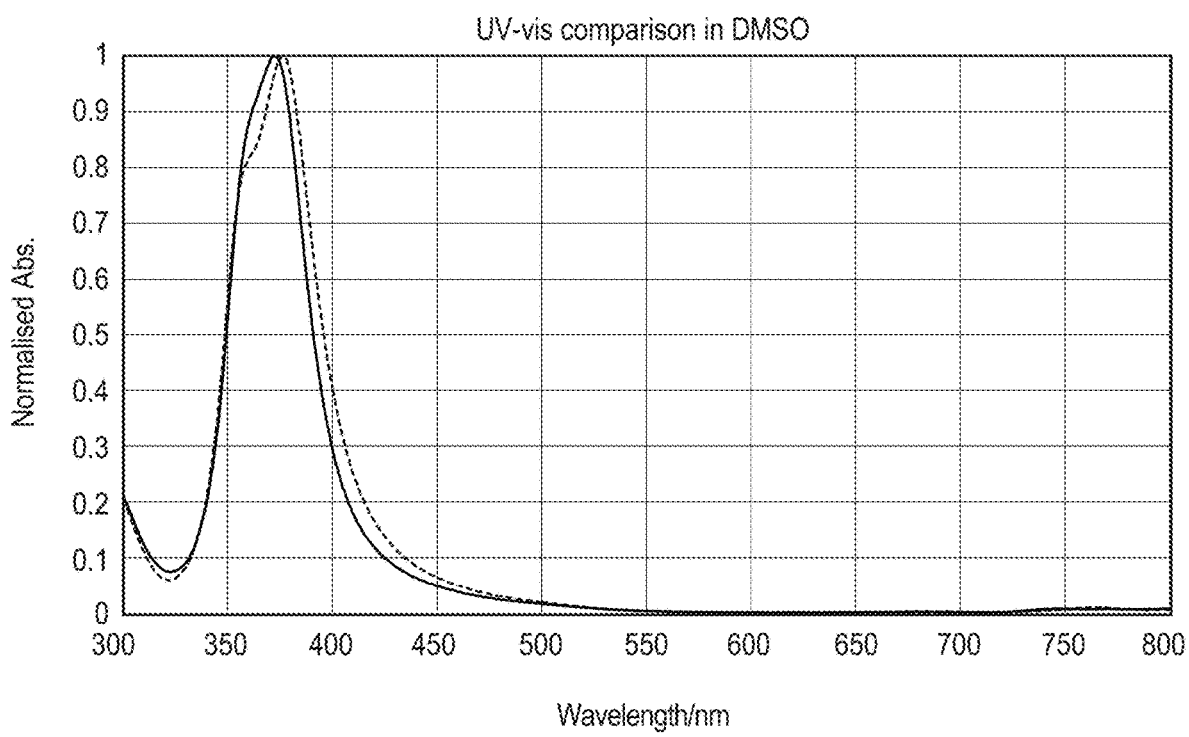
FIG. 11 is a UV-visible absorption spectrum for the nanowires shown in FIG. 9.

A first set of experiments was performed with hexyltrimethyl ammonium bromide ($C_6H_{13}(CH_3)_3NBr$) along with the 1-octyl-3-methylimidazolium chloride catalyst. The remaining aspects of the synthesis were performed as described in Example 1. A representative TEM micrograph is shown in FIG. 9. The wire diameters were measured and averaged for 123 wires. A histogram of the silver nanowire diameters is shown in FIG. 10. The mean diameter was 17.3 nm, with a standard deviation of 2.1 nm, 81.3% of the nanowires having a diameter of 18 nm or less and 5.7% of the nanowires having a diameter of 15 nm or less. The smallest measured diameter was 14.4 nm. A dispersion of the silver nanowires was formed in DMSO, and the absorption spectrum was taken. A representative absorption spectrum is shown in FIG. 11. The absorption maximum was at 372.1 nm and the normalized absorption at 410 nm was 0.176. The small absorption at 410 nm is consistent with the high degree of diameter uniformity.

Figure 12:
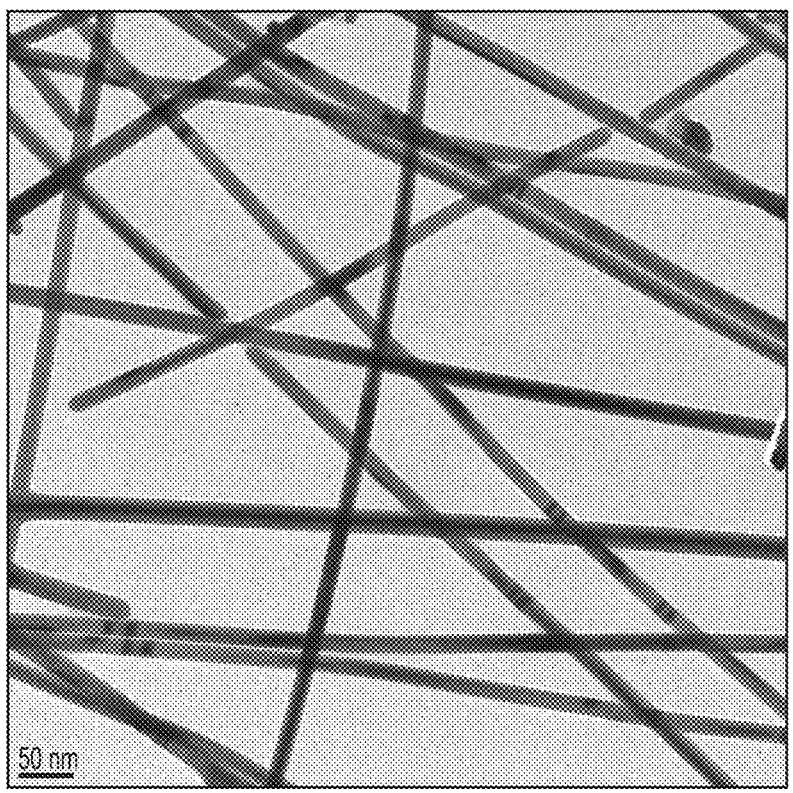
FIG. 12 is a transmission electron micrograph (TEM) of silver nanowires formed using a set of reactants comparable to the reactant used to form the silver nanowires of FIG. 1 except with a second alternative bromide salt.
Figure 13:
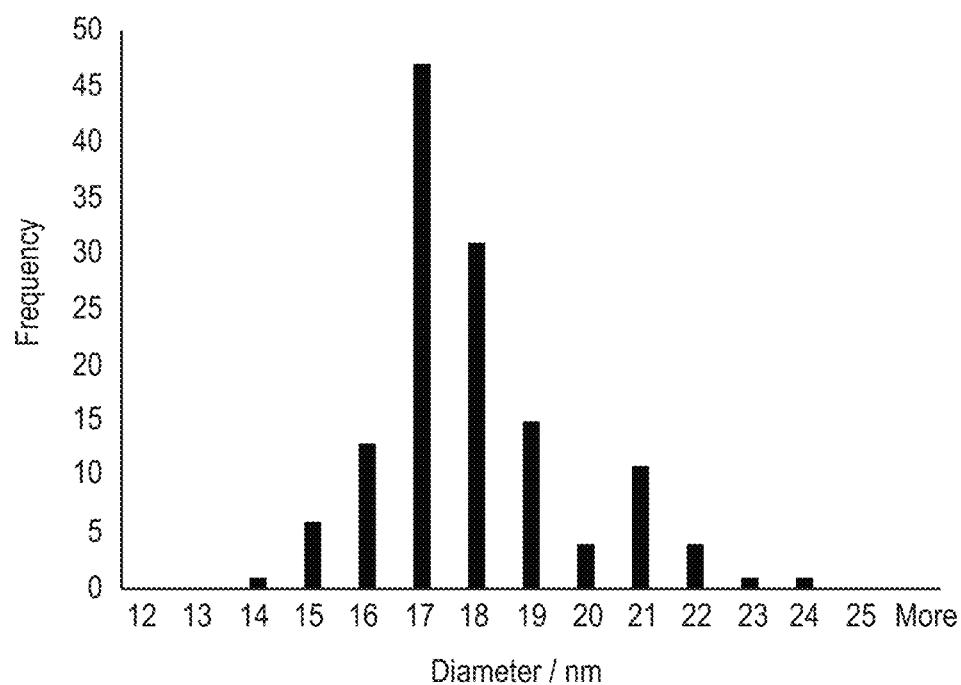
FIG. 13 is a histogram plotting nanowire diameters for the silver nanowires produced using the reaction conditions used to form the nanowires in FIG. 13.

Another sample was synthesized using 1-butyl-3-methylimidazolium bromide substituted for KBr of Example 1. The remaining aspects of the synthesis were performed as described in Example 1. A representative TEM micrograph is shown in FIG. 12. The wire diameters were measured and averaged for 134 wires. A histogram of the silver nanowire diameters is shown in FIG. 13. The mean diameter was 17.4 nm, with a standard deviation of 1.8 nm. The smallest measured diameter was 13.7 nm, while the largest measured diameter was 23.6 nm.

Example 3—Silver Nanowires Synthesized with Imidazole

This example demonstrates the properties of silver nanowires synthesized using an imidazole organic catalyst.

Two samples were formed using imidazole additive along with ammonium chloride and potassium bromide salt catalysts along with a control sample that just used ammonium chloride and potassium bromide without any imidazole additive. The imidazole additive was added at concentrations from about 0.0001M to about 0.05M. Except for the addition of the imidazole, the synthesis reactions were essentially as performed for Example 1. Two different concentrations of imidazole were used in the respective samples, with three times the imidazole used in the second sample relative to the first sample.

Figure 14:
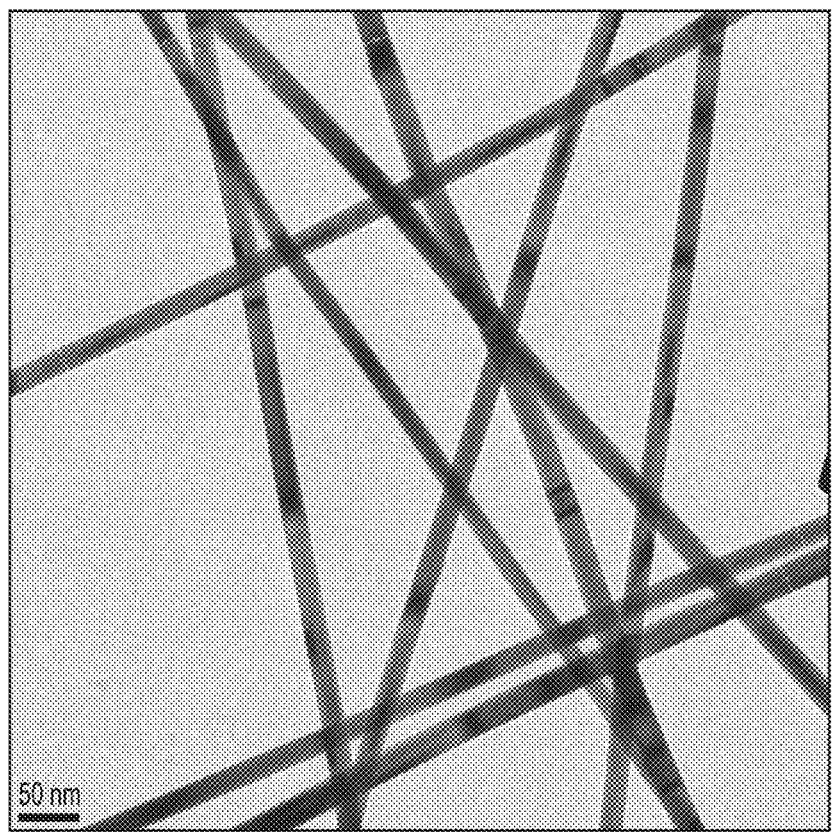
FIG. 14 is a transmission electron micrograph (TEM) of silver nanowires formed using a set of control reactants.
Figure 15:
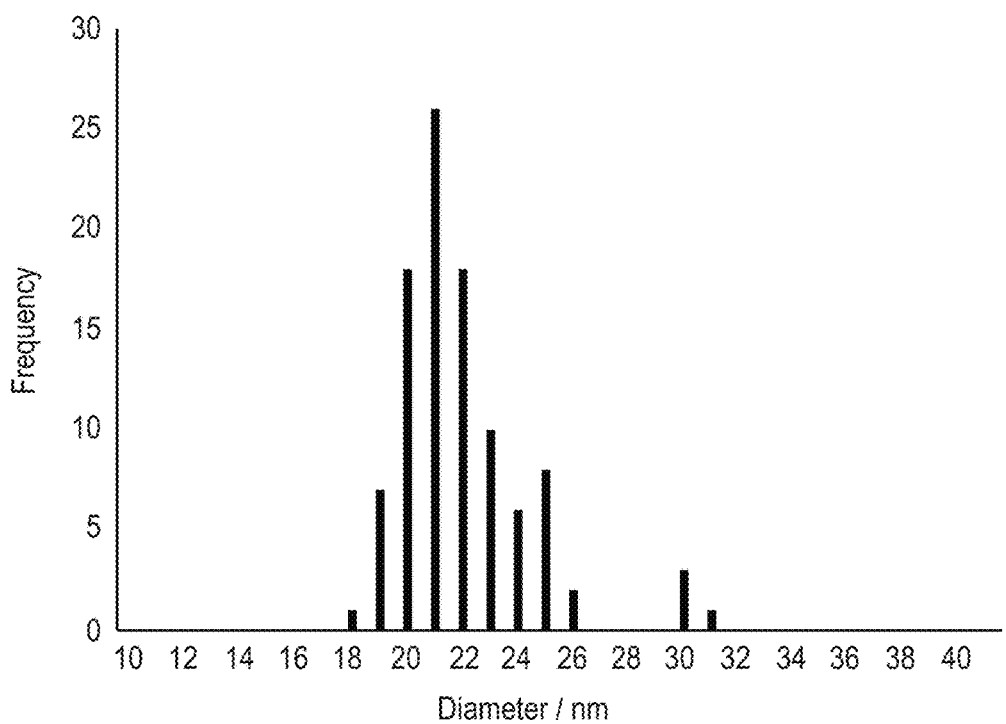
FIG. 15 is a histogram plotting nanowire diameters for the silver nanowires produced using the reaction conditions used to form the nanowires in FIG. 14.

A representative TEM micrograph is shown for the control nanowire sample in FIG. 14. The wire diameters were measured and averaged for 100 wires. A histogram of the silver nanowire diameters is shown in FIG. 15. The mean diameter was 21.5 nm, with a standard deviation of 2.4 nm. The smallest measured diameter was 17.2 nm. A dispersion of the silver nanowires was formed in DMSO, and the absorption spectrum was taken. A representative absorption spectrum is shown in combination with a sample with imidazole, as explained further below. The absorption maximum was at 377.6 nm and the normalized absorption at 410 nm was 0.243.

Figure 16:
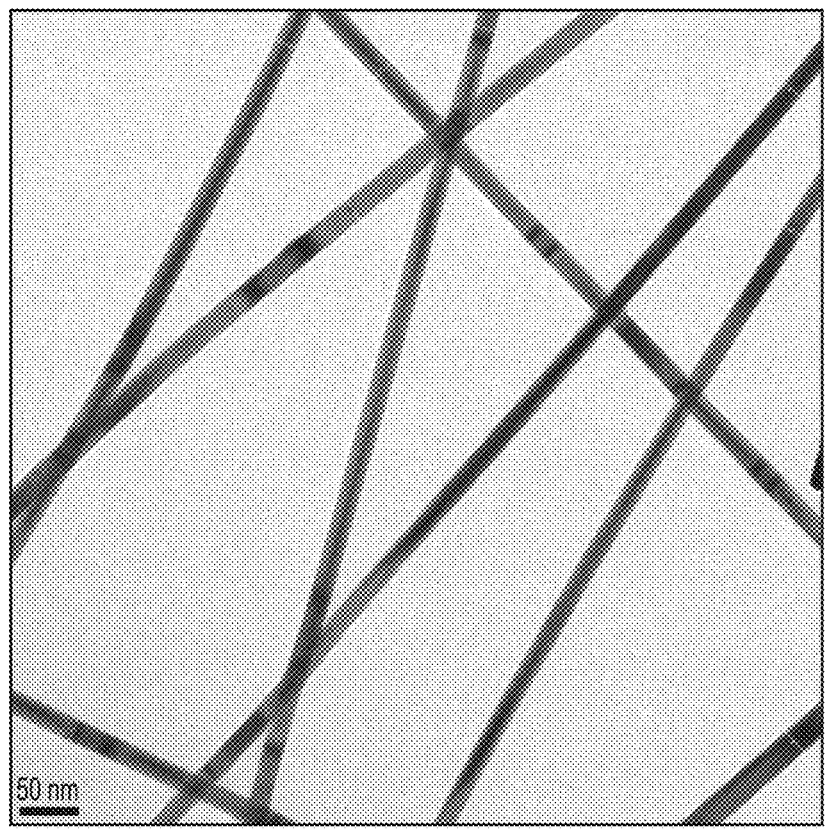
FIG. 16 is a transmission electron micrograph (TEM) of silver nanowires formed using a set of reactants comparable to the control reactants used to form the silver nanowires of FIG. 14 with the addition of imidazole catalyst at a first concentration.
Figure 17:
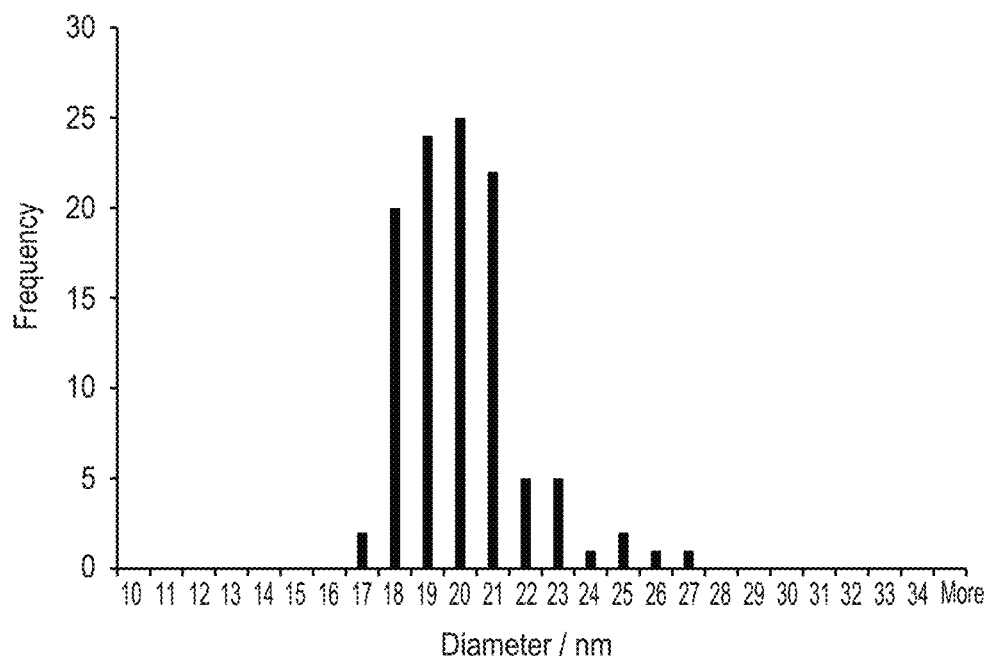
FIG. 17 is a histogram plotting nanowire diameters for the silver nanowires produced using the reaction conditions used to form the nanowires in FIG. 16.
Figure 18:
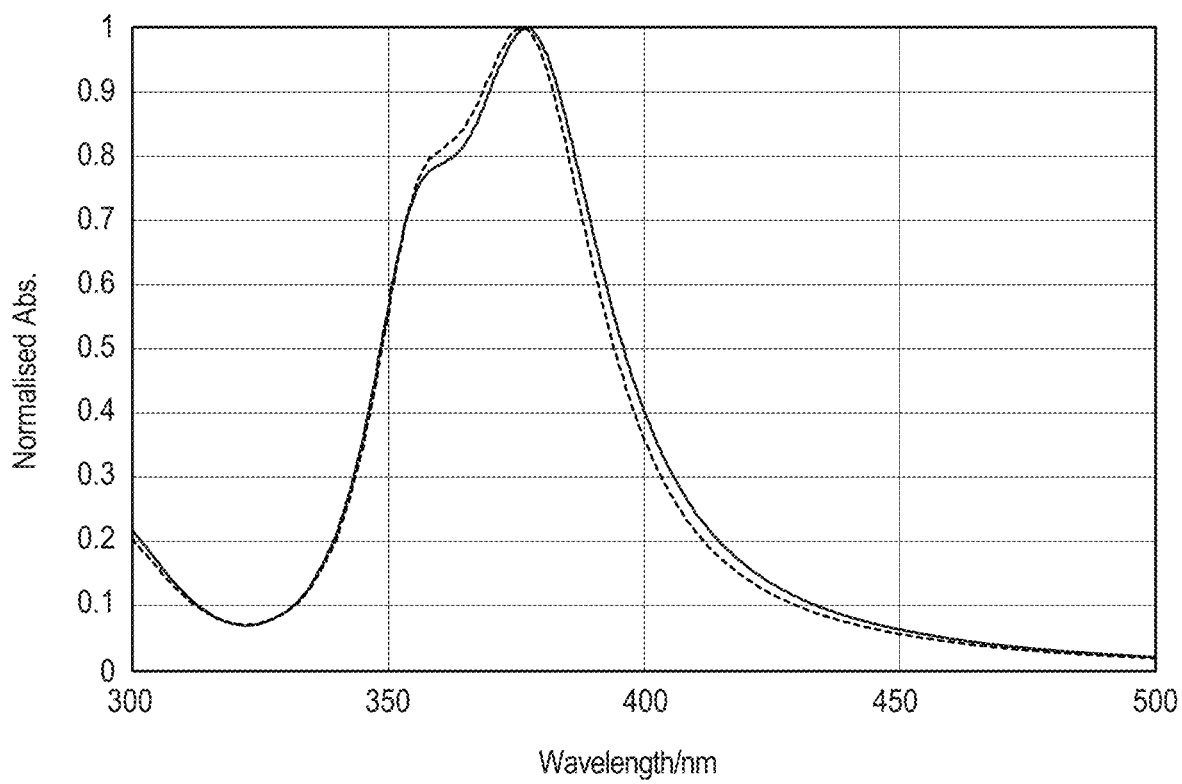
FIG. 18 is a UV-visible absorption spectrum for the nanowires shown in FIG. 16 along with a control spectrum for the silver nanowires shown in FIG. 14.

A representative TEM micrograph of silver nanowires synthesized at the first imidazole concentration is shown in FIG. 16. The wire diameters were measured and averaged for 108 wires. A histogram of the silver nanowire diameters is shown in FIG. 17. The mean diameter was 19.6 nm, with a standard deviation of 1.8 nm, 20% of the nanowires having a diameter of 18 nm or less and 0% of the nanowires having a diameter of 15 nm or less. The smallest measured diameter was 16.8 nm. A dispersion of the silver nanowires was formed in DMSO, and the absorption spectrum was taken. A representative absorption spectrum is shown in FIG. 18 along with the spectrum for the control with no imidazole. The absorption maximum was at 376.0 nm and the normalized absorption at 410 nm was 0.214. The nanowires synthesize with the imidazole had a reduced nanowire diameter and more uniformity as expressed by the standard deviation, UV-visible peak width, the wavelength of absorption maximum, and relative absorption at 410 nm.

Figure 19:
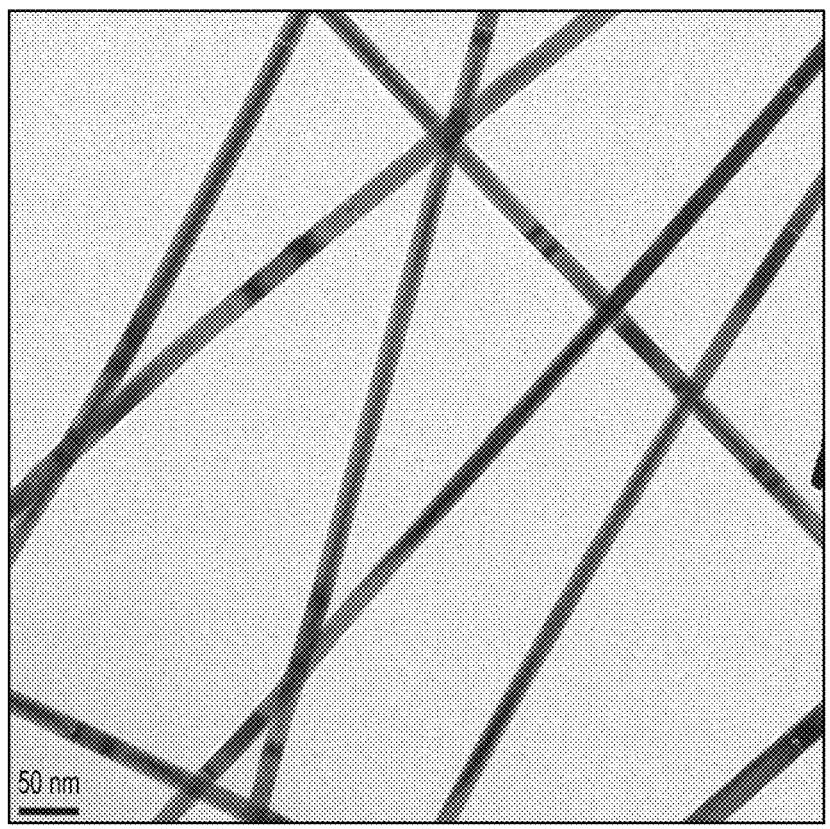
FIG. 19 is a transmission electron micrograph (TEM) of silver nanowires formed using a set of reactants comparable to the control reactants used to form the silver nanowires of FIG. 14 with the addition of imidazole at a second concentration.
Figure 20:
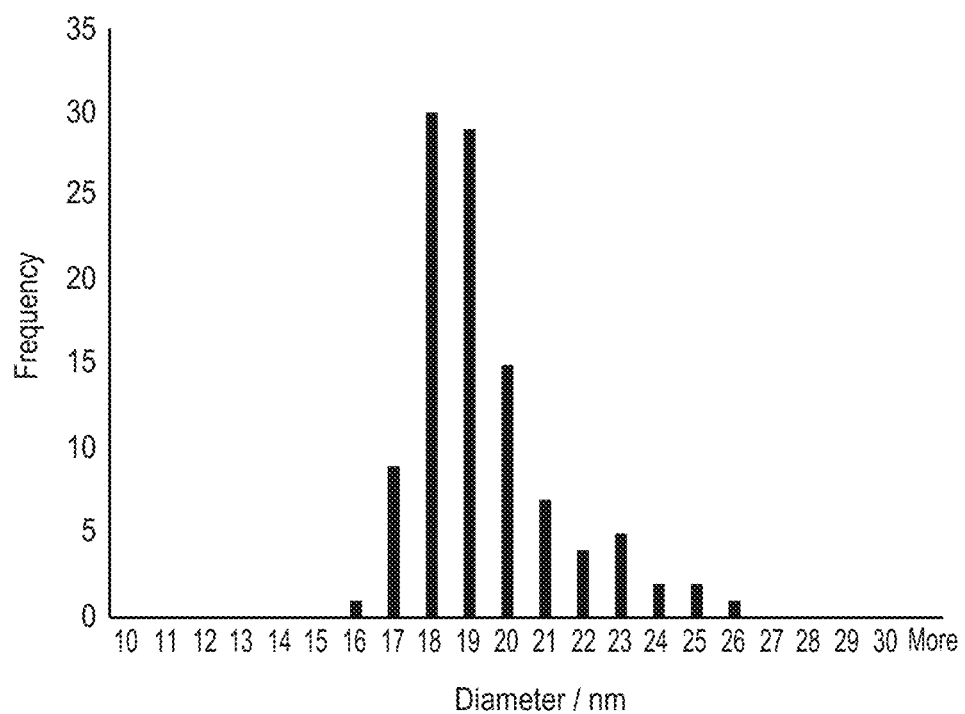
FIG. 20 is a histogram plotting nanowire diameters for the silver nanowires produced using the reaction conditions used to form the nanowires in FIG. 19.
Figure 21:
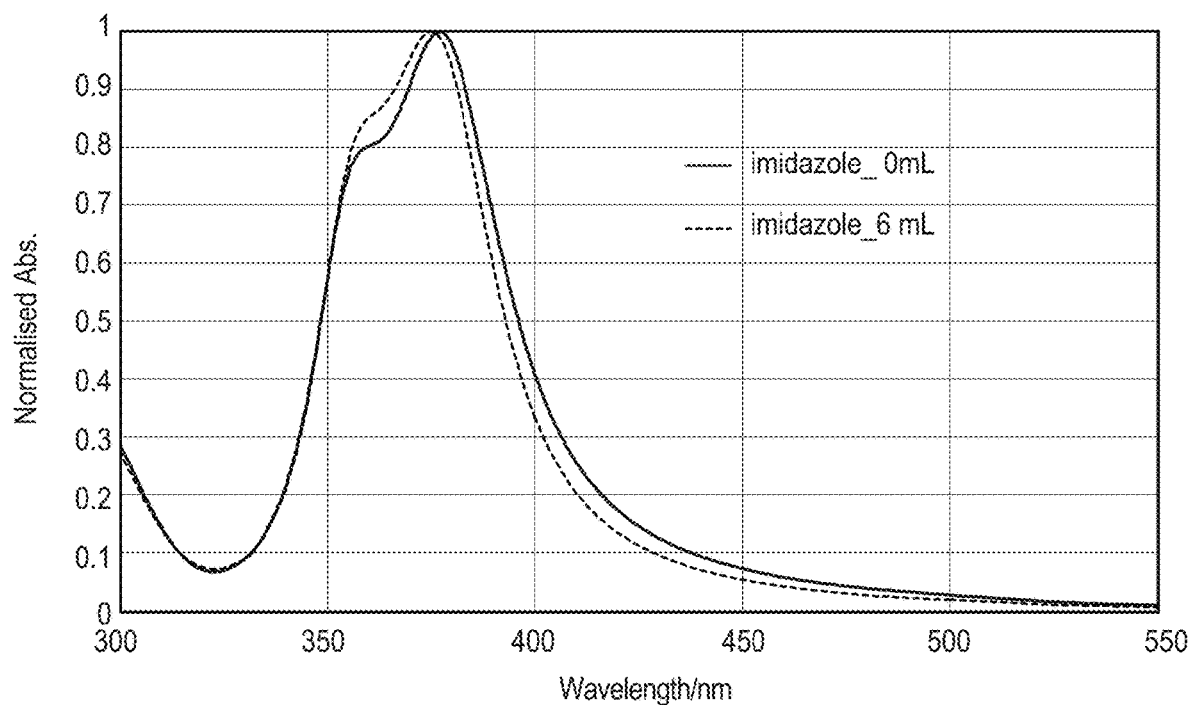
FIG. 21 is a UV-visible absorption spectrum for the nanowires shown in FIG. 19 along with a control spectrum for the silver nanowires shown in FIG. 14.

A representative TEM micrograph of silver nanowires synthesized at the second imidazole concentration is shown in FIG. 19. The wire diameters were measured and averaged for 105 wires. A histogram of the silver nanowire diameters is shown in FIG. 20. The mean diameter was 18.9 nm, with a standard deviation of 2.0 nm, 38% of the nanowires having a diameter of 18 nm or less and 0% of the nanowires having a diameter of 15 nm or less. The smallest measured diameter was 15.5 nm. A dispersion of the silver nanowires was formed in DMSO, and the absorption spectrum was taken. A representative absorption spectrum is shown in FIG. 21 along with the spectrum for the control with no imidazole. The absorption maximum was at 376 nm and the normalized absorption at 410 nm was 0.206. The nanowires synthesize with the greater imidazole concentration had a further reduced nanowire diameter, although the uniformity as expressed by the standard deviation did not further improve.

Figure 22:
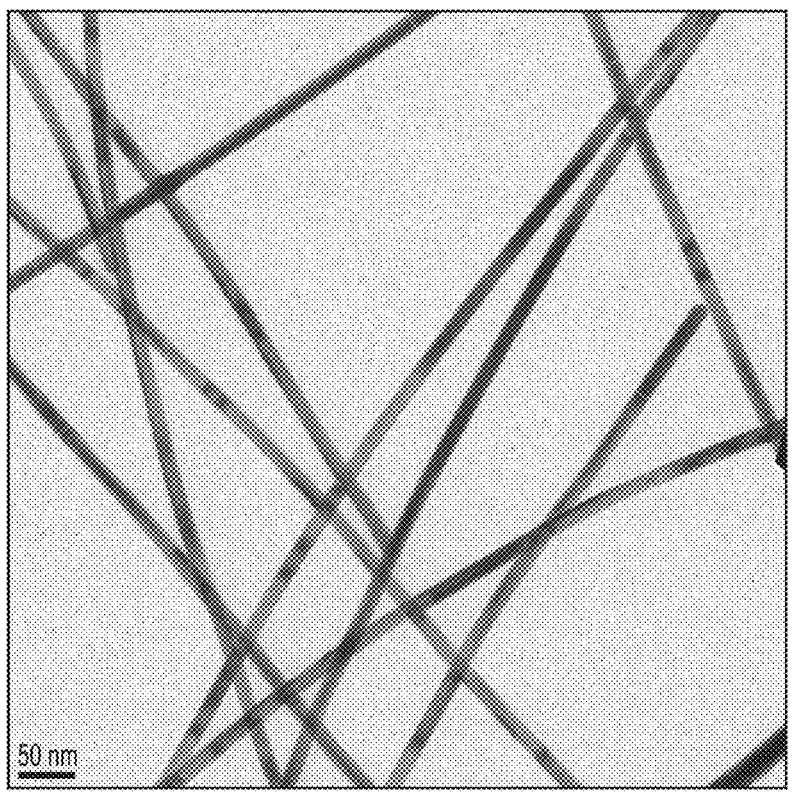
FIG. 22 is a transmission electron micrograph (TEM) of silver nanowires formed using a set of reactants comparable to the reactants used to form the silver nanowires of FIG. 1 with the addition of imidazole at a first concentration.
Figure 23:
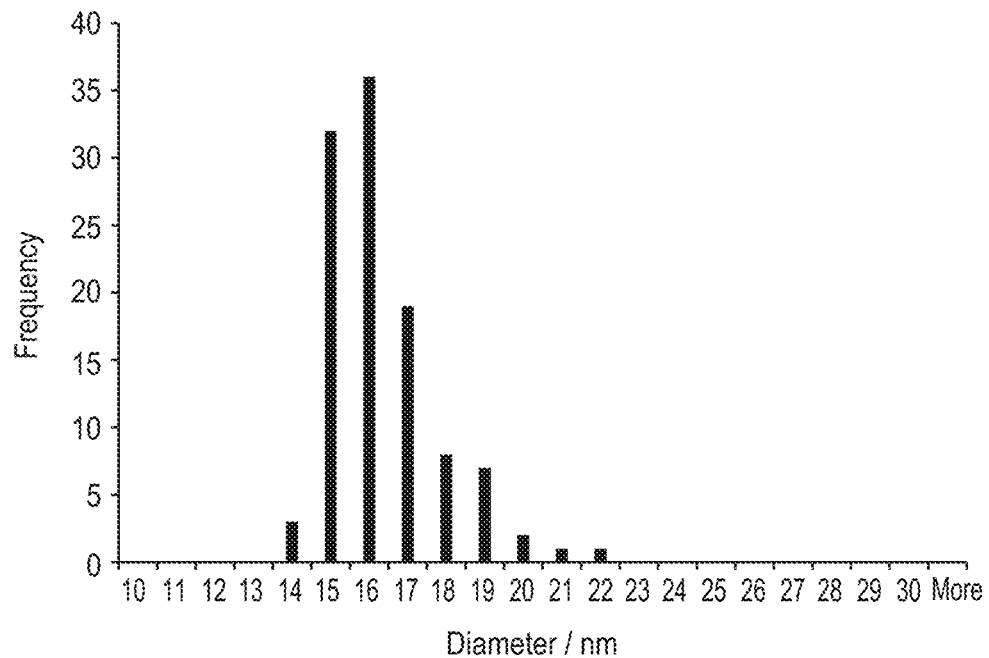
FIG. 23 is a histogram plotting nanowire diameters for the silver nanowires produced using the reaction conditions used to form the nanowires in FIG. 22.
Figure 24:
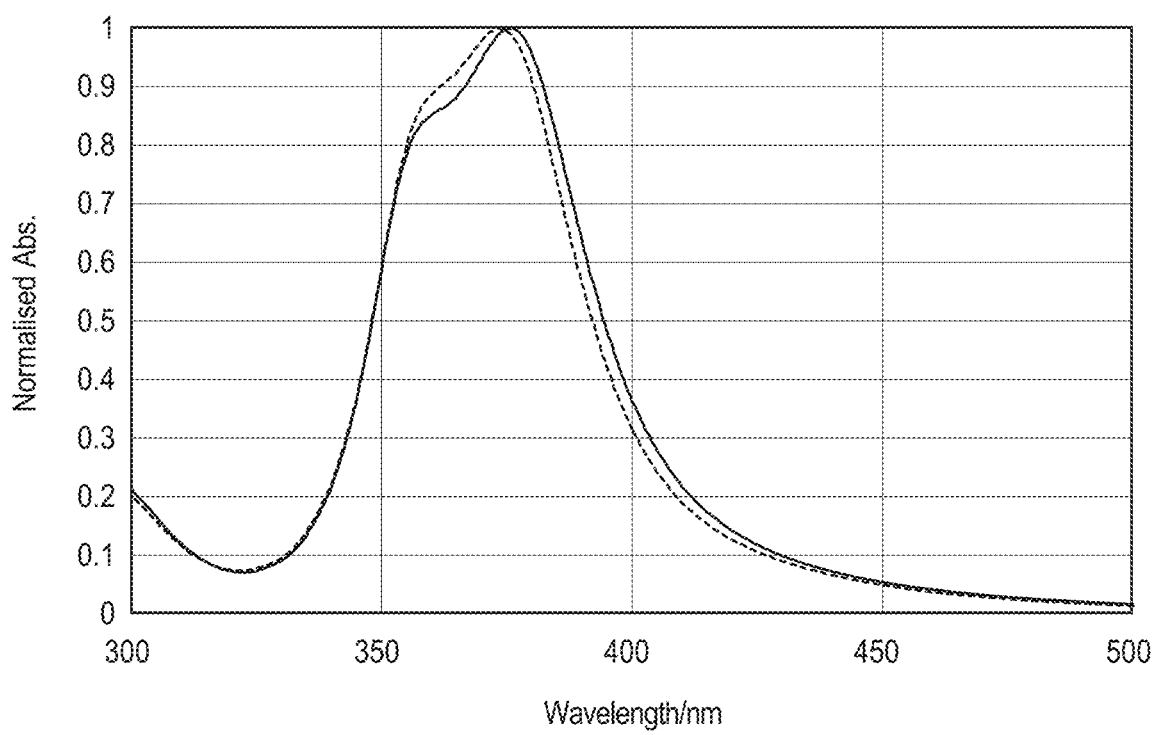
FIG. 24 is a UV-visible absorption spectrum for the nanowires shown in FIG. 22 along with a control spectrum for the silver nanowires comparably formed without the imidazole additive.

Two additional silver nanowire syntheses were performed at two imidazole concentrations with 1-octyl-3-methyl imidazolium chloride and potassium bromide salts. The second imidazole concentration was double the first imidazole concentration. A representative TEM micrograph of the silver nanowires synthesized using the first imidazole concentration is shown in FIG. 22. The wire diameters were measured and averaged for 109 wires. A histogram of the silver nanowire diameters is shown in FIG. 23. The mean diameter was 15.8 nm, with a standard deviation of 1.5 nm, 90% of the nanowires having a diameter of 18 nm or less and 32% of the nanowires having a diameter of 15 nm or less. The smallest measured diameter was 13.3 nm. A dispersion of the silver nanowires was formed in DMSO, and the absorption spectrum was taken. A representative absorption spectrum is shown in FIG. 24 along with the spectrum for the control with no imidazole. The absorption maximum was at 373.5 nm compared with a control absorption maximum of 376.1 nm and the normalized absorption at 410 nm was 0.188 compared with a control 410 nm normalized absorption of 0.216. The nanowires synthesized with the imidazole had a very small and uniform nanowire diameter, based on standard deviation, and the absorption spectrum.

Figure 25:
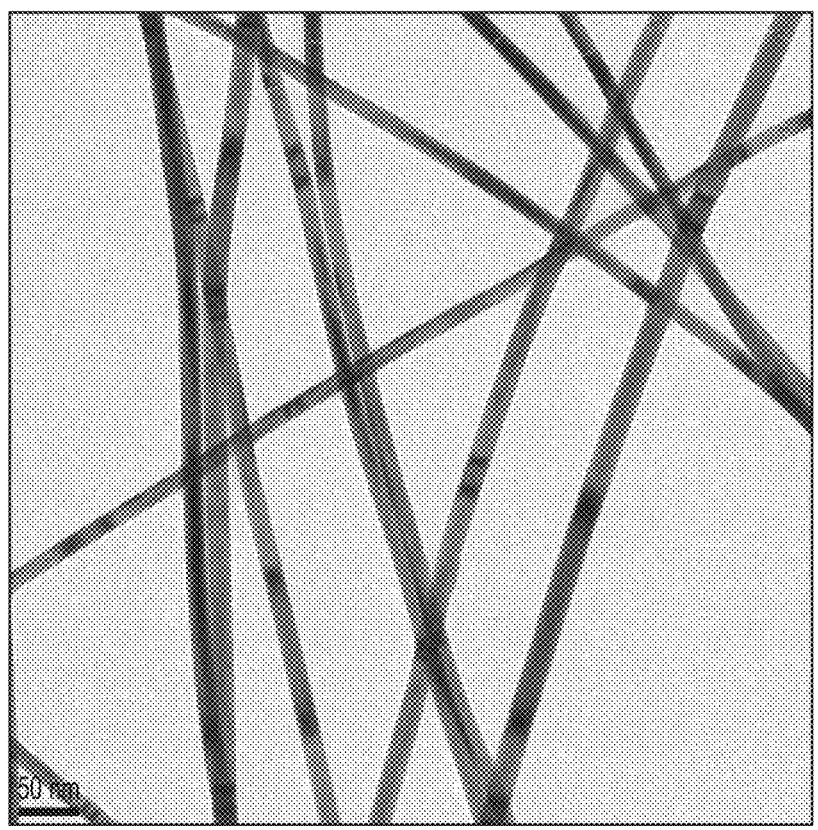
FIG. 25 is a transmission electron micrograph (TEM) of silver nanowires formed using a set of reactants comparable to the reactants used to form the silver nanowires of FIG. 1 with the addition of imidazole at a second concentration.
Figure 26:
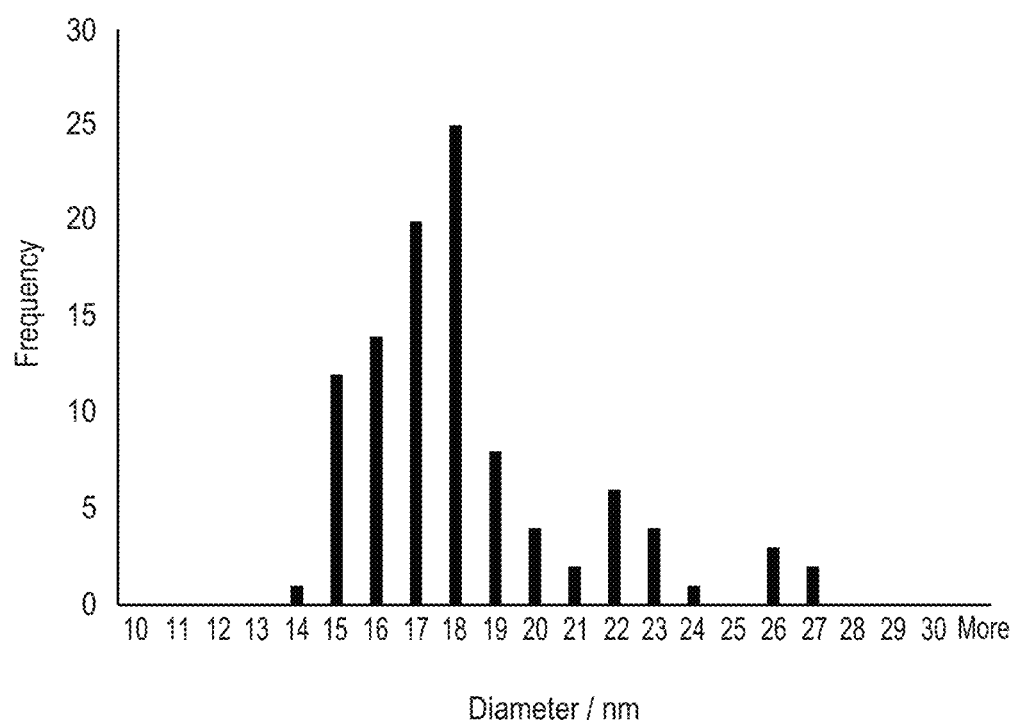
FIG. 26 is a histogram plotting nanowire diameters for the silver nanowires produced using the reaction conditions used to form the nanowires in FIG. 25.
Figure 27:
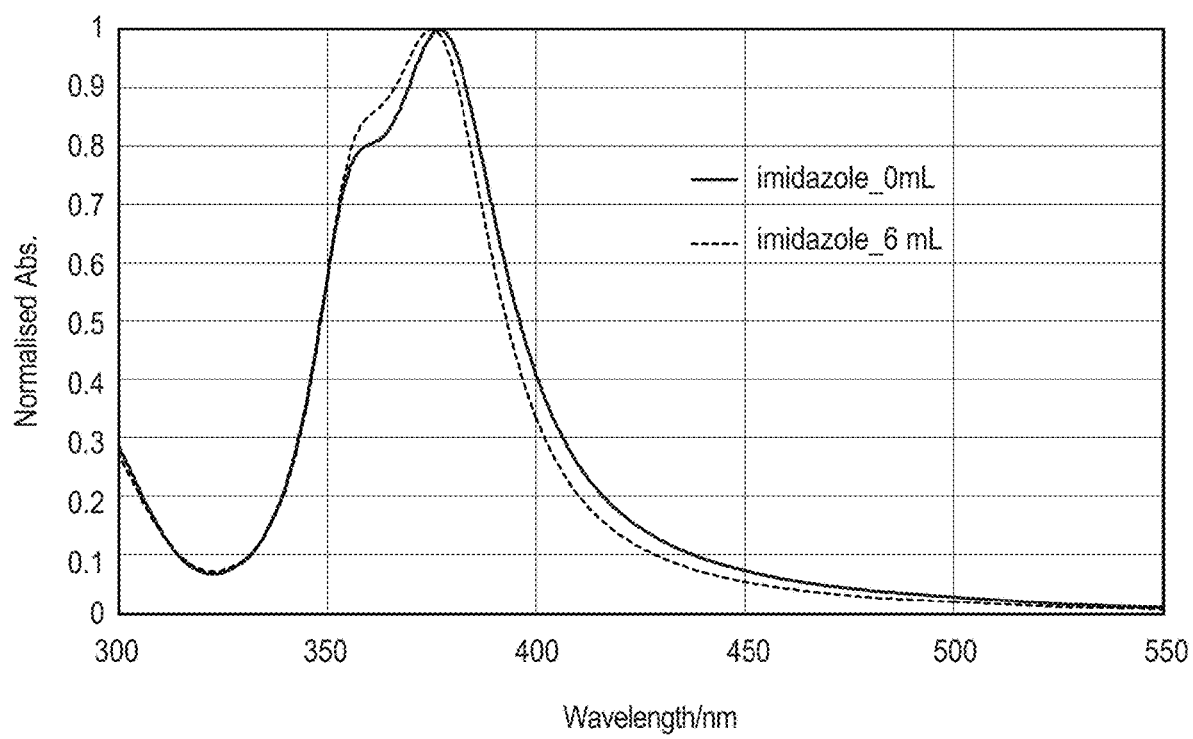
FIG. 27 is a UV-visible absorption spectrum for the nanowires shown in FIG. 25 along with a control spectrum for the silver nanowires without the addition of the imidazole additive.

A representative TEM micrograph of the silver nanowires synthesized using the second imidazole concentration (along with the 1-octyl-3-methyl imidazolium chloride and potassium bromide) is shown in FIG. 25. The wire diameters were measured and averaged for 102 wires. A histogram of the silver nanowire diameters is shown in FIG. 26. The mean diameter was 17.7 nm, with a standard deviation of 2.8 nm, 70.6% of the nanowires having a diameter of 18 nm or less and 12.7% of the nanowires having a diameter of 15 nm or less. The smallest measured diameter was 13.7 nm. A dispersion of the silver nanowires was formed in DMSO, and the absorption spectrum was taken. A representative absorption spectrum is shown in FIG. 27 along with the spectrum for the control with no imidazole. The absorption maximum was at 374.4 nm compared with a control absorption maximum of 376.1 nm and the normalized absorption at 410 nm was 0.178 compared with a control 410 nm normalized absorption of 0.216. The greater imidazole concentration resulted in thicker and less uniform silver nanowires relative to the sample described in the preceding paragraph with a lesser imidazole concentration.

Example 4—Silver Nanowires Synthesized with Pyrazole

This example demonstrates the properties of silver nanowires synthesized using a pyrazole organic catalyst.

Two silver nanowire samples were formed at a scale for a 2 liter reactor using pyrazole additive along with 1-octyl-3-methyl imidazolium chloride and potassium bromide salts. The pyrazole additive was added at concentrations from about 0.0001M to about 0.05M. Except for the addition of the pyrazole, the synthesis reactions were essentially as performed for Example 2. The synthesis was repeated at the same concentration of pyrazole for two samples.

Figure 28:
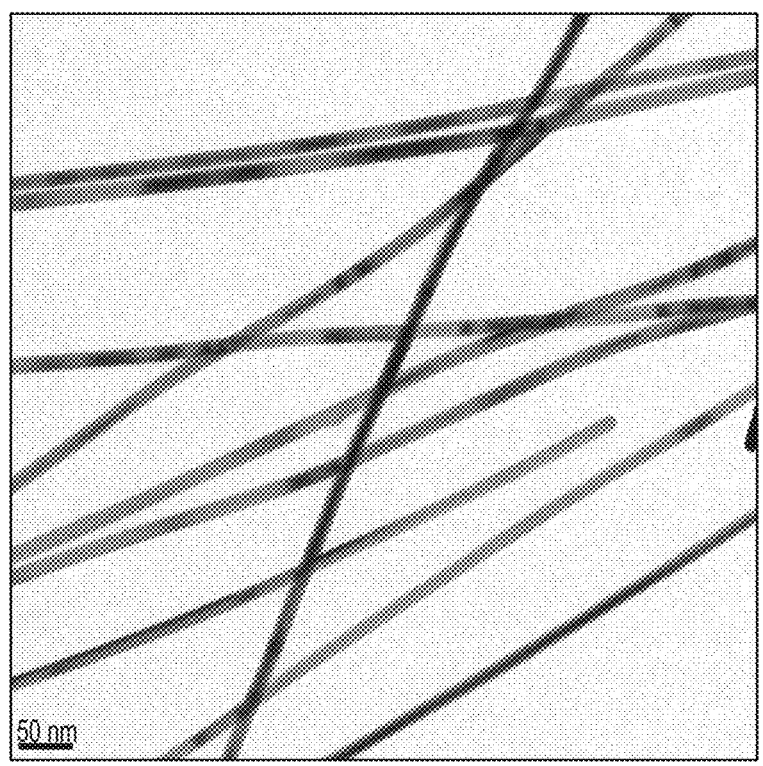
FIG. 28 is a transmission electron micrograph (TEM) of silver nanowires formed using a set of reactants comparable to the reactants used to form the silver nanowires of FIG. 1 with the addition of pyrazole.
Figure 29:
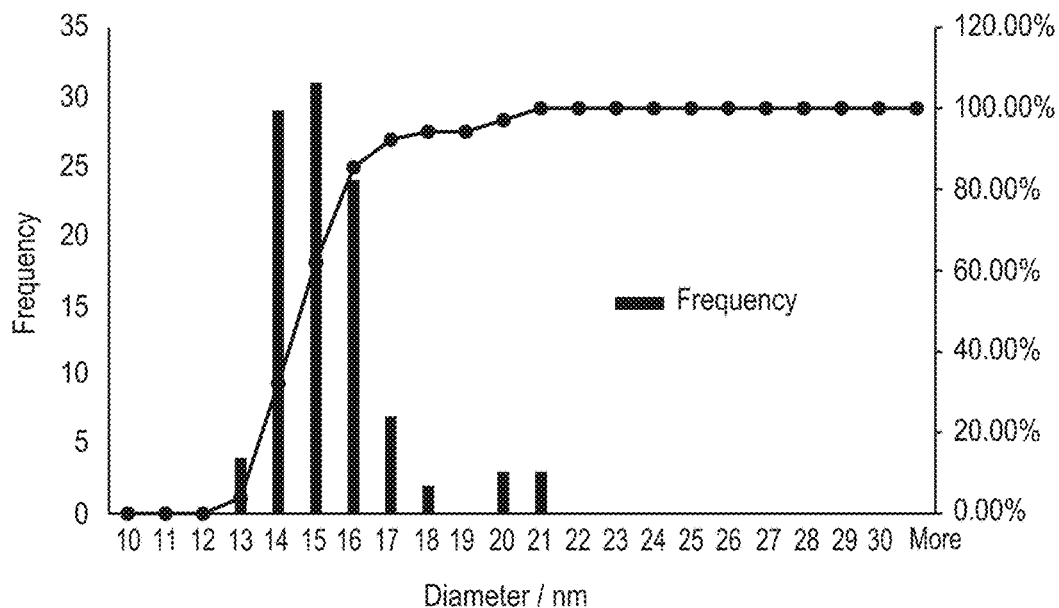
FIG. 29 is a histogram plotting nanowire diameters for the silver nanowires produced using the reaction conditions used to form the nanowires in FIG. 28.
Figure 30:
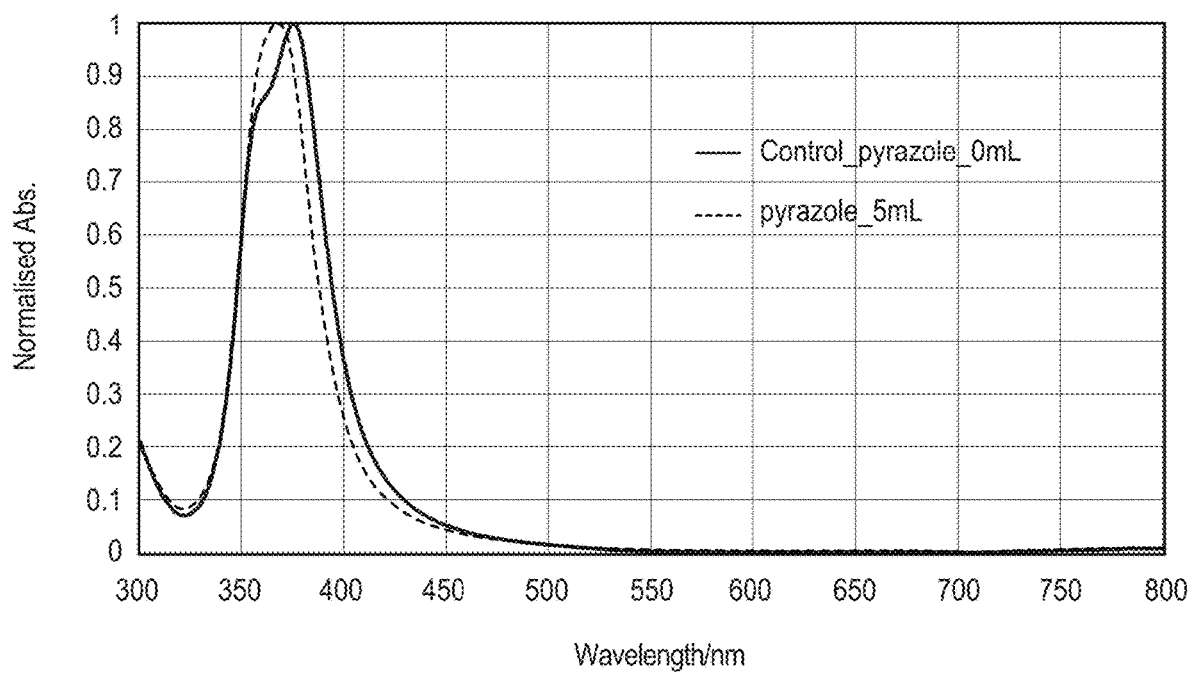
FIG. 30 is a UV-visible absorption spectrum for the nanowires shown in FIG. 28 along with a control spectrum for the silver nanowires without the addition of the imidazole additive.

A representative TEM micrograph of the silver nanowires synthesized using the first pyrazole sample is shown in FIG. 28. The wire diameters were measured and averaged for 103 wires. A histogram of the silver nanowire diameters is shown in FIG. 29. The mean diameter was 14.9 nm, with a standard deviation of 1.65 nm, 94% of the nanowires having a diameter of 18 nm or less and 62% of the nanowires having a diameter of 15 nm or less. The smallest measured diameter was 12.5 nm. A dispersion of the silver nanowires was formed in DMSO, and the absorption spectrum was taken. A representative absorption spectrum is shown in FIG. 30 along with the spectrum for the control with no pyrazole. The absorption maximum was at 368 nm compared with a control absorption maximum of 376.1 nm and the normalized absorption at 410 nm was 0.154 compared with a control 410 nm normalized absorption of 0.216. The nanowires synthesized with the pyrazole had a very small and uniform nanowire diameter with an even smaller average diameter than synthesized with imidazole and a similar standard deviation.

Figure 31:
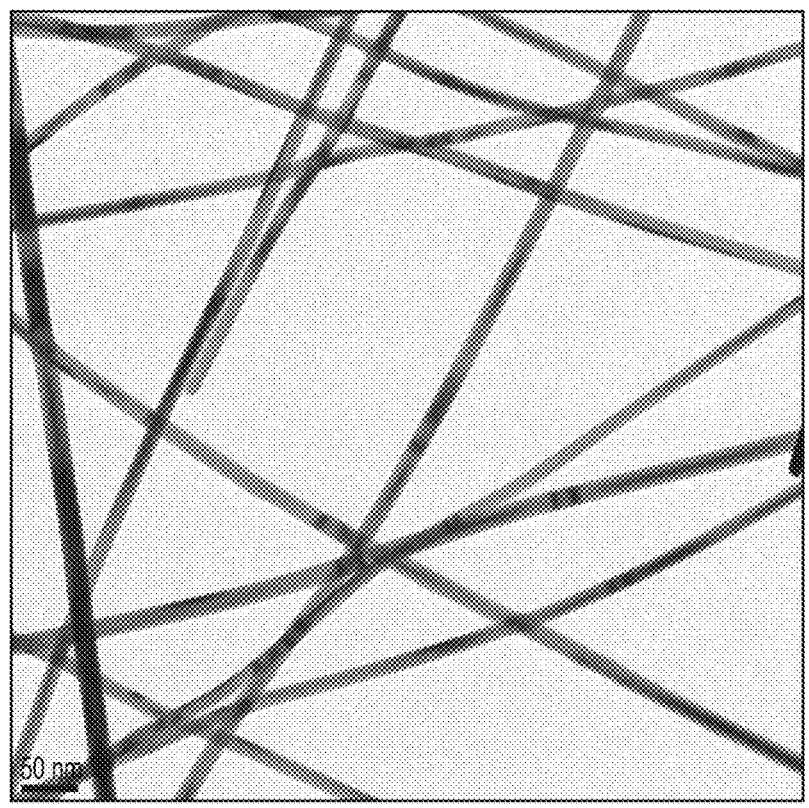
FIG. 31 is a transmission electron micrograph (TEM) of silver nanowires formed using a set of reactants comparable to the reactants used to form the silver nanowires of FIG. 28.
Figure 32:
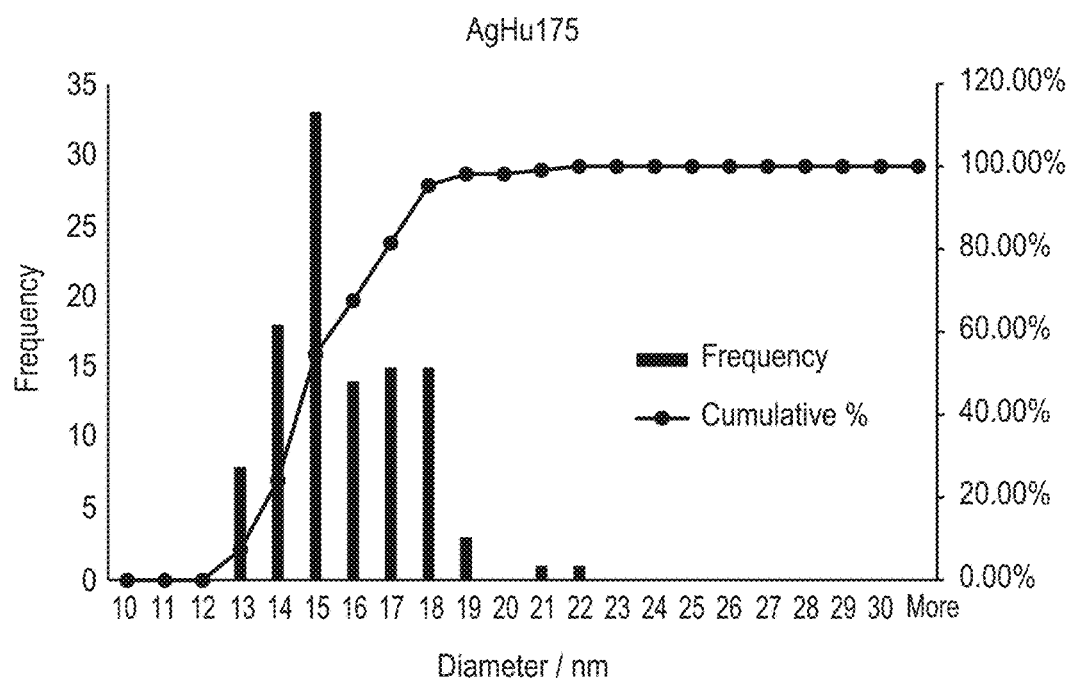
FIG. 32 is a histogram plotting nanowire diameters for the silver nanowires produced using the reaction conditions used to form the nanowires in FIG. 31.
Figure 33:
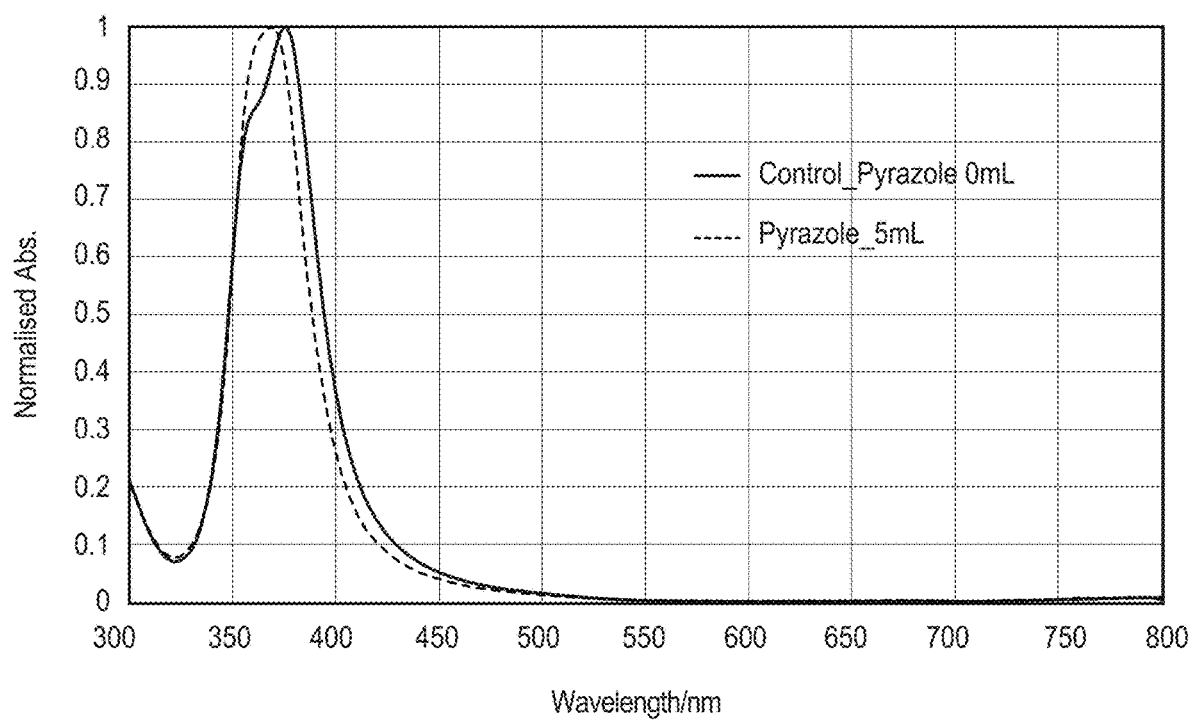
FIG. 33 is a UV-visible absorption spectrum for the nanowires shown in FIG. 31 along with a control spectrum for the silver nanowires without the addition of the imidazole additive.

A representative TEM micrograph of the silver nanowires synthesized in the second run of the selected pyrazole concentration is shown in FIG. 31. The wire diameters were measured and averaged for 90 wires. A histogram of the silver nanowire diameters is shown in FIG. 32. The mean diameter was 15.25 nm, with a standard deviation of 1.73 nm, 95% of the nanowires having a diameter of 18 nm or less and 54% of the nanowires having a diameter of 15 nm or less. The smallest measured diameter was 12.3 nm. A dispersion of the silver nanowires was formed in DMSO, and the absorption spectrum was taken. A representative absorption spectrum is shown in FIG. 33 along with the spectrum for the control with no pyrazole. The absorption maximum was at 370 nm compared with a control absorption maximum of 376.1 nm and the normalized absorption at 410 nm was 0.154 compared with a control 410 nm normalized absorption of 0.216. The nanowires synthesized in the second run with pyrazole had a similar very small and uniform nanowire diameter although with a slightly larger average diameter and standard deviation relative to the silver nanowires synthesized at the first pyrazole run.

Figure 34:
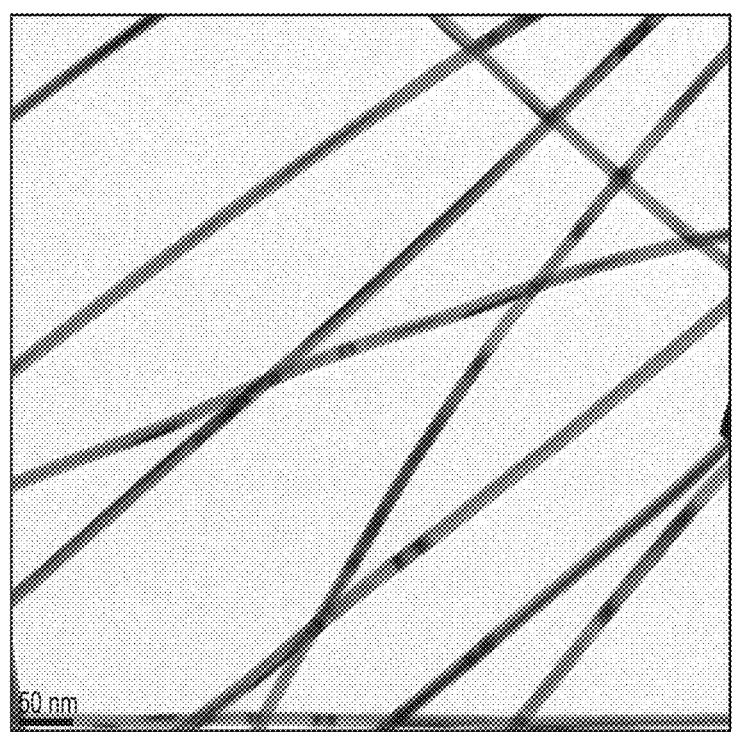
FIG. 34 is a transmission electron micrograph (TEM) of silver nanowires formed using a set of reactants comparable to the reactants used to form the silver nanowires of FIG. 28 with a five times volume scale up.
Figure 35:
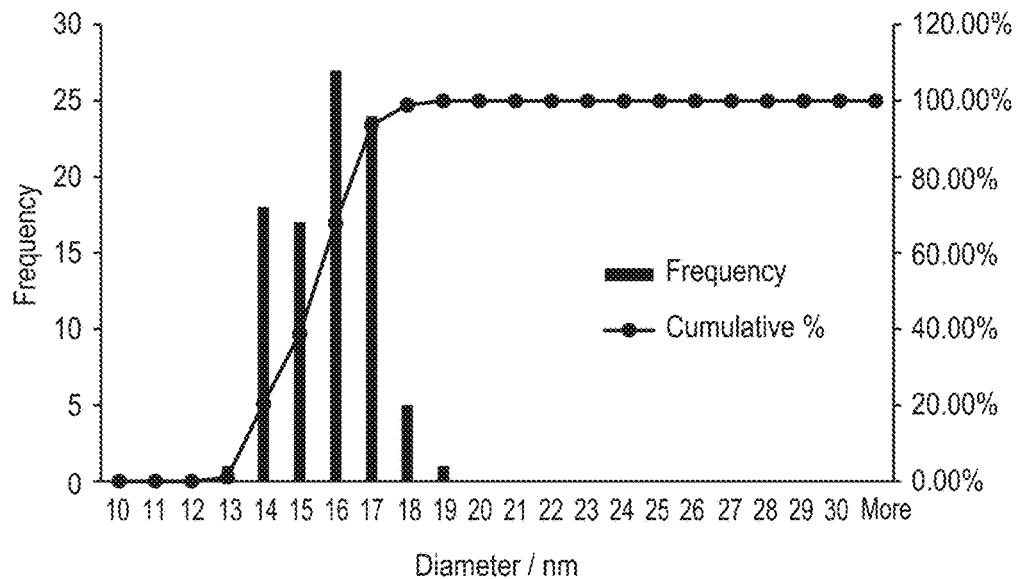
FIG. 35 is a histogram plotting nanowire diameters for the silver nanowires produced using the reaction conditions used to form the nanowires in FIG. 34.
Figure 36:
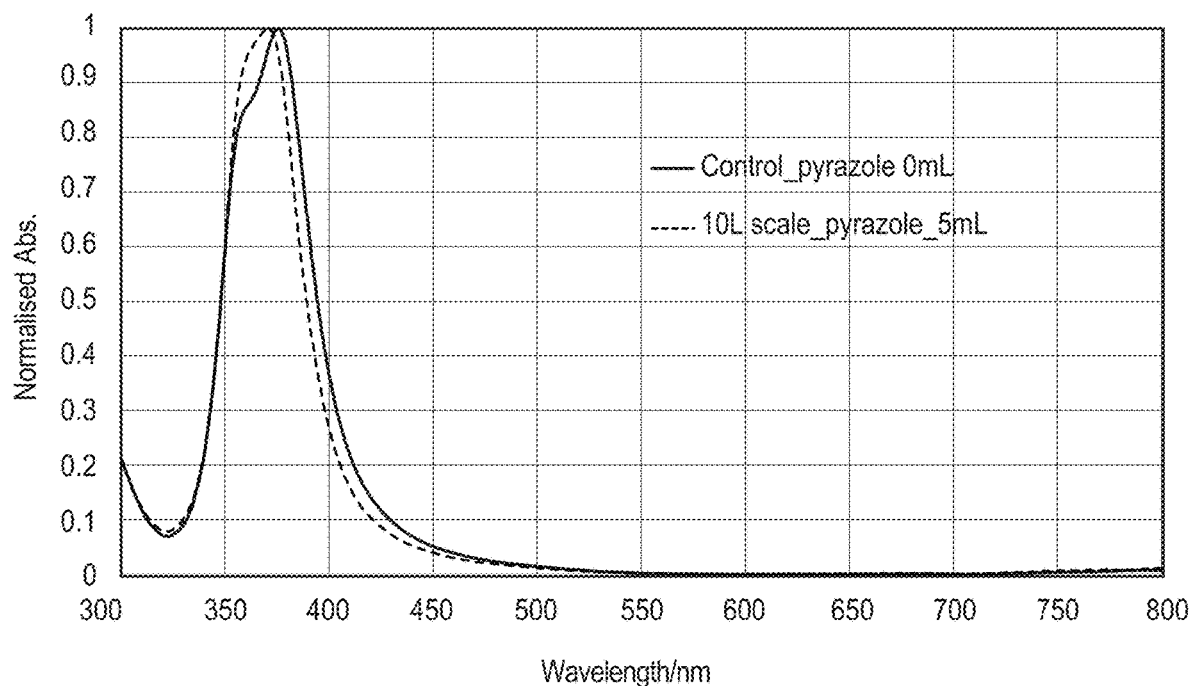
FIG. 36 is a UV-visible absorption spectrum for the nanowires shown in FIG. 34 along with a control spectrum for the silver nanowires without the addition of the pyrazole additive.

A further silver nanowire sample was formed at a scale for a 10 liter reactor using pyrazole additive at the concentration of the samples above along with 1-octyl-3-methyl imidazolium chloride and potassium bromide salts. A representative TEM micrograph of the silver nanowires synthesized using the second pyrazole concentration is shown in FIG. 34. The wire diameters were measured and averaged for 94 wires. A histogram of the silver nanowire diameters is shown in FIG. 35. The mean diameter was 15.29 nm, with a standard deviation of 1.21 nm, 99% of the nanowires having a diameter of 18 nm or less and 39% of the nanowires having a diameter of 15 nm or less. The smallest measured diameter was 12.9 nm. A dispersion of the silver nanowires was formed in DMSO, and the absorption spectrum was taken. A representative absorption spectrum is shown in FIG. 36 along with the spectrum for the control with no pyrazole. The absorption maximum was at 371 nm compared with a control absorption maximum of 376.1 nm and the normalized absorption at 410 nm was 0.158 compared with a control 410 nm normalized absorption of 0.216. Absorption spectra were also taken for dispersions in isopropyl alcohol, and for all three samples, the absorption maximum was at 358.5 nm for the first sample and at 359 nm for the other two samples. The nanowires synthesized at the ten liter scale generally had roughly equivalent properties to the silver nanowires produced in smaller batches within presently observed batch to batch variation.

Example 5—Addition of Water During Synthesis

The Example demonstrates that the addition of a small amount of water during the synthesis of the nanowires can result in the reduction of the nanowire diameter while maintaining uniform nanowires.

Figure 37:
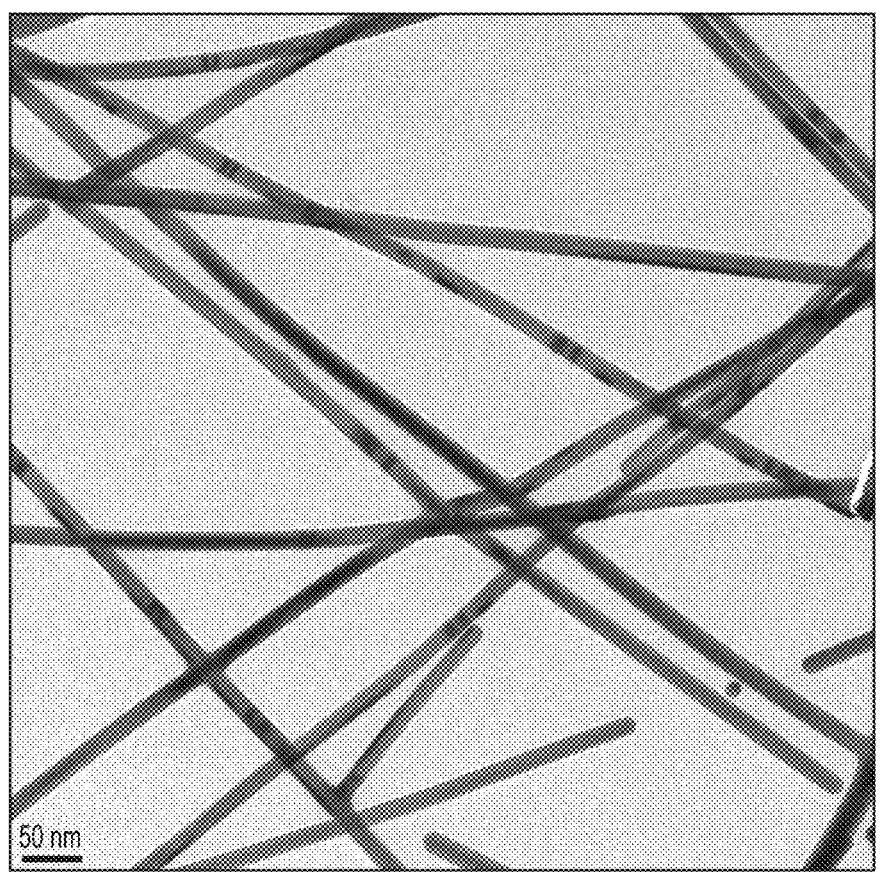
FIG. 37 is a transmission electron micrograph (TEM) of silver nanowires formed using a set of reactants comparable to the reactants used to form the silver nanowires of FIG. 1 with the addition of a small amount of water to the reactor.
Figure 38:
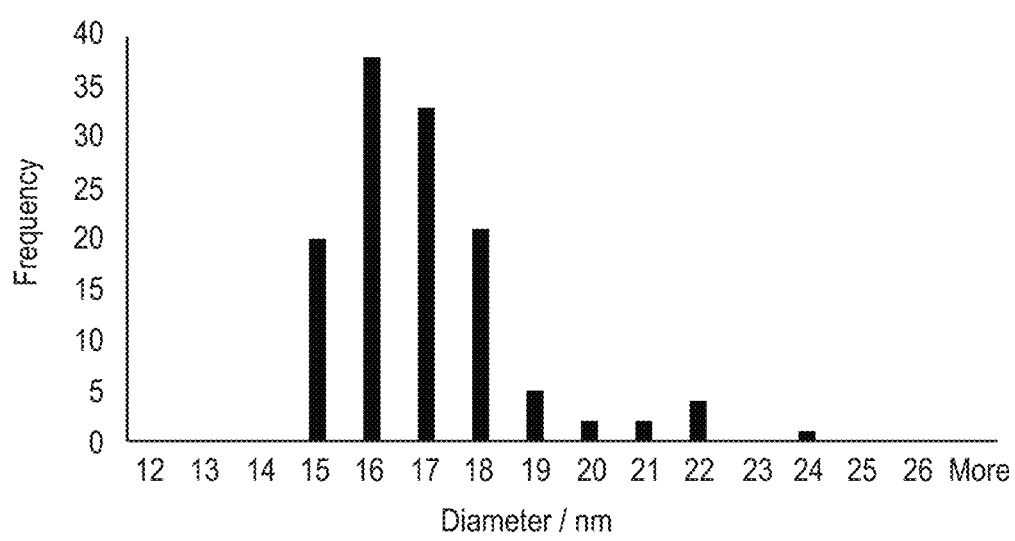
FIG. 38 is a histogram plotting nanowire diameters for the silver nanowires produced using the reaction conditions used to form the nanowires in FIG. 37.
Figure 39:
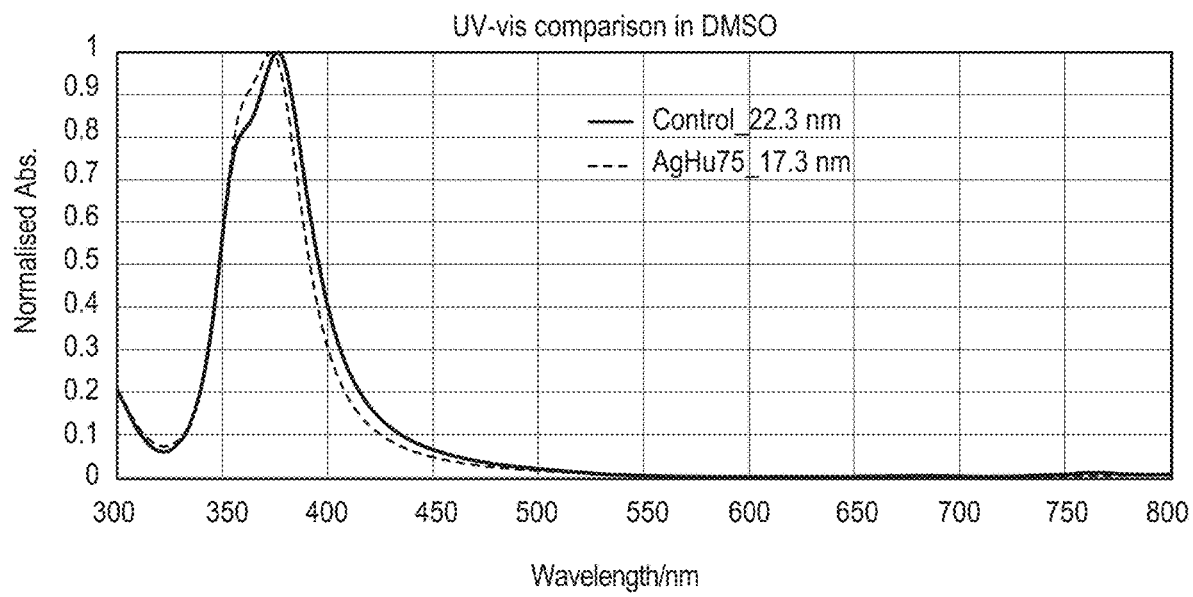
FIG. 39 is a UV-visible absorption spectrum for the nanowires shown in FIG. 37 along with a control spectrum for the silver nanowires without the addition of the imidazole additive.

A sample of silver nanowires was synthesized as described in Example 1 with OMMCl and KBr catalysts, but with the addition of 0.3 weight percent water that was added to the solvent prior to the addition of silver nitrate. A representative TEM micrograph of the silver nanowires synthesized using the small amount of water in the reaction is shown in FIG. 37. The wire diameters were measured and averaged for 127 nanowires. A histogram of the silver nanowire diameters is shown in FIG. 38. The mean diameter was 16.5 nm, with a standard deviation of 1.69 nm and 72% of the nanowires having a diameter of 17 nm or less. The smallest measured diameter was 14.3 nm. A dispersion of the silver nanowires was formed in DMSO, and the absorption spectrum was taken. A representative absorption spectrum is shown in FIG. 39 along with the spectrum for a representative control without water addition. The absorption maximum was at 373 nm compared with a control absorption maximum of 376.6 nm and the normalized absorption at 410 nm was 0.182 compared with a control 410 nm normalized absorption of 0.246. The inclusion of the water reduced the average diameter by 0.8 nm and resulted in a greater uniformity of the nanowires.

Example 6—Transparent Conductive Films

This example establishes the improved properties of transparent conductive films formed from the thinner and uniform silver nanowires synthesized as described herein.

The optical properties of the transparent conductive films were examined for selected sets of the thinner and uniform silver nanowires synthesized as described in the previous examples. Measurements are performed on two structures along with control measurements of L* using a reference structure with no transparent conductive film. For both of the conductive structures, the transparent conductive film is formed using a silver nanowire ink essentially as described in Example 5 of the '968 patent, cited above. The film is deposited using slot coating by hand onto the substrate. The structures with the silver nanowire inks were dried in an oven at 100° C. for up to 10 minutes to dry the inks. The drying process induces chemical fusing as the solvent is removed concentrating the constituents, in which further reaction is ended by the continued drying. The amount of silver deposited is selected to target a film with roughly either 50 ohms/sq or 70 ohms/sq sheet resistance, as noted in the specific samples below. After drying the conductive film, a commercial overcoat is slot coated by hand over the dried transparent conductive film. The overcoat is dried and crosslinked with a UV lamp to form an overcoat with a thickness of about 85 nm.

Figure 40:
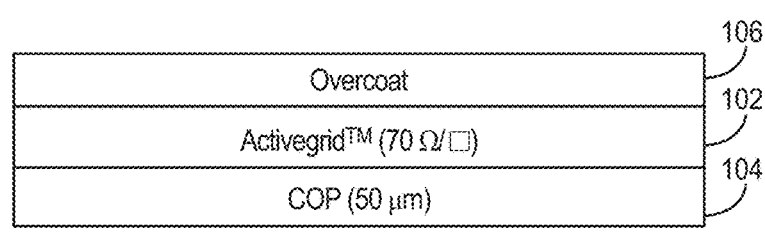
FIG. 40 is a schematic sectional view of a structure with conductive layer comprising a fused metal nanostructured network on a substrate with an overcoat over the conductive layer.
Figure 41:
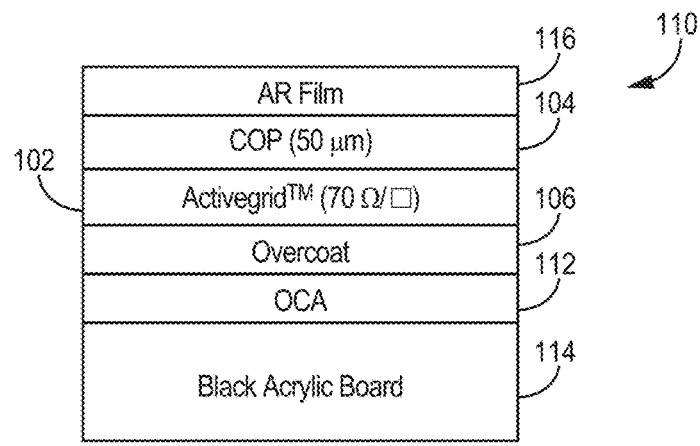
FIG. 41 is a schematic sectional view of structure with a black surface having an optically clear adhesive layer adhering a structure of FIG. 40 onto the black surface with an antireflective layer added over the opposite surface of a cyclic olefin substrate.
Figure 42:
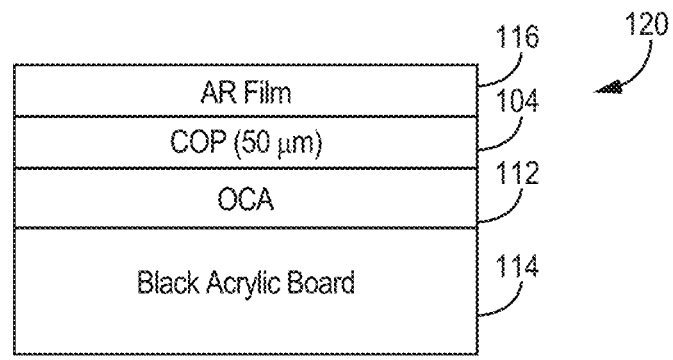
FIG. 42 is a control structure corresponding to the structure of FIG. 41 without the conductive layer or the overcoat layer.

With respect to the structures for testing the film properties, these structures are shown schematically in FIGS. 40-42. Referring to FIG. 40, a transparent structure 100 is shown with a transparent conductive layer 102 (having a fused metal nanostructured network) on a substrate 104 (50 micron thick cyclic olefin polymer (COP)) with a roughly 85 nm overcoat layer 106 formed with the commercial acrylate based coating composition over transparent conductive layer 102. Referring to FIG. 41, a second structure 110 is shown that is suitable for reflective measurements. A black acrylic board is used to provide a black background for the measurements. In some sense, the black substrate is used to mimic a black cell phone screen. In FIG. 41, an optically clear adhesive layer 112 with two adhesive surfaces is placed over overcoat layer 106. The other surface of optically clear adhesive layer 112 is placed on black acrylic board 114. An antireflective layer 116 is placed on the other surface of substrate 104. A reference structure 120 is shown in FIG. 42. Referring to FIG. 42, black acrylic board 114 optically clear adhesive layer 112, substrate 104 and antireflective layer 116 are stacked without the transparent conductive layer 102 or the overcoat layer 106.

This structure of FIG. 40 is used to measure sheet resistance, transmittance, b* and haze. The product of the sheet resistance and haze is a useful reference point to adjust for variation in amounts of deposited nanowires, so this product is also tabulated below. The second structure is shown in FIG. 41, and a reference structure without the transparent conductive film is shown in FIG. 42. The structures in FIGS. 41 and 42 are used to measure reflective L* in SCE mode. The CIELAB measurements in SCE reflective mode for reference structure 120 of FIG. 42 were L*=1.62, a*=0.19, and b*=−0.07.

The haze values of the film samples were measured using a BYK Haze-Gard plus 4725 Haze Meter. To adjust the haze measurements for the samples below, a value of substrate haze can be subtracted for a control sample (FIG. 42) from the measurements with the transparent conductive layer (FIG. 41) to get approximate haze measurements for the transparent conductive films and overcoat separately. Values of TT % and haze were measured with the BYK Haze-Gard plus 4725 Haze Meter based on ASTM D 1003 standard ("Standard Test Method for Haze and Luminous Transmittance of Transparent Plastics"), incorporated herein by reference. The total transmission and haze values presented for the films include the 50 micron thick COP substrate which has total transmission 92.6%, haze 0.08%, and b* 0.09. CIELAB values of b* and a* were determined using commercial software from measurements made with a Konica Minolta Spectrophotometer CM-3700A with Spectra-Magic™ NX software.

Sheet resistance was measured with a 4-point probe method, a contactless resistance meter or by measuring the resistance of the film by using a square defined by two solid (non-transparent) lines of silver formed from silver paste. In some embodiments, to make sheet resistance measurements, a pair of parallel stripes of silver paste was sometime used by painting the paste onto the surface of the samples to define a square, or a rectangular shape, which were then annealed at roughly 120° C. for 20 minutes in order to cure and dry the silver paste. Alligator clips were connected to the silver paste stripes, and the leads were connected to a commercial resistance measurement device.

The conduction and optical measurements were performed for control nanowires and for nanowires with the reduced diameters and uniformity. Measurements were performed with two deposition amounts, one to target a sheet resistance of about 50 ohms/sq and the second to target about 70 ohms/sq, as well as measurements with and without the overcoat. The results are presented in Tables 1 (w/o overcoat) and 2 (with overcoat). The product of the sheet resistance and haze is significantly reduced for the thinner, uniform nanowires.

TABLE 1

| AgNW (Average Diameter) | Before OC | | | |
|---|---|---|---|---|
| | Ω/□ | TT % | H % | b* |
| Batch 1~15 nm | 45 | 91.3 | 0.49 | 0.90 |
| Batch 1~15 nm | 64 | 91.6 | 0.36 | 0.66 |
| Standard~18 nm | 48 | 91.4 | 0.54 | 0.76 |
| Standard~18 nm | 74 | 91.7 | 0.36 | 0.55 |

TABLE 2

| AgNW (Average Diameter) | After OC | | | |
|---|---|---|---|---|
| | Ω/□ | TT % | H % | b* |
| Batch 1~15 nm | 46 | 91.5 | 0.36 | 0.83 |
| Batch 1~15 nm | 67 | 91.8 | 0.27 | 0.67 |
| Standard~18 nm | 50 | 91.5 | 0.40 | 0.76 |
| Standard~18 nm | 75 | 91.8 | 0.35 | 0.60 |

The conduction and optical properties using the three different thin, uniform nanowire batches with similar nanowire properties were also determined. The results are shown in Table 3 (without overcoat) and Table 4 (with overcoat). In these results, as in the results presented in Tables 1 and 2, the overcoat resulted in a significant decrease in H % and b* while resulting in little or no change in transmittance (TT %).

TABLE 3

| AgNW Batch | Average Diameter, nm (TEM) | Before OC | | | |
|---|---|---|---|---|---|
| | | Ω/□ | TT % | H % | b* |
| Batch 2 | ~14-15 | 46 | 91.4 | 0.51 | 1.09 |
| Batch 3 | ~14-15 | 39 | 91.3 | 0.56 | 1.09 |
| Batch 4 | ~14-15 | 45 | 91.3 | 0.50 | 0.99 |

TABLE 4

| AgNW Batch | Average Diameter, nm (TEM) | After OC | | | |
|---|---|---|---|---|---|
| | | Ω/□ | TT % | H % | b* |
| Batch 2 | ~14-15 | 45 | 91.3 | 0.37 | 0.82 |
| Batch 3 | ~14-15 | 38 | 91.3 | 0.37 | 0.92 |
| Batch 4 | ~14-15 | 45 | 91.5 | 0.33 | 0.84 |

L* was measured in reflection configuration for the samples used to generate Tables 1 and 2. L* was measured for the control structure in FIG. 42 and was found to be 1.62. For the samples with the transparent conductive film, the value of ΔL* is reported, which is L*sample-L*control, since this value relates to the properties of the transparent conductive film. The values are presented in Table 5. The thinner nanowires exhibited a significantly smaller value of ΔL*.

TABLE 5

| Stack Sample | Ω/□ | ΔL* |
|---|---|---|
| Batch 1~15 nm | 46 | 2.12 |
| Batch 1~15 nm | 67 | 1.49 |
| Standard~18 nm | 50 | 2.25 |
| Standard~18 nm | 75 | 1.67 |

Seven batches of thinner, uniform silver nanowires were evaluated to examine how the diameter distributions influenced the optical properties. The coatings were targeted to have a sheet resistance of about 70 ohms/sq, although the specific values measured are tabulated. The nanowire properties are presented in Table 6 and the optical properties for the nanowires are presented in Table 7.

TABLE 6

| NW Batch | Avg. Diameter (nm) | Std. Dev. (nm) | Max (nm) | % < 18 nm | % < 15 nm | % < 13 nm |
|---|---|---|---|---|---|---|
| 1 | 15.5 | 2.85 | 31.0 | 86.9 | 48.0 | 12.7 |
| 2 | 15.4 | 2.36 | 29.0 | 92.9 | 50.4 | 4.4 |
| 3 | 15.2 | 2.39 | 23.0 | 88.7 | 64.4 | 9.6 |
| 4 | 14.9 | 1.65 | 20.6 | 94.2 | 62.1 | 3.9 |
| 5 | 14.5 | 1.56 | 19.5 | 98.3 | 64.1 | 20.5 |
| 6 | 15.3 | 1.73 | 21.5 | 95.4 | 54.6 | 7.4 |
| 7 | 15.3 | 1.21 | 18.2 | 98.9 | 38.7 | 1.1 |

TABLE 7

| NW Batch | Ω/□ | % H | b* | ΔL* |
|---|---|---|---|---|
| 1 | 66 | 0.23 | 0.62 | 1.43 |
| 2 | 68 | 0.28 | 0.58 | 1.39 |
| 3 | 69 | 0.29 | 0.62 | 1.48 |
| 4 | 70 | 0.27 | 0.60 | 1.35 |
| 5 | 76 | 0.20 | 0.56 | 1.25 |
| 6 | 70 | 0.25 | 0.54 | 1.40 |
| 7 | 66 | 0.23 | 0.63 | 1.28 |

Based on the results in Tables 5 and 6, lower values of $L^*$ can be associated with having fewer nanowires with diameters greater than 18 nm. Thus, both the thinner average diameters in conjunction with a small standard deviation can be particularly significant for achieving a small value of $L^*$.

Figure 43:
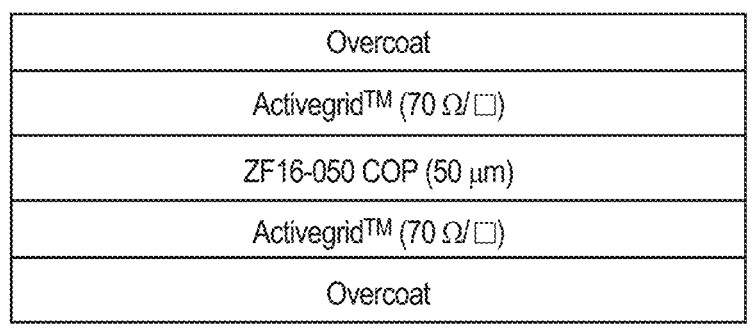
FIG. 43 is a schematic sectional view of a substrate with transparent conductive films applied to opposing surfaces of the substrate with a polymer overcoat applied to the transparent conductive film.

A structure was formed with fused metal nanostructured networks on the opposing surfaces of a COP polymer substrate. The structure is shown in FIG. 43. The transparent conductive films and polymer overcoats were formed sequentially, and each transparent conductive film was formed essentially as described above for the earlier results in this example. The resulting structure with two transparent conductive films each film had a sheet resistance of approximately 70 ohms/sq. The haze (H %) for the final structure was 0.56.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A method for synthesizing silver nanowires, the method comprising:
   forming a reaction solution substantially free of paramagnetic ions comprising a blend of polyol solvent, a polyvinyl pyrrolidone capping agent, chloride anion, bromide anion, and a five-membered aromatic heterocyclic salt comprising an imidazolium, pyrazolium or thiazolium cation;
   heating the reaction solution to a peak temperature; and
   adding a soluble silver salt.

2. The method of claim 1, the imidazolium salt represented by the formula:

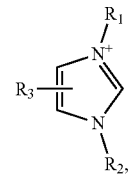

wherein:
   $R_1$ and $R_2$ are independently hydrogen, a linear, branched, or cyclic alkyl group, an unsaturated group, an arylalkyl group, with the proviso that $R_1$ and $R_2$ are not both hydrogen, and
   $R_3$ is a halogen or any substituent described for $R_1$ and $R_2$.

3. The method of claim 1, the pyrazolium salt represented by the formula:

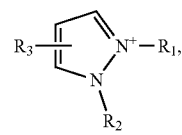

wherein:
   $R_1$ and $R_2$ are independently hydrogen, a linear, branched, or cyclic alkyl group, an unsaturated group, an arylalkyl group, with the proviso that $R_1$ and $R_2$ are not both hydrogen, and
   $R_3$ is a halogen or any substituent described for $R_1$ and $R_2$.

4. The method of claim 1, the thiazolium salt represented by the formula:

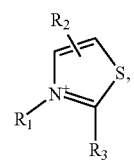

wherein:
   $R_1$ and $R_2$ are independently hydrogen, a linear, branched, or cyclic alkyl group, an unsaturated group, an arylalkyl group, with the proviso that $R_1$ and $R_2$ are not both hydrogen, and
   $R_3$ is a halogen or any substituent described for $R_1$ and $R_2$.

5. The method of claim 1 wherein moles of the bromide ion are from about 0.6 to about 15 times moles of the chloride ion.

6. The method of claim 1 wherein the reaction solution is formed in a reactor, and a concentration based on added amounts into the reactor for the heterocyclic cation is from about 0.00001M to about 0.01M.

7. The method of claim 1 wherein the reaction solution is formed in a reactor, and concentrations based on added amounts into the reactor are polyvinyl pyrrolidone capping agent 0.1 wt % to 10 wt %, bromide anion 0.00002M to 0.005M, chloride anion 0.00002M to 0.005M, five-membered aromatic heterocyclic salt 0.00002M to 0.005M, and soluble silver salt 0.0025M to 0.25M.

8. The method of claim 1 wherein the polyvinyl pyrrolidone capping agent comprises a blend of PVP K30 and PVP K90.

9. The method of claim 1 wherein the peak temperature is at least about 145° C.

10. The method of claim 1 wherein the soluble silver salt is added at a temperature within 5° C. of the peak temperature.

11. The method of claim 1, further comprising purifying silver nanowires from a completed reaction mixture, wherein the silver nanowires have an average diameter of no more than about 18 nm and a standard deviation of the diameter of no more than about 2.5 nm.

* * * * *